United States Patent
Alradady et al.

(10) Patent No.: US 7,911,209 B2
(45) Date of Patent: Mar. 22, 2011

(54) HEAD COIL AND NEUROVASCULAR ARRAY FOR PARALLEL IMAGING CAPABLE MAGNETIC RESONANCE SYSTEMS

(75) Inventors: Fahad Alradady, Glenshaw, PA (US); William J. Monski, Sewickly, PA (US); George J. Misic, Allison Park, PA (US); Robert J. McKenney, Jr., Indianola, PA (US); Timothy S. Zibrat, Pittsburgh, PA (US); Jaroslaw Wlodarczyk, Lower Burrell, PA (US)

(73) Assignee: Medrad, Inc., Indianola, PA (US)

( * ) Notice: Subject to any disclaimer, the term of this patent is extended or adjusted under 35 U.S.C. 154(b) by 1214 days.

(21) Appl. No.: 10/597,249

(22) PCT Filed: Feb. 22, 2005

(86) PCT No.: PCT/US2005/005744
§ 371 (c)(1),
(2), (4) Date: Jul. 18, 2006

(87) PCT Pub. No.: WO2005/081973
PCT Pub. Date: Sep. 9, 2005

(65) Prior Publication Data
US 2008/0275332 A1 Nov. 6, 2008

(51) Int. Cl.
*G01V 3/00* (2006.01)
*A61B 5/05* (2006.01)

(52) U.S. Cl. ........ 324/318; 324/322; 324/309; 600/410; 600/411; 600/421; 600/422

(58) Field of Classification Search .......... 600/410–423; 324/300–322; 382/128–131
See application file for complete search history.

(56) References Cited

U.S. PATENT DOCUMENTS

| 5,602,479 A | 2/1997 | Srinivasan |
| 5,664,568 A | 9/1997 | Srinivasan |

(Continued)

FOREIGN PATENT DOCUMENTS

EP 0856742 1/1998

(Continued)

OTHER PUBLICATIONS

Chin-Shoou Lin et al., "A Novel Multi-Segment Surface Coil for Neuro-Functional Magnetic Resonance Imaging", MRM 39:164-168 (1998), Williams & Wilkins, United States.

(Continued)

*Primary Examiner* — Melissa J Koval
*Assistant Examiner* — Tiffany A Fetzner
(74) *Attorney, Agent, or Firm* — James R. Stevenson

(57) ABSTRACT

A head coil for use with a parallel-imaging compatible MR system is disclosed, as is a method of making, and a neurovascular array (NVA) equipped with, same. The head coil includes conductive rings and rods configured to produce a plurality of electrically-adjacent primary resonant substructures about a birdcage-like structure, with each such primary resonant substructure including two rods neighboring each other and the short segment of each of the first and second rings interconnecting them. The primary resonant substructures are isolated from each other via a preamplifier decoupling scheme and an offset tuning scheme thereby enabling each primary resonant substructure (i) to receive an MR signal from tissue within its field of view and (ii) to be operatively couplable to one processing channel of the MR system for conveyance of the MR signal received thereby (iii) while being simultaneously decoupled from the other primary resonant substructures.

71 Claims, 35 Drawing Sheets

U.S. PATENT DOCUMENTS

| | | | |
|---|---|---|---|
| 5,910,728 | A | 6/1999 | Sodickson |
| 6,043,658 | A | 3/2000 | Leussler |
| 6,323,648 | B1 | 11/2001 | Belt |
| 6,344,745 | B1 | 2/2002 | Reisker |
| 6,356,081 | B1 | 3/2002 | Misic |
| 6,396,273 | B2 | 5/2002 | Misic |
| 6,549,799 | B2 | 4/2003 | Bock |
| 6,714,013 | B2 | 3/2004 | Misic |
| 6,791,321 | B2 * | 9/2004 | Willig-Onwuachi et al. 324/309 |
| 6,798,206 | B2 | 9/2004 | Misic |
| 6,822,450 | B2 | 11/2004 | Klinge |
| 6,825,660 | B2 | 11/2004 | Boskamp |
| 6,831,460 | B2 | 12/2004 | Reisker |
| 6,833,705 | B2 | 12/2004 | Misic |
| 6,850,064 | B1 | 2/2005 | Srinivasan |
| 6,900,636 | B2 | 5/2005 | Leussler |
| 6,995,561 | B2 | 2/2006 | Boskamp |
| 7,084,629 | B2 * | 8/2006 | Monski et al. 324/318 |
| 7,180,291 | B2 * | 2/2007 | Chmielewski et al. 324/318 |
| 7,683,623 | B2 * | 3/2010 | Zhai et al. 324/318 |
| 2002/0156362 | A1 | 10/2002 | Bock |
| 2003/0231018 | A1 * | 12/2003 | Willig-Onwuachi et al. 324/318 |
| 2004/0090232 | A1 | 5/2004 | Belt |
| 2005/0099179 | A1 * | 5/2005 | Monski et al. 324/318 |
| 2008/0174314 | A1 * | 7/2008 | Holwell et al. 324/318 |
| 2008/0197848 | A1 * | 8/2008 | Zhai et al. 324/318 |
| 2008/0275332 | A1 * | 11/2008 | Alradady et al. 600/422 |

FOREIGN PATENT DOCUMENTS

| | | |
|---|---|---|
| WO | WO2004048987 | 6/2004 |
| WO | WO2004048989 | 6/2004 |

OTHER PUBLICATIONS

Kristen L. Meyer and Douglas Ballon, "A 3×3 Mesh Two-Dimensional Ladder Network Resonator for MRI of the Human Head", Journal of Magnetic Resonance Series B 107, 19-24 (1995), Academic Press, Inc., United States.

P.B. Roemer, et al., "The NMR Phased Array", Magnetic Resonance in Medicine 16, 192-225 (1990), Academic Press, Inc., United States.

James Tropp, "The Hybrid Bird Cage Resonator", Proceedings of the 11.sup.th Annual Meeting of the Society of Magnetic Resonance in Medicine, (1992), United States.

International Search Report, May 25, 2006, for corresponding PCT/US05/05744 filed Feb. 22, 2005.

* cited by examiner

"A" OR "B" LAYOUT (MODES 1 & 3)

"C" OR "D" LAYOUT (MODES 5 & 7)

3011140 "*"
"E"="END RING PCB" (COMPONENT DESIG. ONLY)
"*" = "A" "B" "C" OR "D"

3009905 "D*"
"D*"="DECOUPLING"
"*"=ROD LOCATION (A THRU H)

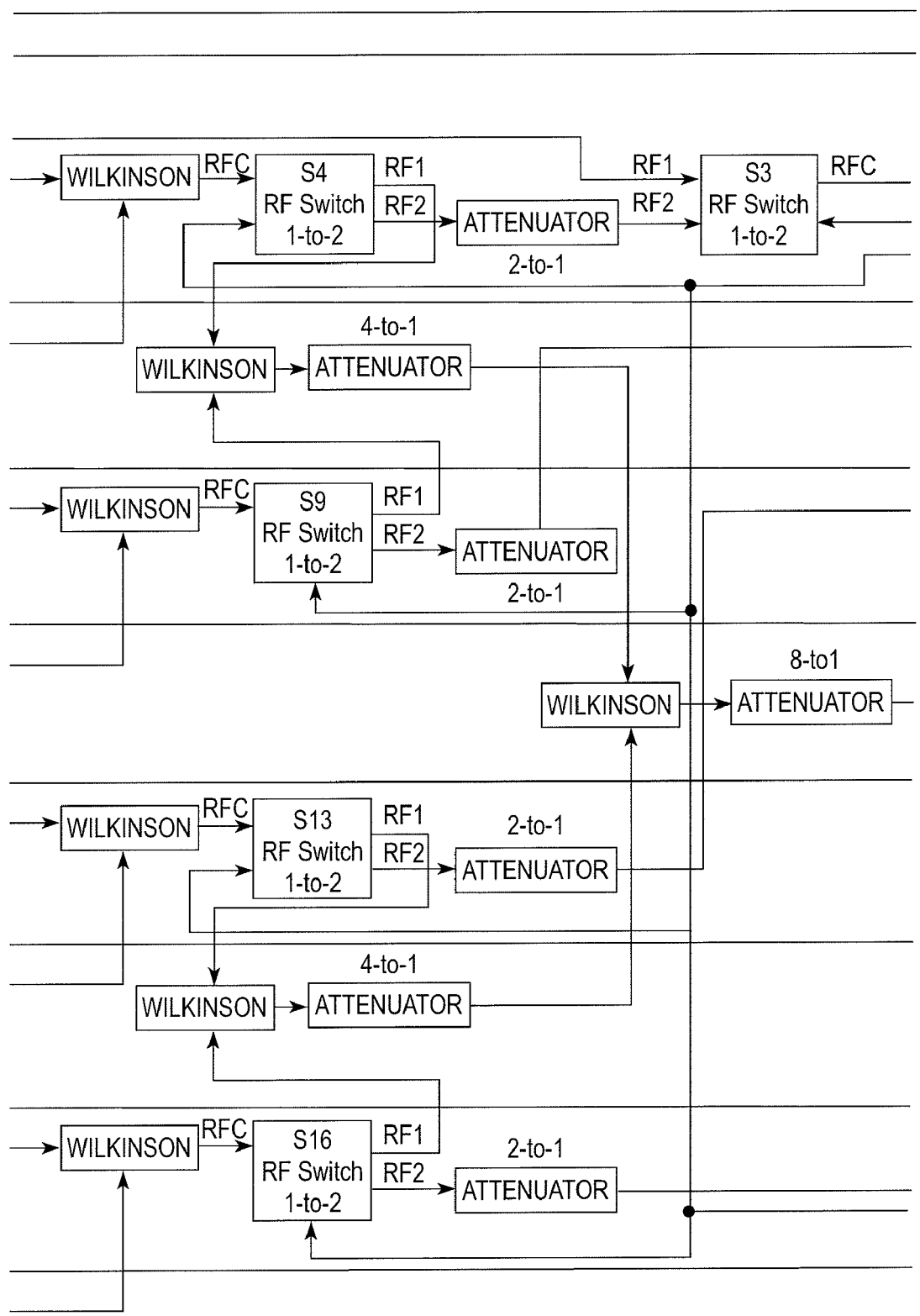
FIG. 7B-C

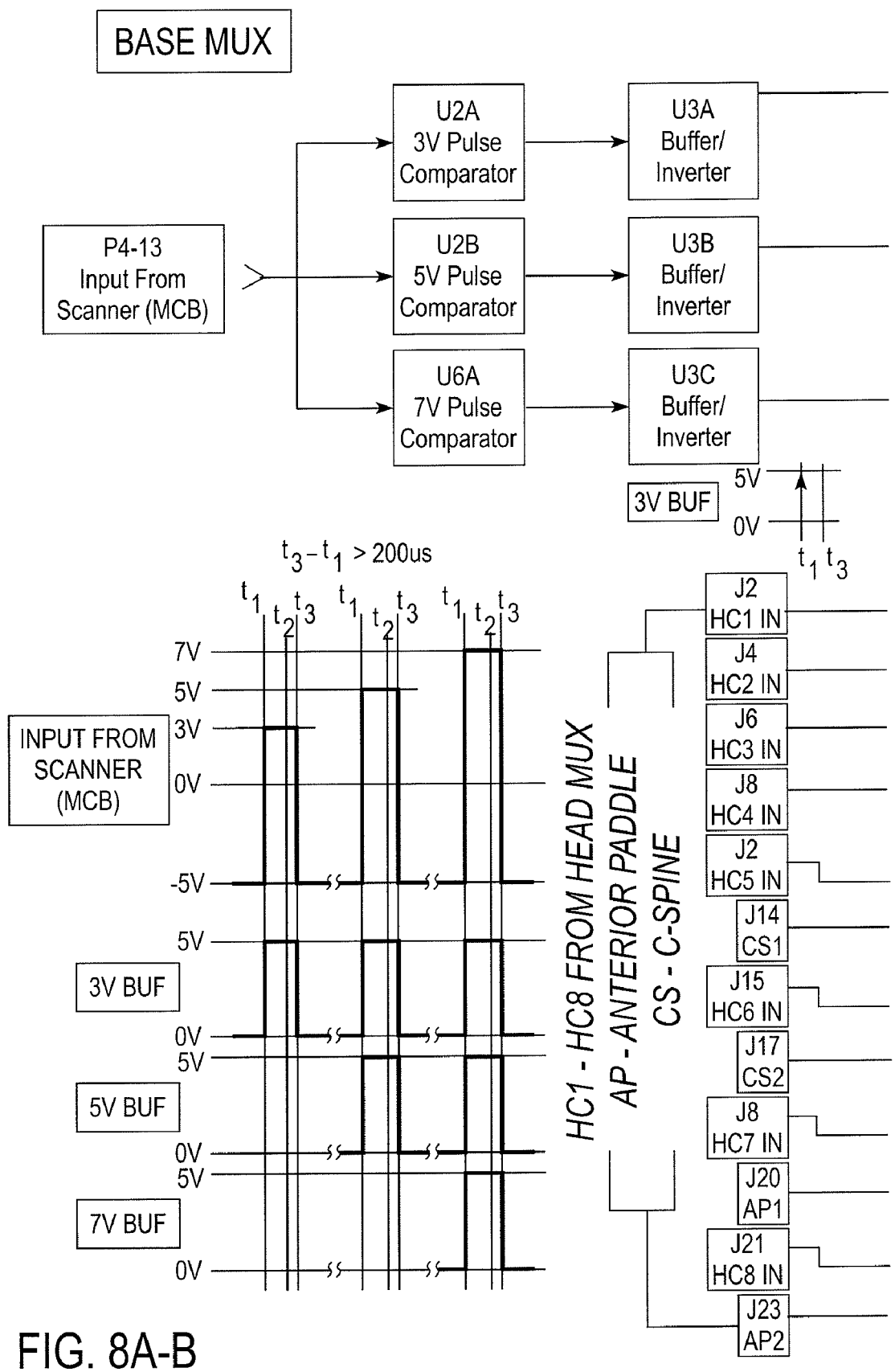
FIG. 8A-B

HEAD COIL AND NEUROVASCULAR ARRAY FOR PARALLEL IMAGING CAPABLE MAGNETIC RESONANCE SYSTEMS

CROSS-REFERENCE TO RELATED APPLICATION

This application claims the benefit of U.S. Provisional Application No. 60/546,995, filed 22 Feb. 2004; U.S. application Ser. No. 10/723,428, filed 27 Nov. 2003; and U.S. Provisional Application No. 60/429,855, filed 27 Nov. 2002, all of which incorporated herein by reference.

FIELD OF THE INVENTION

The invention relates generally to the field of magnetic resonance (MR) imaging and spectroscopy systems and to the various types of local coils used with such systems. More particularly, the invention pertains to local coils, such as those used to image the human head, which are designed to be used with multi-channel MR systems capable of acquiring images using parallel imaging techniques.

BRIEF DESCRIPTION OF RELATED ART

The following information is provided to assist the reader to understand the environment in which the invention disclosed herein will typically be used. It is also provided to inform the reader of at least some of the many different volume coils to which the invention can be applied. In addition, any references set forth herein are intended merely to assist in such understanding. Inclusion of a reference herein, however, is not intended to constitute an admission that it is available as prior art against the invention.

Magnetic resonance imaging (MRI) is a noninvasive method of producing high quality images of the interior of the human body. It allows medical personnel to see inside the body (e.g., organs, muscles, nerves, bones, and other structures) without surgery or the use of potentially harmful ionizing radiation such as X-rays. The images are of such high resolution that disease and other pathological conditions can often be visually distinguished from healthy tissue. Magnetic resonance (MR) systems and techniques have also been developed for performing spectroscopic analyses by which the chemical content of tissue or other material can be ascertained.

MR imaging and spectroscopic procedures are performed in what is known as an MR suite. As shown in FIG. 1A, an MR suite typically has three rooms: a scanner room 1, a control room 2, and an equipment room 3. The scanner room 1 houses the MR scanner 10 into which a patient is moved via a slideable table 11 to undergo a scanning procedure, and the control room 2 contains a computer console 20 from which the operator controls the overall operation of the MR system. In addition to a door 4, a window 5 is typically set in the wall separating the scanner and control rooms to allow the operator to observe the patient during such procedures. The equipment room 3 contains the various subsystems necessary to operate the MR system. The equipment includes a power gradient controller 31, a radio frequency (RF) assembly 32, a spectrometer 33, and a cooling subsystem 34 with which to avoid the build up of heat which, if left unaddressed, could otherwise interfere with the overall performance of the MR system. These subsystems are typically housed in separate cabinets, and are supplied electricity through a power distribution panel 12 as are the scanner 10 and the slideable patient table 11.

An MR system obtains such detailed images and spectroscopic results by taking advantage of the intrinsic properties of the hydrogen atom, which is found in abundance in all cells within the body. The nuclei in hydrogen atoms naturally spin like a top, or precess, randomly in every direction. Furthermore, because they act as tiny dipole magnets, the hydrogen nuclei or "spins" tend to line up in the direction of the magnetic field to which they are exposed. During an MR scan, the entire body or, optionally, any desired region thereof is exposed to such a magnetic field. This compels the nuclei/spins of the exposed region(s) to line up—and collectively form an average vector of magnetization—in the direction of the magnetic field.

As shown in FIGS. 1B and 1C, the scanner 10 is comprised of a main magnet 101, three gradient coils 103a-c, and, usually, an RF antenna 104 (often referred to as the whole body coil). Superconducting in nature, the main magnet 101 is typically cylindrical in shape. Within its cylindrical bore, the main magnet 101 generates a strong magnetic field, often referred to as the $B_0$ or main magnetic field, which is both uniform and static (non-varying). For a scanning procedure to be performed, the patient must be moved into this cylindrical bore, typically while supine on table 11, as best shown in FIGS. 1B and 1C. The main magnetic field is oriented along the longitudinal axis of the bore, referred to as the z direction, which compels the magnetization vectors of the hydrogen nuclei in the body to align themselves in that direction. In this alignment, the hydrogen nuclei/spins are prepared to receive RF energy of the appropriate frequency from RF coil 104. This frequency is known as the Larmor frequency and is governed by the equation $\omega = Y B_0$, where $\omega$ is the Larmor frequency (at which the hydrogen atoms precess), Y is the gyromagnetic constant, and $B_0$ is the strength of the main magnetic field.

The RF coil 104 is typically used both to transmit pulses of RF energy and to receive the resulting magnetic resonance (MR) signals induced thereby in the hydrogen nuclei. Specifically, during its transmit cycle, the coil 104 broadcasts RF energy into the cylindrical bore. This RF energy creates a radio frequency magnetic field, also known as the RF $B_1$ field, whose field lines point in a direction perpendicular to the magnetization vectors of the hydrogen nuclei. The RF pulse (or $B_1$ field) causes the spin-axes of the hydrogen nuclei to tilt with respect to the main ($B_0$) magnetic field, thus causing the net magnetization vectors to deviate from the z direction by a certain angle. The RF pulse, however, will affect only those hydrogen nuclei/spins that are precessing about their axes at the frequency of the RF pulse. In other words, only the nuclei that "resonate" at that frequency will be affected, and such resonance is achieved in conjunction with the operation of the three gradient coils 103a-c.

Each of the three gradient coils is used to vary the main ($B_0$) magnetic field linearly along one of the three directions (x, y, z) within the cylindrical bore. Positioned inside the main magnet as shown in FIG. 1C, the gradient coils 103a-c when turned on and off very rapidly in a specific manner are able to alter the $B_0$ field on a very local level and, in doing so, enable the MR system to acquire as quickly as possible the spatial information discussed below. Thus, in conjunction with the main magnet 101, the gradient coils 103a-c can be operated according to various imaging techniques so that the hydrogen nuclei/spins—at any given point or in any given strip, slice or unit of volume—will be able to achieve resonance when an RF pulse of the appropriate frequency is applied. In response to the RF pulse, the precessing hydrogen nuclei in the selected region absorb the RF energy being transmitted from RF coil 104, thus forcing the magnetization vectors thereof to tilt away from the direction of the main ($B_0$) magnetic field. When the RF coil 104 is turned off, the hydrogen nuclei/spins begin to release the RF energy they just absorbed in the form of magnetic resonance (MR) signals, as explained further below.

One well known technique that can be used to obtain images is referred to as the spin echo imaging technique. Operating according to this MR sequence, the MR system first activates one gradient coil 103a to set up a magnetic field gradient along the z-axis. This is called the "slice select gradient," and it is set up when the RF pulse is applied and shut off when the RF pulse is turned off. It allows resonance to occur only within those hydrogen nuclei located within a slice of the region being imaged. No resonance will occur in any tissue located on either side of the plane of interest. Immediately after the RF pulse ceases, all of the nuclei/spins in the activated slice are "in phase," i.e., their magnetization vectors all point in the same direction. Left to their own devices, the net magnetization vectors of all the hydrogen nuclei in the slice would relax and thus realign with the z direction. Instead, however, the second gradient coil 103b is briefly activated to create a magnetic field gradient along the y-axis. This is called the "phase encoding gradient." It causes the magnetization vectors of the nuclei within the slice to point, as one moves between the weakest and strongest ends of this gradient, in increasingly different directions. Next, after the RF pulse, the slice select gradient, and the phase encoding gradient have been turned off, the third gradient coil 103c is briefly activated to create a gradient along the x-axis. This is called the "frequency encoding gradient" or "read out gradient," as it is only applied when the MR signal is ultimately measured. It causes the relaxing magnetization vectors to be differentially re-excited, so that the nuclei/spins near the low end of that gradient begin to precess at a faster rate, and those at the high end pick up even more speed. When these nuclei then relax, the fastest ones (those which were at the high end of the gradient) will emit the highest frequency of radio waves and the slowest ones will emit the lowest frequencies. In this manner, the gradient coils 103a-c spatially encode the radio waves to be emitted by the hydrogen nuclei/spins, with each tiny part of the region being imaged being uniquely defined by the frequency and phase of its resonance signal.

The hydrogen nuclei/spins thus collectively emit their radio waves in a specific band of frequencies determined by the $B_0$ magnetic field of main magnet 101 and the specific spatial variations in the $B_0$ field made possible by gradient coils 103a-c. During its receive cycle, RF coil 104 detects these miniature radio emissions, which are often collectively referred to as the MR signal(s). These unique resonance signals are then conveyed to the receivers of the MR system, wherein they are stored as a line of information in a data matrix known as the k-space matrix. The full matrix is built up by successive cycles of conditioning the hydrogen nuclei, perturbing them, and collecting the resultant RF emissions. Using a technique known as Fourier transformation, the MR system then converts the frequency information present in these RF emissions to spatial information representing the distribution of a nuclei/spins in the tissue being scanned. Having determined the exact location of the nuclei/spins in space, the MR system can then display a two- or even a three-dimensional image of the body, or region thereof, that was scanned.

When more detailed images of a specific part of the body are needed, a local coil is often used in addition to, or instead of, the whole body coil 104. A local coil can take the form of a volume coil or a surface coil. A volume coil is used to surround or enclose a volume (e.g., a head, an arm, a wrist, a knee or other region) to be imaged. Some volume coils (e.g., for imaging the head and/or extremities) are often referred to as birdcage coils due to their shape. A surface coil, however, is merely fitted or otherwise placed against a surface (e.g., a shoulder, a breast, etc.) of the patient so that the underlying region can be imaged. A local coil can also be designed to operate either as a receive-only coil or a transmit/receive (T/R) coil. A receive-only coil is only capable of detecting the MR signals emitted by the body. A T/R coil, however, is capable of both receiving the MR signals as well as transmitting the RF pulses that produce the RF $B_1$ magnetic field, which is the prerequisite for inducing resonance in the tissues of the anatomical structure being imaged.

It is well known in the field of MR to use a single local coil, whether surface or volume, to detect MR signals. According to the single coil approach, a relatively large local coil is used to cover or enclose the entire field of view. Early receiving coils were just linear coils, meaning that they could detect only one of the two (i.e., vertical and horizontal) quadrature components of the MR signals produced by the anatomical structure being imaged. Subsequent receiving coils, however, employed quadrature mode detection, meaning that they could intercept both the vertical and horizontal components. Compared to linear receiving coils, quadrature coils enabled MR systems to provide images for which the signal-to-noise ratio was much improved, by as much as 41%. Even with the improvement brought with quadrature mode detection, the single coil approach still provided images whose quality invited improvement. The disadvantage of the single coil approach is attributable to just one coil structure being used to acquire the MR signals over the entire field of view.

With the advent of MR systems equipped with multiple receivers, phased array coils were developed to overcome the shortcomings with the single coil approach. Instead of one large local coil, the phased array approach uses a plurality of smaller local coils (also referred to as "coil elements"), with each such coil element covering or enclosing only a portion of the field of view and its output typically routed to one receiver or channel of the MR system. In a phased array coil system having two such coil elements, for example, each element would cover or enclose approximately half of the field of view, with the two coil elements being partially overlapped for purposes of magnetic isolation. The two coil elements would acquire the MR signals from their respective portions simultaneously, and they would not interact adversely due to the overlap. Because each coil element covers only half of the field of view, each such coil element is able to receive the MR signals at a higher signal-to-noise ratio for that portion of the field of view within its coverage area. The smaller coil elements of the phased array thus collectively provide the MR system with the signal data necessary to generate an image of the entire field of view that is higher in resolution than what can be obtained from a single large local coil.

One example of a phased array coil is a neurovascular array (NVA). An NVA is typically comprised of a series of local coils that are used to image the head, neck and cervical spine regions of the body. A particular NVA and the head coil part thereof are disclosed in U.S. Pat. No. 6,356,081 to Misic and U.S. Pat. Nos. 6,344,745 and 6,831,460 to Reisker et al., respectively, which are incorporated herein by reference. Such head coils typically have a pair of circular end rings which are bridged by a plurality of equispaced straight rods. The birdcage coil disclosed in the '745 patent has rings of different size, however, and the rods that extend therebetween are tapered accordingly. This improves the homogeneity of the magnetic flux density throughout the head coil, particularly in its XZ and YZ imaging planes.

As noted above, the spatial information acquired through magnetic resonance techniques is encoded through the application of rapidly-switched magnetic field gradients and RF pulses. The speed of an MR scanning procedure is therefore determined by how quickly this spatial encoding may be performed. Most of the fast imaging sequences now in use (EPI, FLASH, TSE, or BURST, for example) achieve their high speeds by optimizing the switching rates and patterns of the gradients and RP pulses. Nevertheless, the one feature common to these techniques is that they all acquire data—i.e., the MR signals—in a sequential fashion. Whether the required data set (i.e., the k-space data matrix) is filled in a rectangular raster pattern, a spiral pattern, a rapid series of line scans, or some other novel order, it is still acquired one point and one line at a time, with each separate point or line of data requiring a separate application of field gradients and/or RF pulses. The speed at which MR images can be obtained using these techniques is thus limited because they acquire data sequentially in time. Further shortcomings with sequential data acquisition techniques involve potential adverse effects on patient safety.

SMASH, which stands for "SiMultaneous Acquisition of Spatial Harmonics," is a partially parallel imaging technique, which exploits the geometry of an RF coil array to encode multiple lines of MR image data simultaneously, thereby multiplying the speed of existing sequential imaging sequences. In experiments using commercially available coil arrays, SMASH has been used to accelerate a number of fast imaging sequences, without increasing gradient switching rates or RF power deposition.

Nearly all existing sequential rapid imaging sequences may be accelerated in this manner, and, to date, SMASH has been successfully tested with a wide range of sequence types, including TSE, RARE, HASTE, TFE, FLASH, TrueFISP, EPI, and BURST. Both two-dimensional and three-dimensional acquisitions are amenable to acceleration using SMASH. Whereas the ultimate speeds of most sequential imaging techniques are limited by physical and physiologic constraints on gradient switching rate and RF power deposition, achievable SMASH imaging speeds are limited in principle only by the number and arrangement of RF array elements which may reasonably be constructed and interfaced with an MR scanner. The improvements in imaging efficiency afforded by SMASH may be put to use in a number of ways, including: (1) reduction in breath-hold times for clinical MR scans, to increase patient compliance and comfort; (2) reduction in the overall duration of longer scans, once again increasing comfort and compliance, and also increasing the throughput of clinical MR scanners and the cost-effectiveness of MR diagnosis; (3) improvements in temporal resolution (i.e., shorter image acquisition intervals), minimizing undesired effects of physiologic motion while allowing accurate tracking of time-dependent phenomena; (4) improvements in the spatial resolution which may be achieved in a given imaging time; and (5) improvements in image quality resulting from a reduction in time-dependent artifacts (due to motion, susceptibility, relaxation, etc.).

Sensitivity encoding (SENSE) is another parallel imaging technique. It can be used to reduce scan time in MRI considerably. The spatial information related to the coils of a receiver array are utilized for reducing conventional Fourier encoding. SENSE can, in principle, be applied to any imaging sequence and k-space trajectories.

ASSET (Array Spatial Sensitivity Encoding Technique) is yet another parallel imaging technique. Developed by General Electric Medical Systems (GEMS), ASSET uses the unique geometry of phased array coils to spatially encode the image faster. The ASSET technique can be used to scan faster, improve spatial resolution and/or increase coverage.

One MR system that is capable of acquiring images using parallel imaging techniques is the GEMS Signa® 8-channel 1.5 Tesla MR system. Due to the development of such MR systems, there is now a need to provide local coils and the associated interfaces to take advantage of the faster parallel imaging capabilities offered by such new systems.

The prior art head coils disclosed in the above-cited patents were not originally built for operation with MR systems capable of acquiring images of the head using parallel imaging techniques. The head coil disclosed in the '745 patent acquires its images by means of overlapping signal patterns, i.e., the two quadrature modes overlap and are acquired simultaneously. Because of that overlap, the head coil is not appropriate for acquiring images using parallel imaging techniques. It would therefore be quite advantageous to develop a head coil that is capable not only of providing the homogeneity of conventional birdcage-type structures such as those disclosed in the '745, '460 and other prior art patents but also of acquiring images using parallel imaging techniques. Several recent publications have disclosed volume coils that aspire to do so, though with limited degrees of success.

U.S. Pat. No. 6,043,658 to Leussler is directed to a receive-only "MR coil system" having a birdcage-like design capable of use in either one of two operating modes, with the choice of mode being dependent on the state of two switches. One of those modes makes the birdcage coil capable of use in parallel-imaging applications, and specifically with 8-channel MR systems. In this regard, the '658 patent discloses a head coil having eight "meshes," all of which purportedly decoupled from one another and each of which intended to convey the MR signals it detects from the tissue within its field of view to one of the eight channels of the MR system. More significantly, the '658 patent expressly requires that a high-impedance preamplifier be used to link each such mesh to its corresponding channel in the MR system. The '658 patent also explicitly requires the entire structure of the head coil to resonate at a "single resonance frequency." Those two requirements, among others, pose significant operational disadvantages, which the invention disclosed below has overcome.

U.S. Pat. No. 6,825,660 to Boskamup and WIPO Publication WO 2004/048987 to Chimelewski et al. disclose birdcage coils largely based on the receive-only design taught in the '658 patent but with the ability to transmit as well as receive. As extensions of the multi-mesh design proposed by Leussler, these T/R birdcage coils suffer from the same disadvantages that burden their receive-only predecessor.

SUMMARY OF THE INVENTION

Several objectives and advantages of the invention are attained by the preferred and alternative embodiments and related aspects of the invention summarized below.

In one preferred embodiment, the invention provides a volume coil for use with a parallel-imaging compatible MR system. The volume coil includes first and second electrically conductive rings and a plurality of rods electrically interconnecting them to form a birdcage-like structure. The rods and rings are configured to produce a plurality of electrically-adjacent primary resonant substructures about the birdcage-like structure, with each substructure including two rods neighboring each other and the short segment of each of the first and second rings interconnecting them. Each of the primary resonant substructures is enabled to receive an MR signal from tissue within its field of view. In that regard, each primary resonant substructure has a source impedance considerably higher than, and for creating a resonant circuit with, a load impedance to which it connects. This enables each primary resonant substructure (i) to be operatively couplable to one processing channel of the MR system for conveyance of the MR signal received thereby (ii) while simultaneously being at least partially decoupled from the other primary resonant substructures of the volume coil.

In alternative preferred embodiment, the invention provides a volume coil for use with a parallel-imaging compatible MR system. The volume coil includes first and second electrically conductive rings and a plurality of rods electrically interconnecting them to form a birdcage-like structure. The rods and rings are configured to produce a plurality of electrically-adjacent primary resonant substructures about the birdcage-like structure, with each substructure including two rods neighboring each other and the short segment of each of the first and second rings interconnecting them. The primary resonant substructures are isolated from each other via a preamplifier decoupling scheme and an offset tuning scheme thereby enabling each primary resonant substructure (i) to receive an MR signal from tissue within its field of view and (ii) to be operatively couplable to one processing channel of the MR system for conveyance of the MR signal received thereby (iii) while being simultaneously decoupled from the other primary resonant substructures.

In another aspect, the invention provides a method of making a volume coil for use with a parallel-imaging compatible MR system. One step of the method involves the assembly of the first and second rings with a plurality of rods electrically interconnecting them to form a birdcage-like structure. The rods and rings should be configured to produce a plurality of electrically-adjacent primary resonant substructures about the birdcage-like structure, with each substructure including two rods neighboring each other and the short segment of each of the first and second rings interconnecting them. A critical step involves isolating the primary resonant substructures from each other via the preamplifier decoupling and offset tuning schemes disclosed herein. In doing so, each primary resonant substructure will be enabled (i) to receive the MR signal from tissue within its field of view and (ii) to be operatively couplable to one processing channel of the MR system for conveyance of the MR signal received thereby (iii) while being simultaneously decoupled from the other primary resonant substructures.

In a broader aspect, the invention provides another method of making a volume coil for use with a parallel-imaging compatible MR system. This method also involves the steps of assembling and configuring the rods and rings to produce a plurality of electrically-adjacent primary resonant substructures about the birdcage-like structure, with each substructure including neighboring rods and the short segments of the first and second rings that interconnect them. In this method, the essential step involves providing each primary resonant substructure with a source impedance considerably higher than, and for creating a resonant circuit with, a load impedance to which the primary resonant substructure is to be connected. In doing so, each primary resonant substructure will be enabled to be operatively couplable to one channel of the MR system for conveyance of the MR signal received thereby while simultaneously being at least partially decoupled from the other primary resonant substructures.

In a related preferred embodiment, the invention provides a neurovascular array (NVA) for use with an MR system capable of parallel-imaging via a plurality of processing channels. The NVA is implemented with a head coil designed to function in accordance with either of the volume coils summarized above. Each primary resonant substructure of the head coil constitutes a coil element that includes two rods neighboring each other and the short segment of each of the first and second rings interconnecting them so that each primary resonant substructure is enabled to receive an MR signal from tissue within its field of view. The anterior coil has in proximity to the head coil at least one other coil element for receiving an MR signal from tissue within its field of view. The posterior coil has in proximity to the head coil at least one other coil element for receiving an MR signal from tissue within its field of view. The interface circuit enables the coil elements of the head, anterior and posterior coils to be selectively interconnected to the processing channels of the MR system so that the NVA can be selectively operated in a plurality of modes.

In another related aspect, the invention provides an interface for coupling a coil array to a parallel-imaging compatible MR system. The coil array is of the type that includes (i) a volume coil having a plurality of electrically-adjacent primary resonant substructures formed in a birdcage-like structure each of which operable for receiving an MR signal from tissue within its field of view, (ii) a secondary coil having at least one coil element in proximity to the volume coil for receiving an MR signal from tissue within its field of view and (iii) a tertiary coil having at least one coil element in proximity to the volume coil for receiving an MR signal from tissue within its field of view. The interface includes a plurality of input ports, a plurality of output ports, and an interface circuit. The plurality of input ports are for coupling to the primary resonant substructures of the volume coil and the coil elements of the secondary and tertiary coils. The plurality of output ports are for coupling to a plurality of processing channels of the MR system. The interface circuit enables the input ports and the output ports to be selectively interconnected and thereby enable the coil array to be selectively operated in a plurality of modes. At least one of the modes enables the volume coil to operate as a parallel-imaging compatible device. One or more other modes enable the volume coil to operate as a single output device capable of mimicking the uniformity of a conventional birdcage-type structure.

In another related aspect, the invention provides a housing for an NVA for use with an MR system. The housing includes a head section, a neck section, a C-spine section, and a base section. The head section is used to house a head coil of the NVA. The neck and C-spine sections are used to house neck and C-spine coils, respectively, of the NVA. The head, neck and C-spine sections attach to the base section. The neck and C-spine sections attached atop an inferior portion of the base section. The head section is slideably attached atop a superior portion of the base section so as to enable it to be moveable between (i) a closed position wherein the head coil is situated in a phased array relationship with at least one of neck and C-spine coils and (ii) an open position wherein the head coil is situated out of the phased array relationship while still allowing at least one mode of operation of the NVA.

It should be understood that the present invention is not limited to the preferred and alternative embodiments and related aspects summarized above.

BRIEF DESCRIPTION OF THE DRAWINGS

The invention, and particularly its presently preferred and alternative embodiments and related aspects, will be better understood by reference to the detailed disclosure below and to the accompanying drawings, in which:

FIGS. 7A-7D and 8A-8D are diagrams of an interface according to preferred embodiment thereof for coupling the coil elements of the head coil and the anterior neck and posterior C-spine coils of an NVA to a multi-channel MR system.

DETAILED DESCRIPTION OF THE INVENTION

Figure 1A:
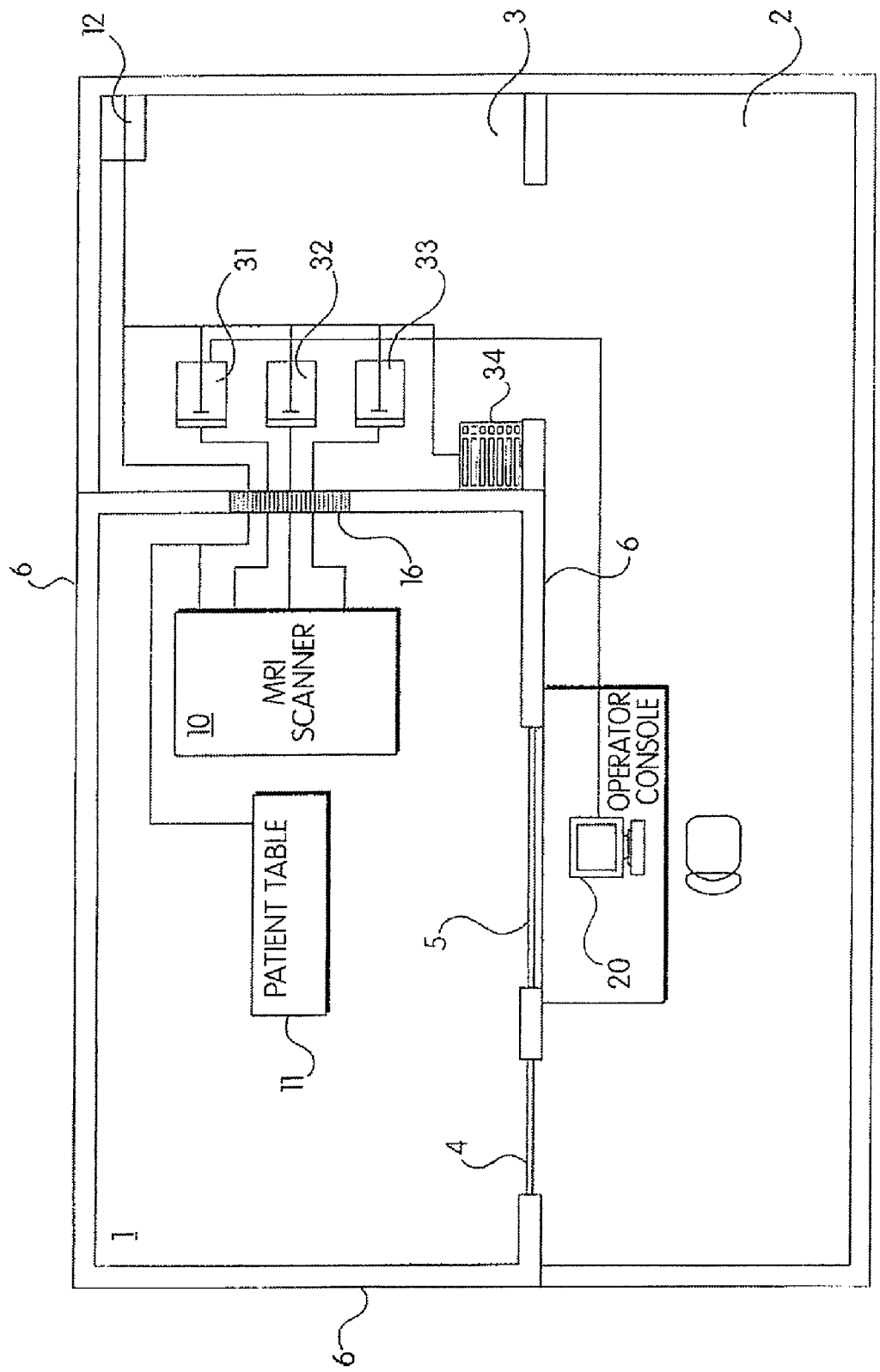
FIG. 1A illustrates the layout of an MR suite inclusive of the scanner room in which the scanner and patient table are located, the control room in which the computer console for controlling the scanner is situated, and the equipment room in which various control subsystems for the scanner are sited.
Figure 1B:
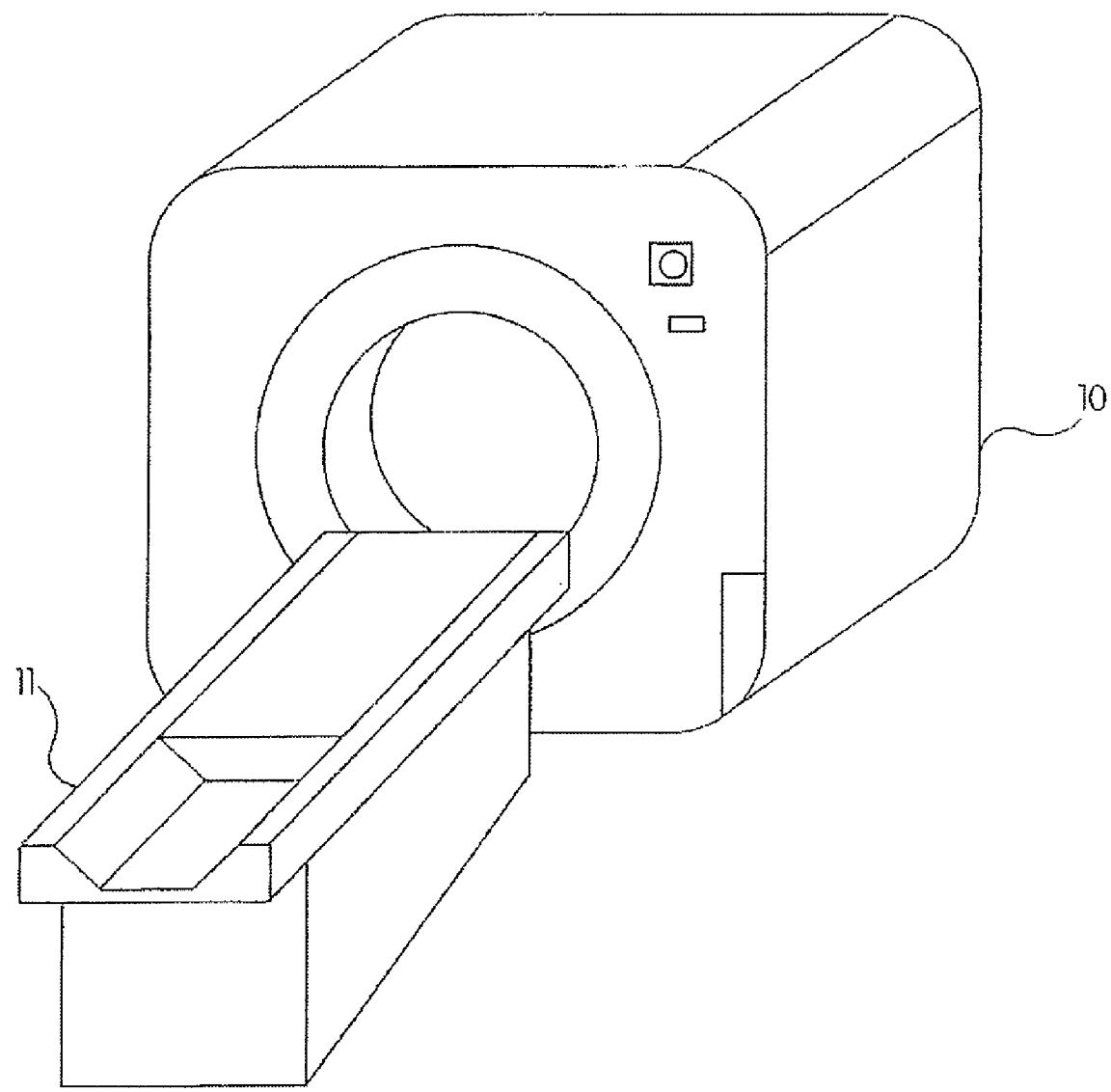
FIG. 1B shows a scanner and patient table of the type shown schematically in FIG. 1A.
Figure 1C:
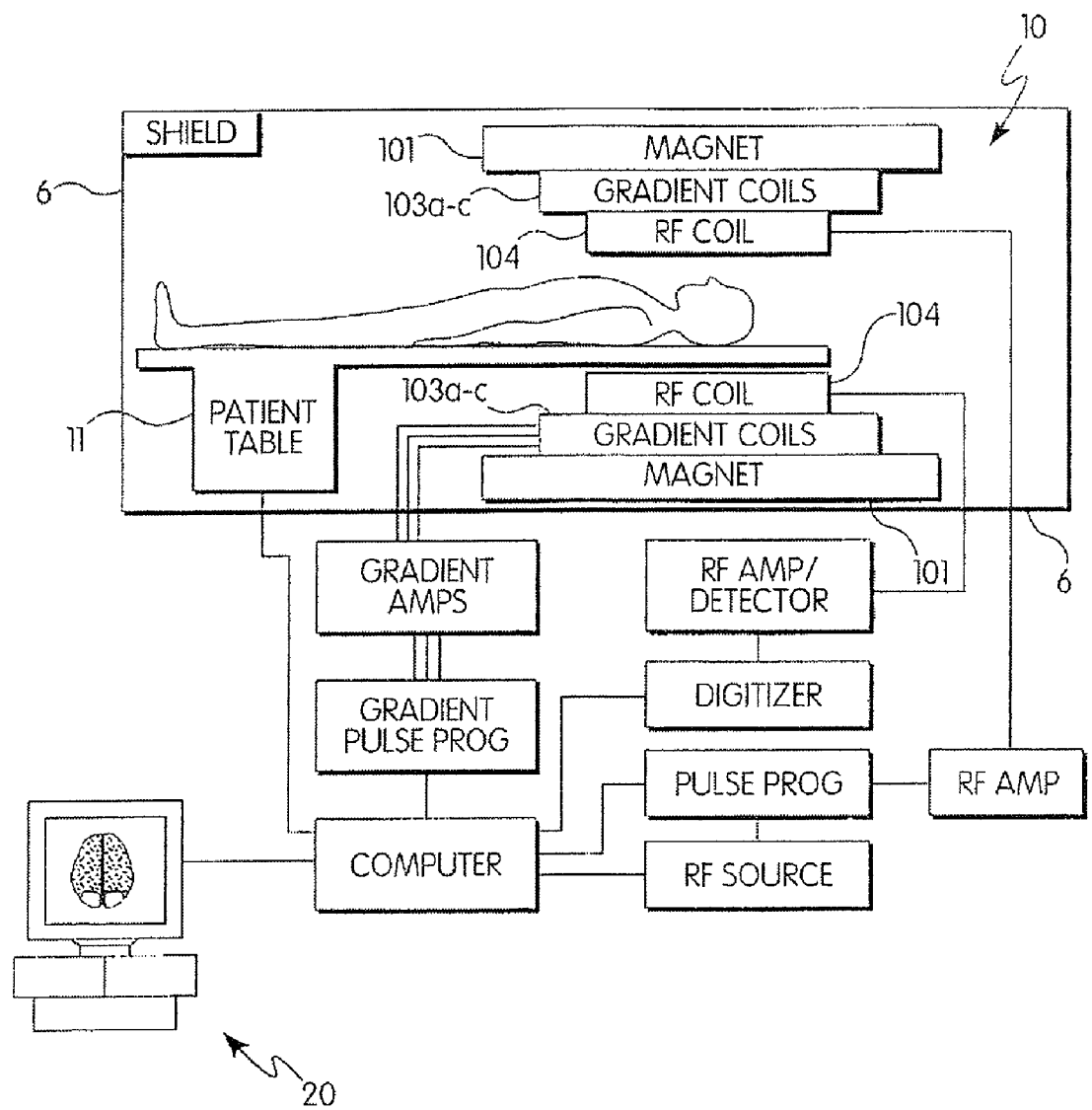
FIG. 1C is a more detailed view of the MR system shown in FIGS. 1A and 1B showing the computer console and the various subsystems located in the control and equipment rooms and a cross-section of the scanner and patient table situated in the scanner room.

The preferred and alternative embodiments and related aspects of the invention will now be described with reference to the accompanying drawings, in which like elements have been designated where possible by the same reference numerals.

FIGS. 2A-19 illustrate the invention in its various embodiments and optional aspects. The embodiments include a volume coil capable of parallel imaging, an array in which the volume coil is an integral part, and an interface for coupling the array to a parallel-imaging compatible MR system. In one preferred embodiment described below, the volume coil is manifested as a head coil, one whose rods are preferably tapered. Similarly, the array in its preferred embodiment may be implemented as a neurovascular array (NVA) in which the head coil is accompanied by an anterior neck coil as well as a posterior C-spine coil. As will become apparent below, the volume coil of the present invention may also be adapted for use in parallel-imaging other parts of the body including extremities such as the arms (e.g., wrists and elbows) and the legs (e.g., knees and ankles), and even larger regions (e.g., torso and hips).

FIGS. 2A-2D illustrate the volume coil of the invention manifested as a head coil, generally designated 2000, of the type used alone or as part of an NVA. Designed as a "receive-only" resonator, the head coil described herein is not intended to apply the RF excitation pulses during the transmit cycle of the MR system. Consequently, it should be used with an external transmit coil, such as the RF body coil of the host MR system. Although head coil 2000 may look like a standard birdcage coil in a bandpass configuration, it operates quite differently. Its unique operation is made possible by the manner in which it has been tuned, specifically by strategic placement of capacitors, inductors and other circuit elements to form a plurality of "electrically-adjacent primary resonant substructures" or coil elements, the structure and operation of which are described below. Of critical importance is the requirement that each coil element/primary resonant substructure be isolated from its neighboring coil elements. Isolation is achieved primarily through two complementary schemes: (1) by preamplifier decoupling and (2) by offset tuning of the end rings and the shared rods. None of the prior art heretofore known discloses isolation schemes of this design.

As shown in FIGS. 2A-2D and 4A-4C, the head coil 2000 has two electrically conductive rings 2101 and 2102 interconnected by a plurality of conductive rods. The first and second rings 2101 and 2102 form the inferior and superior ends, respectively, of the head coil. In its preferred embodiment, the head coil 2000 not only features eight conductive rods A-H but also uses rings of a different size, with the superior ring 2102 having a smaller diameter than the inferior ring 2101. Each rod A-H thus has a linear portion and a tapered portion, with the tapered portions terminating at the small end ring 2102. Dimensionally, the first ring 2101 may, for example, have a diameter of approximately 11.25 inches, and the second ring 2102 a diameter of about 5.875 inches. Preferably spaced at irregular distances from each other as described below and shown in FIGS. 4A and 4B, the rods A-H may span, for example, a length of approximately 9.25 inches. As is apparent from the '745 and '460 patents referenced above, the tapered configuration allows the conductive elements at the superior end of the head coil to be situated closer to the top portions of the head as compared to standard cylindrically-shaped head coils. This enables head coil 2000 to provide images of much greater resolution (via improved homogeneity and higher signal-to-noise ratio) than those that can be obtained with cylindrically-shaped head coils.

The exact dimensions for the diameters of rings 2101 and 2102 and for the lengths of the linear and tapered portions of conductive rods A-H can be selected to suit the particular use to which the volume coil of the invention will be applied. Specifically, the dimensions for the components of head coil 2000 should be selected to make the coil particularly useful for imaging any regions of interest encompassed by the coil (e.g., all or any part of the human head). The dimensions cited in the '081, '745 and '460 patents, for example, will yield improved homogeneity, particularly toward the superior end of the head coil 2000. One or both of the end rings 2101 and 2102, for example, may be circular or elliptical in shape. One or both end rings may also have a diameter larger or smaller than the diameter of the center of the head coil 2000. The spacing of the rods A-H from each other is also a factor, as it affects the capability of head coil 2000 to detect the MR signals emitted from tissue at the center of the imaging volume. With regard to such spacing of the rods, the ability of head coil 2000 to penetrate to the center of the imaging volume is discussed further below.

To render head coil 2000 capable of being used by parallel-imaging compatible MR systems, the rods A-H and the rings 2101 and 2102 have been configured to form a plurality of "electrically-adjacent primary resonant substructures" in a birdcage-like shape. Also referred to as a coil element, each primary resonant substructure includes two rods and the corresponding short segments of the inferior and superior rings interconnecting them. This is best shown in FIGS. 2A-2D and 4A-4C. For the Port I coil element, the primary resonant substructure includes rods H and A and the short segments of end rings 2101 and 2102 interconnecting them. For the Port II coil element, the primary resonant substructure includes rods A and B and the corresponding short ring segments interconnecting them. The Port III-VIII coil elements are similarly constructed. Each such coil element thus shares a rod with each of its neighboring coil elements. In its preferred embodiment, head coil 2000 has eight primary resonant substructures, each able to detect the MR signal(s) emitted by the portion of the head within its field of view. Used with a parallel-imaging compatible MR system, the head coil 2000 is thus capable of providing the MR system with the MR signal detected by each of its eight coil elements/primary resonant substructures, and to do so simultaneously. In accordance with the isolation schemes, all of the coil elements are tuned to resonate at the Larmor frequency (e.g., 63.87 MHz and 127.72 MHz for 1.5 T and 3.0 T, respectively, GE Signa MR Systems).

Figure 4A:
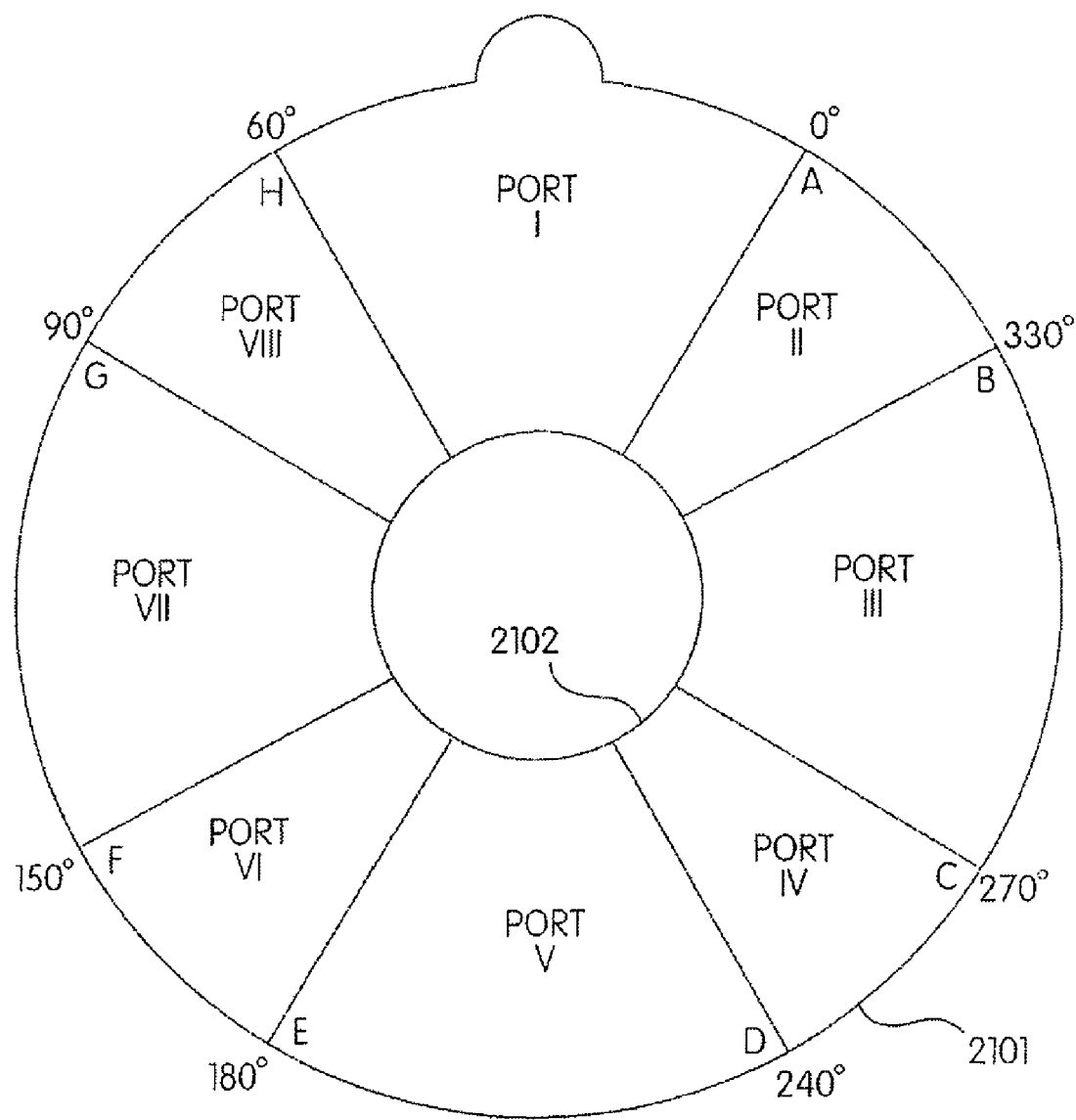
FIG. 4A is a generalized diagram of the head coil of FIGS. 2A-2D showing, from the perspective of its superior end, the eight electrically-adjacent primary resonant substructures of the head coil and their angular distribution and alternating arrangement, small adjacent to large, about the birdcage-like structure.
Figure 4B:
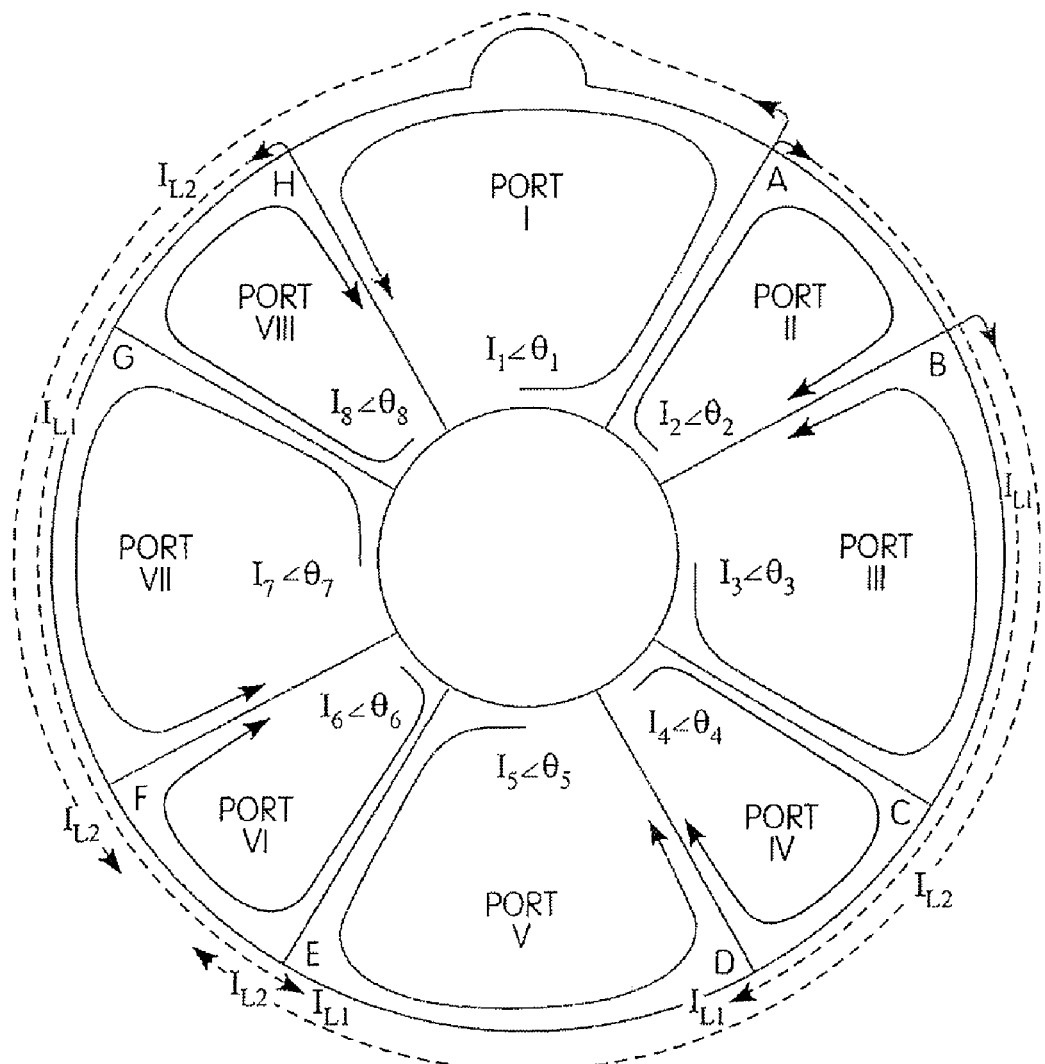
FIG. 4B illustrates the head coil of FIGS. 2A-2D showing magnitude and phase of the signal current flowing in each of the primary resonant substructures of the coil.
Figure 4C:
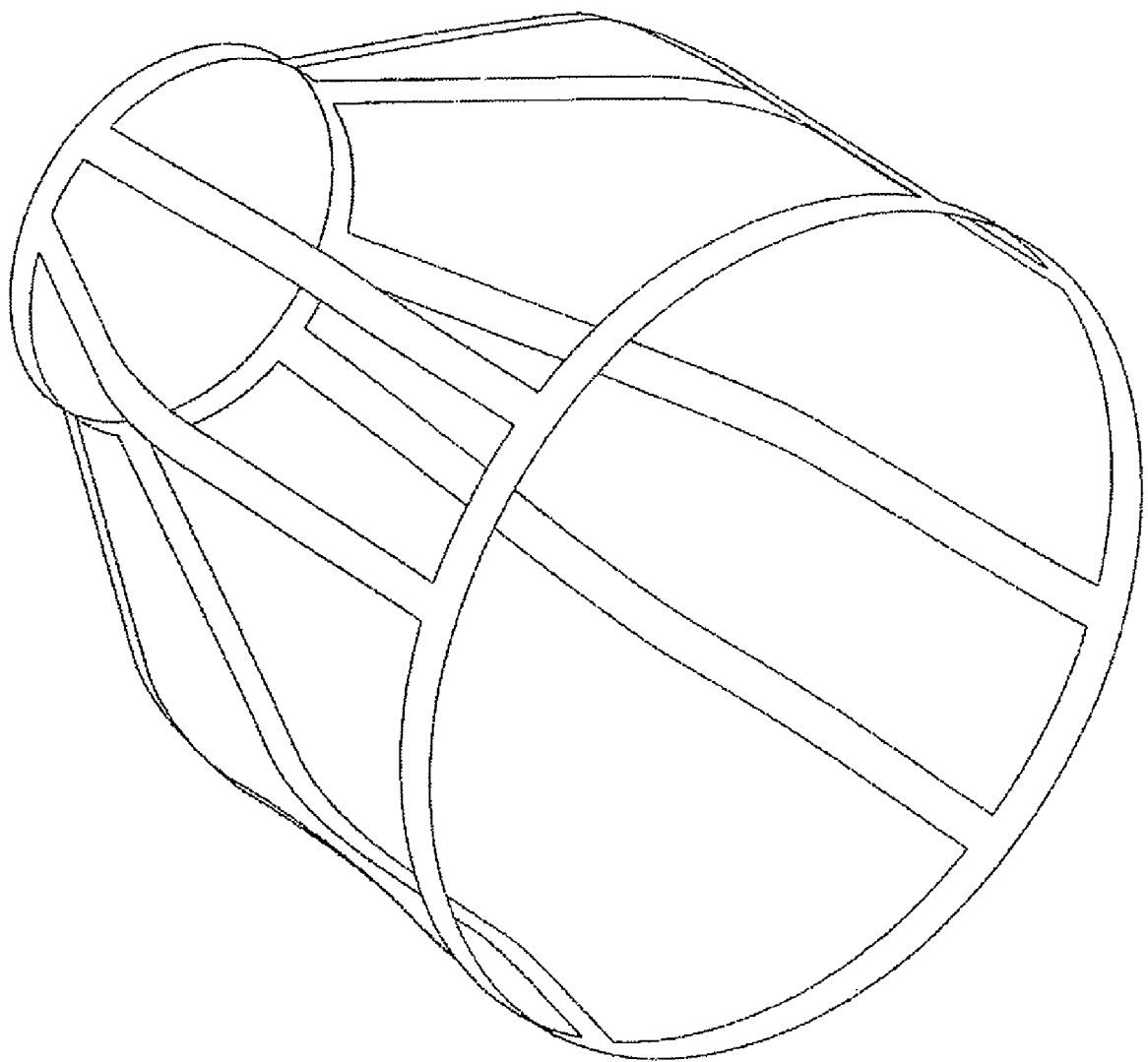
FIG. 4C illustrates a generalized model of the head coil of FIGS. 2A-2D showing in perspective one possible layout for the conductor segments thereof.

Furthermore, it was found that the ability of the head coil 2000 to penetrate to the center of the imaging volume was enhanced by bringing rods A & B closer together, as well as rods C & D, rods E & F and rods G & H. FIG. 4A illustrates the preferred angular distribution of the rods wherein four of the coil elements have their rods spaced 30° apart and the other four have their rods spaced 60° apart. In this preferred deployment, the Port I, III, V, and VII coil elements thus cover twice the area of the Port II, IV, VI and VII coil elements. In addition to the two sizes, the coil elements are deployed in alternating fashion so that each large one is adjacent to a small one. Despite the irregular spacing of the rods, the symmetry of the head coil is maintained, with respect to the anterior and posterior directions. FIG. 4C shows how the conductor segments of head coil 2000 can be shaped to conform to the head.

As shown in FIGS. 2A-2D, the head coil 2000 also features a plurality of input resonant circuits 2111-2118, one in each of the eight coil elements/primary resonant substructures. Each input resonant circuit is connected to the small end ring 2102 between two rods and thus to its corresponding coil element, and is preferably used to couple its coil element to a preamplifier and therethrough to one of the eight channels of the host MR system. The input resonant circuits 2111-2118 thus help to define the eight modes of head coil 2000 for purposes of acquiring MR signals from the head using parallel imaging techniques for which the invention is designed. They are also critical to at least one of the isolation schemes.

In accordance with a first isolation scheme, each primary resonant substructure is endowed with a source impedance that is considerably higher than, and is used to create a resonant circuit with, a load impedance to which it will connect. This enables each primary resonant substructure to be operatively couplable to one channel of the MR system, to which it will convey the magnetic resonance signal it has received from tissue within its field of view. Simultaneously, this isolation scheme also allows each primary resonant substructure to be at least partially decoupled from the other coil elements/primary resonant substructures of the volume coil.

This first isolation scheme is preferably implemented via preamplifier decoupling. In its preferred manifestation, the preamplifier decoupling scheme has each coil element driving a low impedance preamplifier while itself presenting a significantly higher impedance to that preamplifier through its corresponding input resonant circuit. This interaction between the input resonant circuits and the preamplifiers forms the basis for the preamplifier decoupling scheme. Here, however, only the structure and operation of input resonant circuit 2111 is discussed in detail, as it is representative of the other input resonant circuits 2112-2118 of head coil 2000.

Figure 2A:
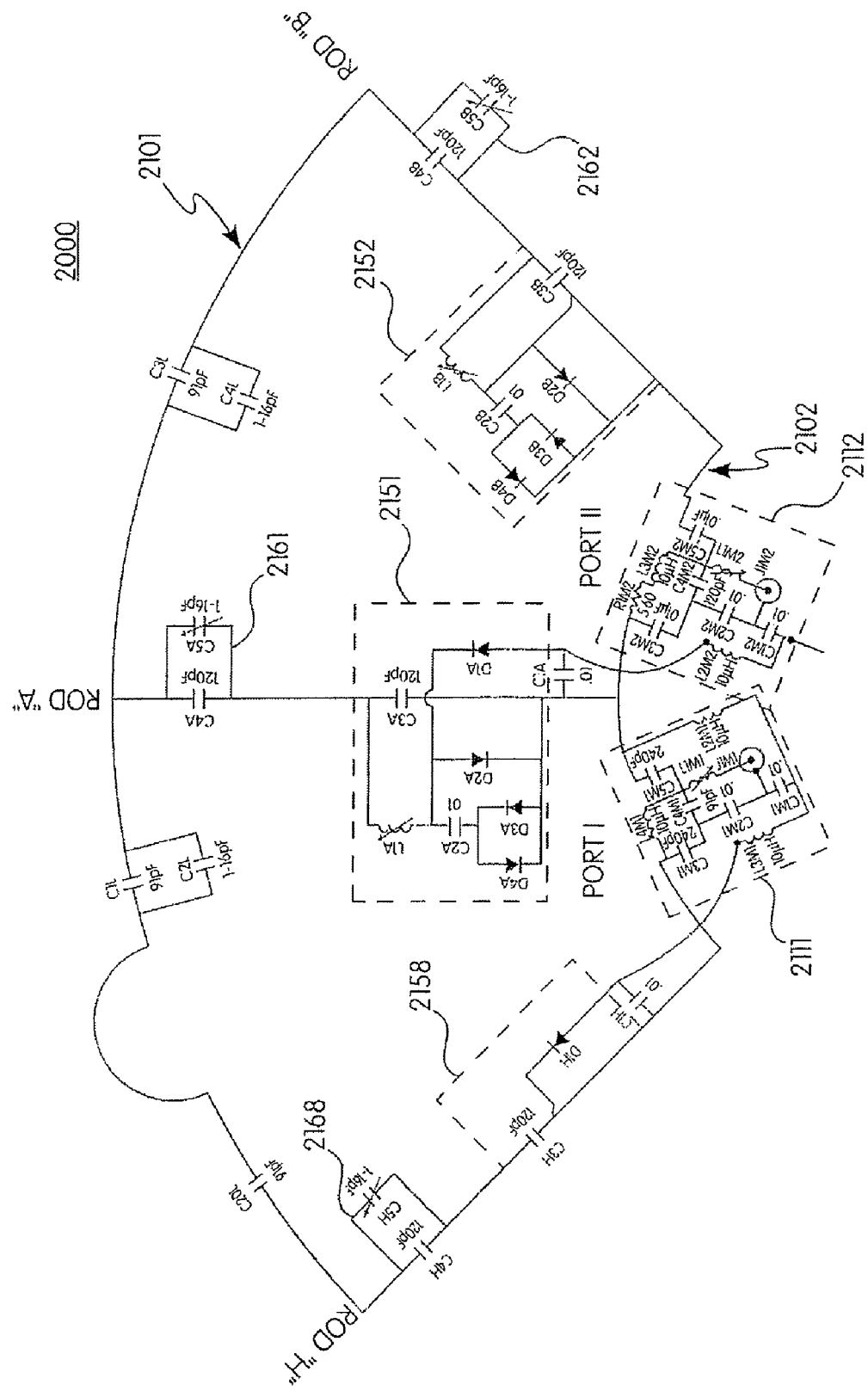
FIGS. 2A-D illustrate a schematic circuit diagram of a receive-only volume coil, implemented as a head coil in a preferred embodiment, which is also capable of being used as part of a neurovascular array (NVA).
Figure 2B:
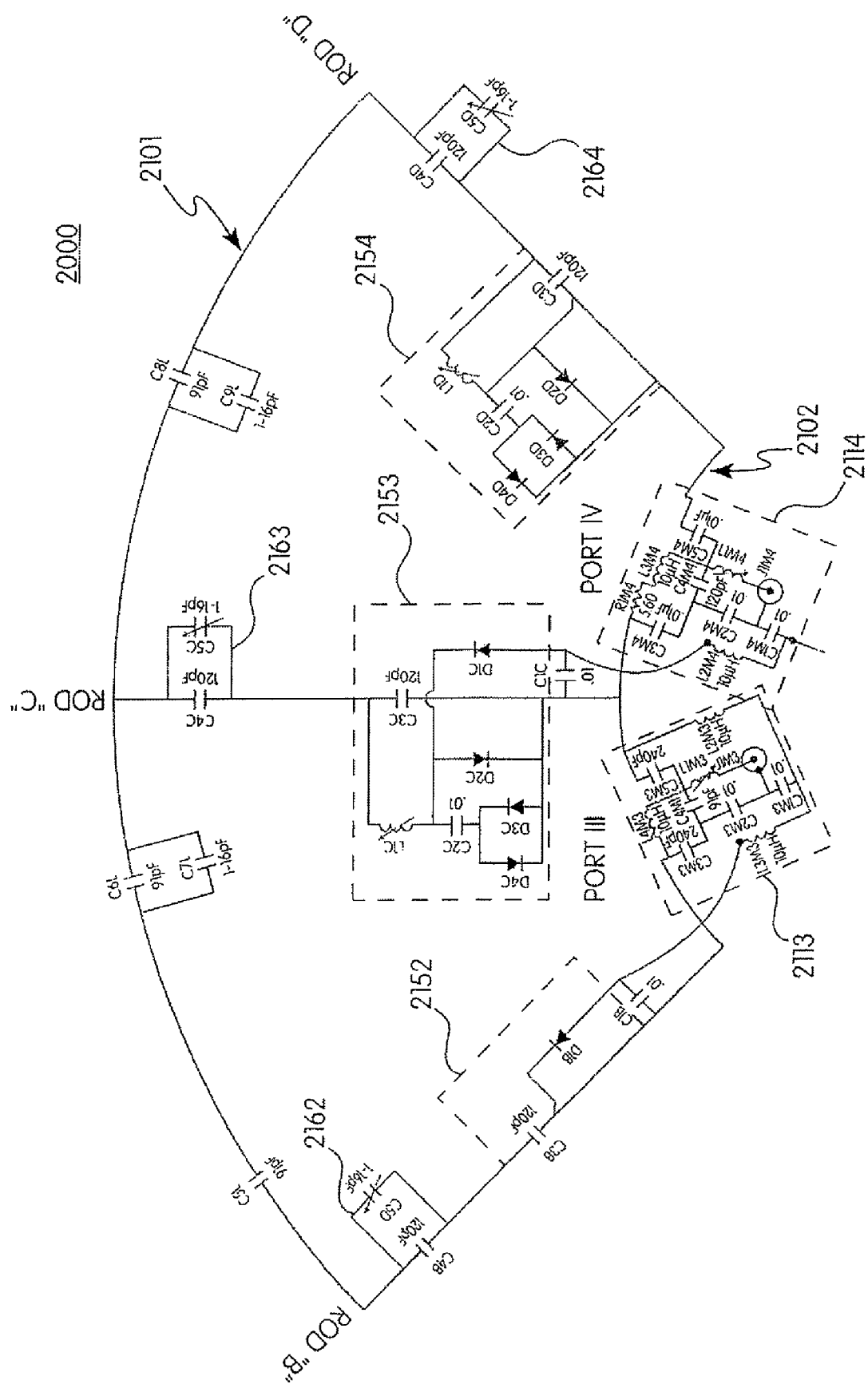
Figure 2C:
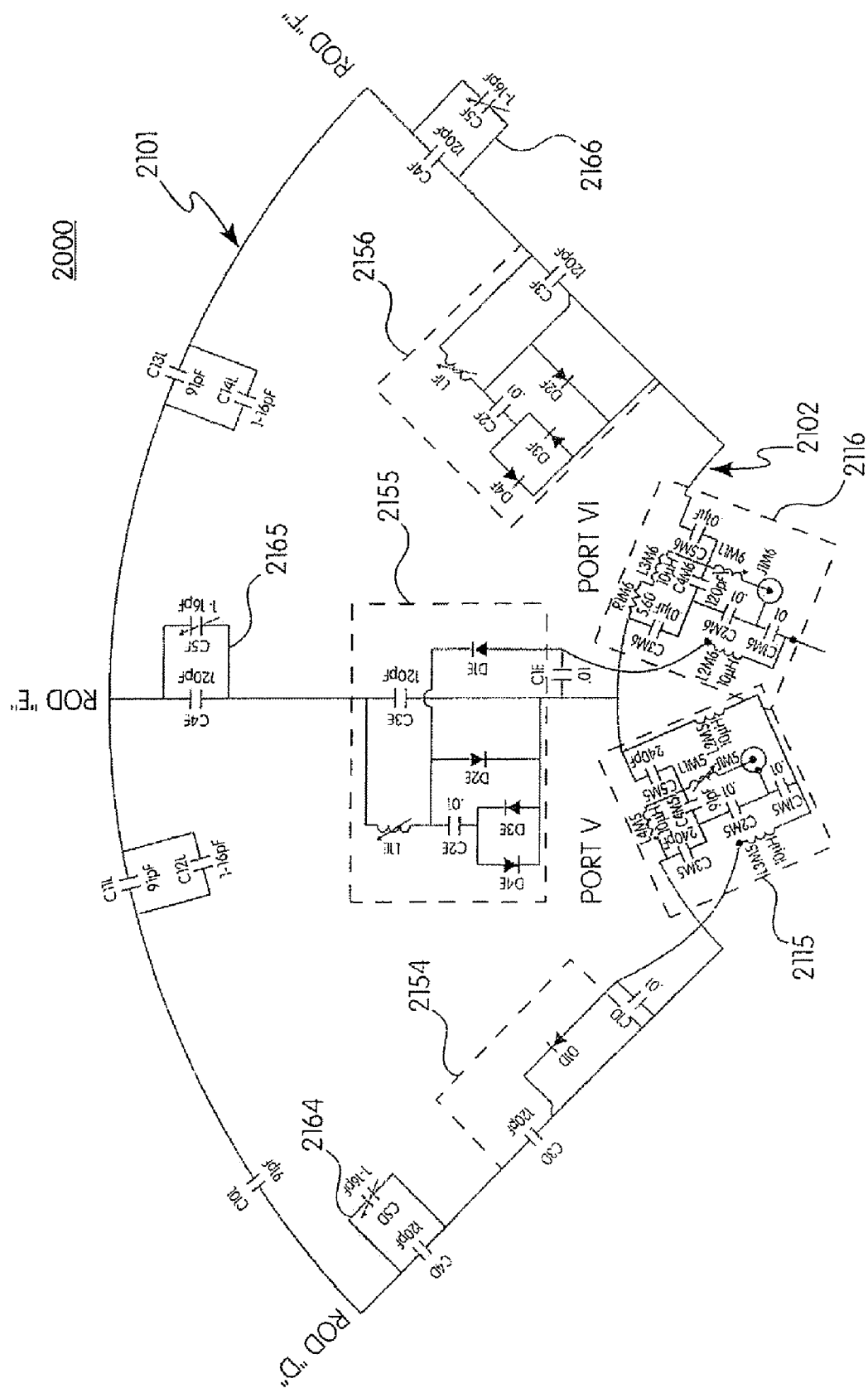
Figure 2D:
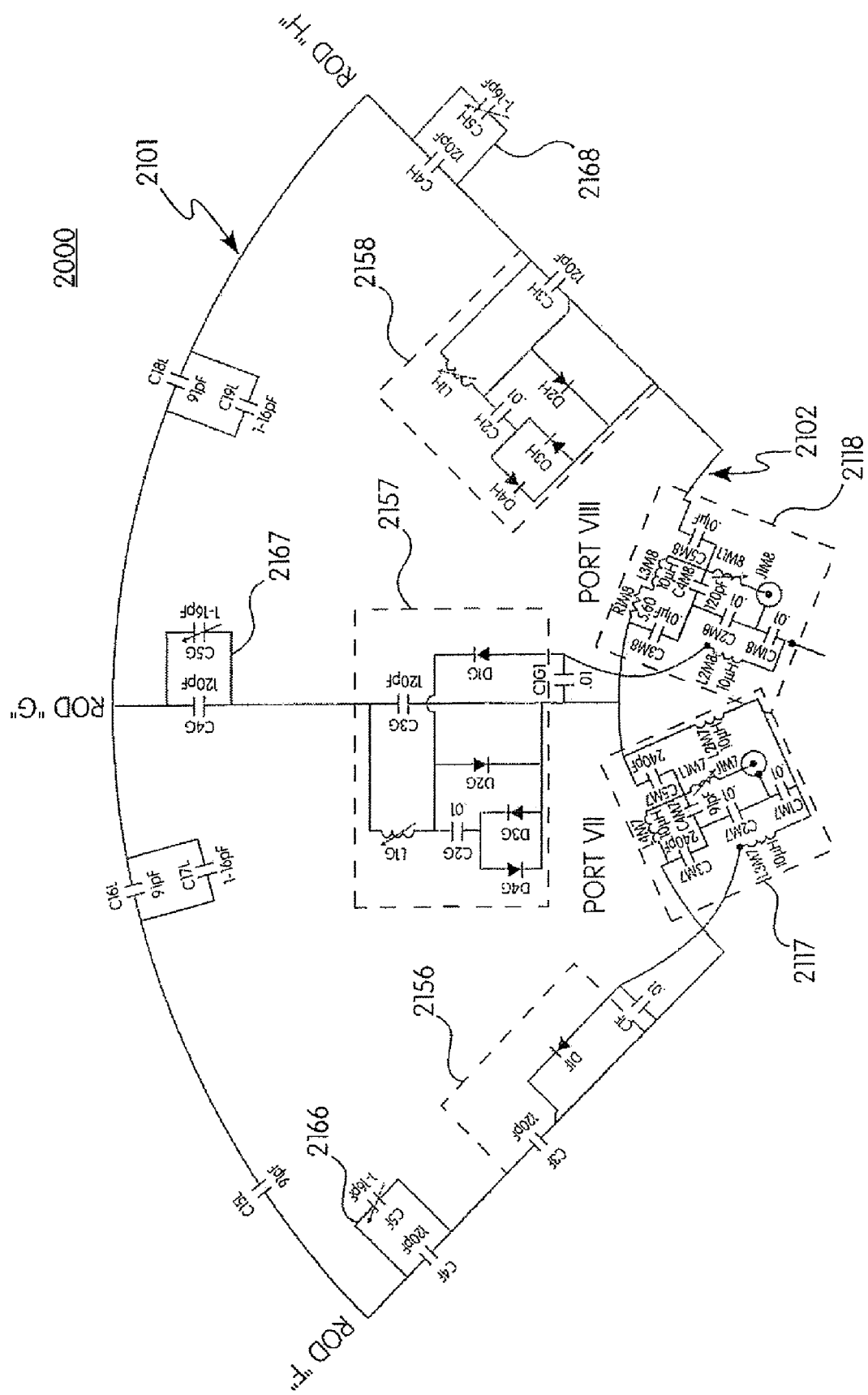
Figure 3A:
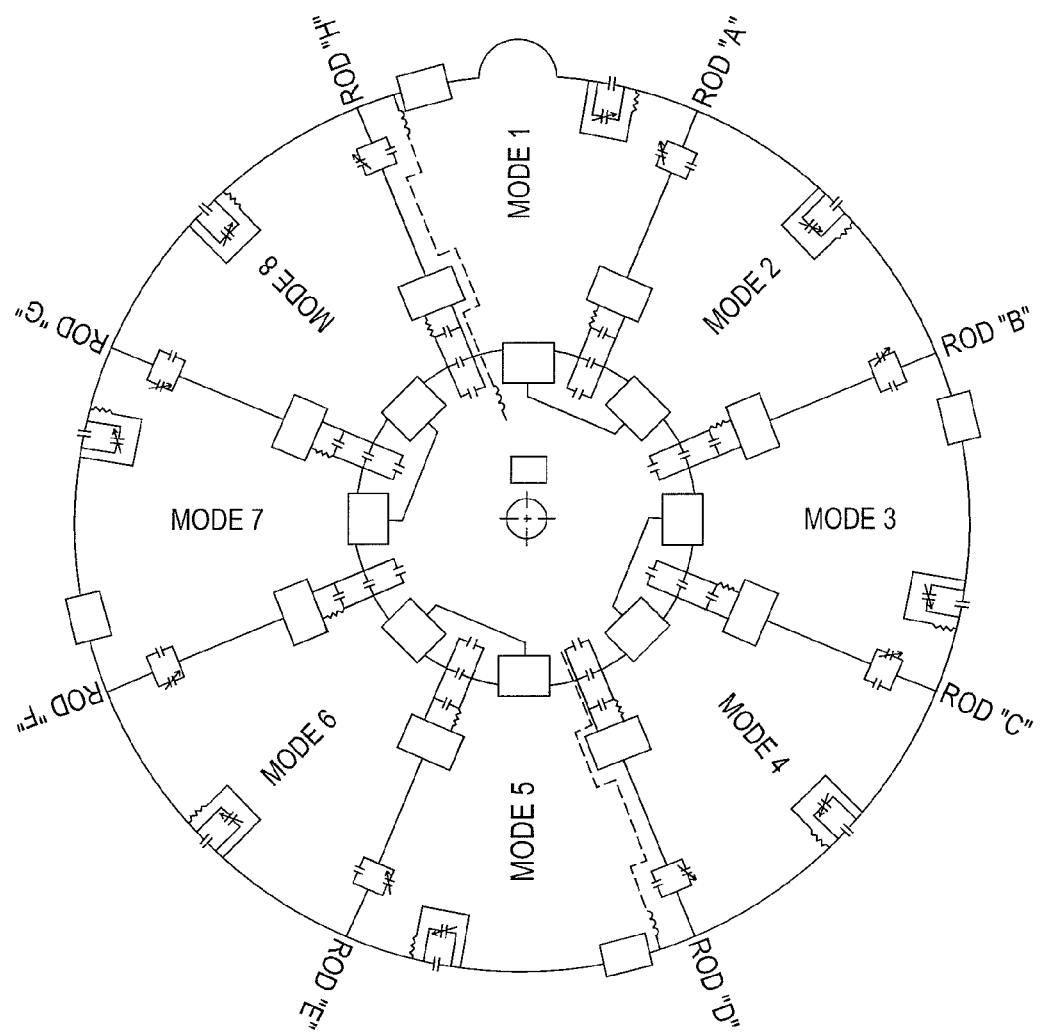
FIGS. 3A-3F illustrate the head coil of FIGS. 2A-2D, with minor variations in componentry.
Figure 3C:
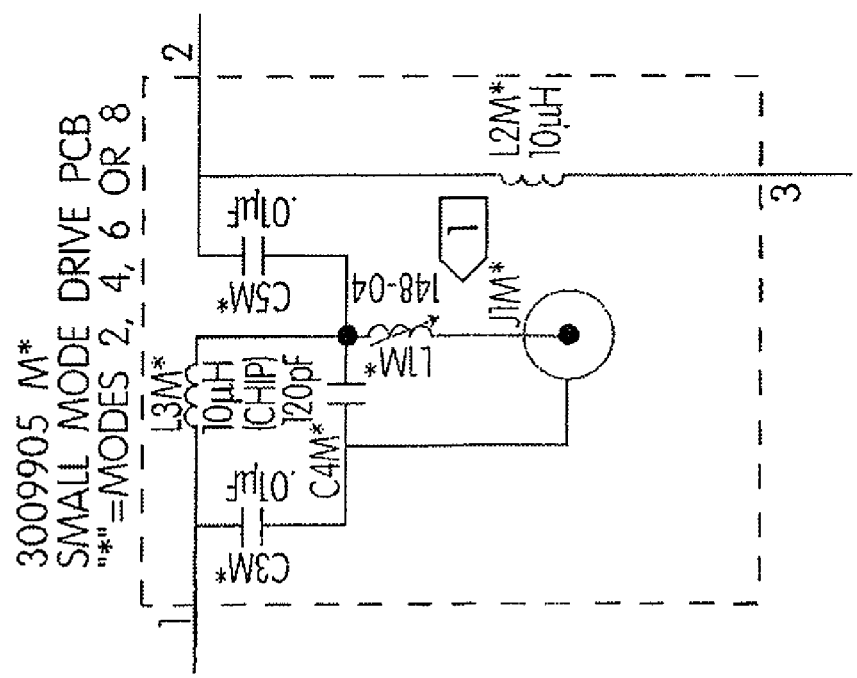
Figure 3B:
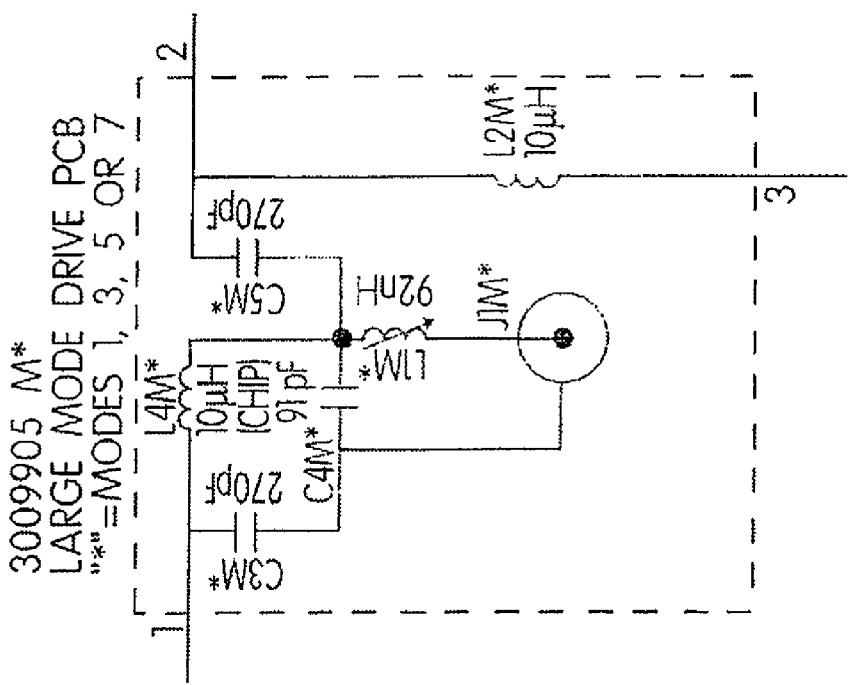
Figure 3E:
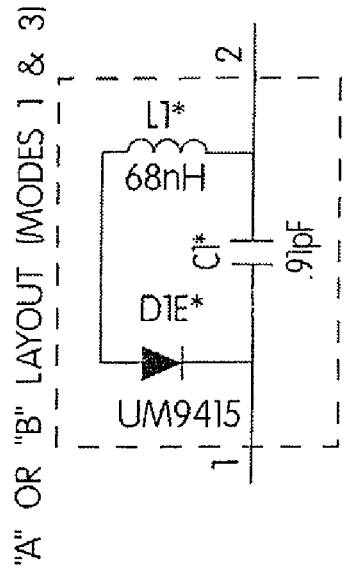
Figure 3F:
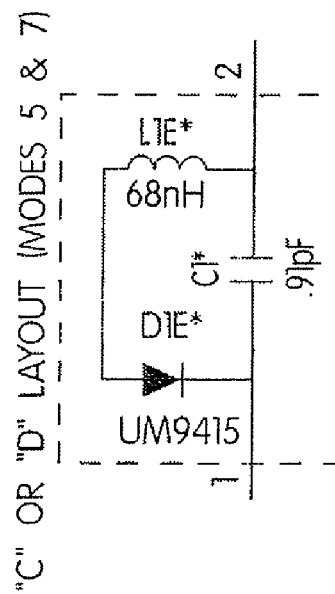
Figure 3D:
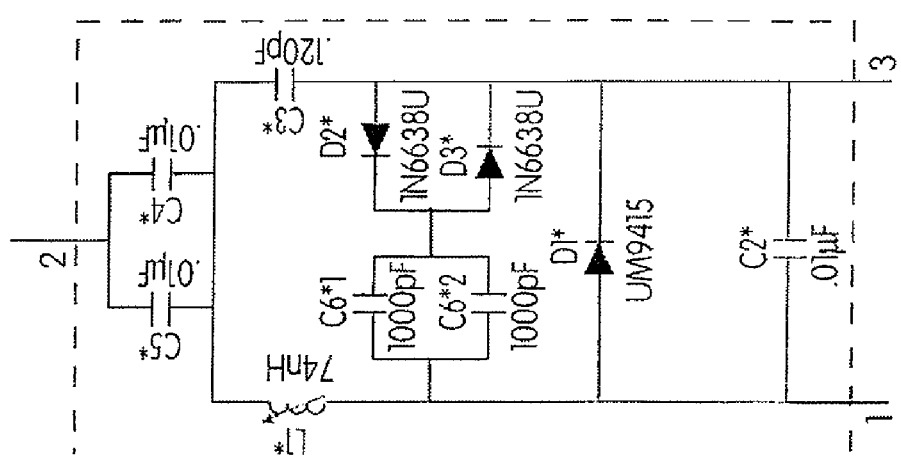

As shown in FIG. 2A, input resonant circuit 2111 includes a capacitor $C_{4M1}$, a variable inductor $L_{1M1}$, and a port connector $J1_{M1}$. The capacitor and inductor are selected to have equal reactances. Port connector $J1_{M1}$ is used to connect the Port I coil element to a low impedance preamplifier and through that preamplifier to one of the 8-channels of the MR system. The preamplifier should provide a very low impedance (e.g., less than 2 ohms) so as to cause inductor $L_{1M1}$ and capacitor $C_{4M1}$ to form a parallel resonant circuit, and thereby effectively open-circuit, when exposed to signals of the proper frequency—in this case, MR signals at the Larmor frequency. Each of the seven other input resonant circuits 2112-2118, which are shown in FIGS. 2A-2D, connects by its respective port connector $J1_{MX}$ (where X is 2-9) to its own low impedance preamplifier, and therethrough connect each of the Port II-VIII coil elements to one of the seven other receivers of the MR system.

The operation of input resonant circuit 2111 during the receive cycle is now described. When the Port I coil element detects MR signals within its field of view, the capacitor $C_{4M1}$ and inductor $L_{1M1}$ respond by resonating, thus creating a high impedance (e.g., about 100 ohms) within the short segment of small ring 2102 in which input resonant circuit 2111 resides. This not only makes that particular segment of small ring 2102 act as an open circuit but also helps to define the Port I current loop, which includes the center conductor of port connector $J1_{M1}$, rod A, the short segment of large ring 2101, rod H and the shield conductor of port connector $J1_{M1}$. The "signal current" induced by the MR signal in the Port I coil element flows in this loop and into the preamplifier to which the shield and center conductors of port connector $J3_{M1}$ are connected. Within that preamplifier, the signal current induced within this loop produces a voltage across a field effect transistor (FET), with the voltage being relatively large compared to the signal current that produced it. As explained in the following paragraphs, this voltage signal will have been produced almost exclusively from the signal current flowing within the Port I coil element, with virtually no current coming from the other conductive paths of the head coil. In this way, the MR signal detected by the Port I coil element is essentially conveyed as a voltage signal to one of the 8-channels of the MR system.

Furthermore, the open-circuited short segment of small ring 2102 in the Port I coil element also appears as a high impedance to all the other coil elements, such as the adjacent Port VIII and Port II coil elements. The signal current induced within each of the other coil elements is therefore strongly discouraged from flowing into the Port I coil element via the small ring 2102. More broadly, the signal current induced within any given coil element is strongly discouraged from flowing anywhere except within its own loop. This is known as preamplifier decoupling. In total, the preamplifier for each of the coil elements provides a low impedance to its corresponding input resonant circuit 2111-2118. This causes the inductor $L_{1MX}$ and capacitor $C_{4MX}$ (where X is 1-8) in those input resonant circuits to resonate at the Larmor frequency during the receive cycles. This makes the small ring segment of any one coil element appear like an open circuit to all of the other coil elements. Because the small ring segment of any given coil element exhibits a high impedance to all of the other coil elements, the signal current induced within any given coil element is largely unable to flow anywhere other than within its own loop and thus into its corresponding preamplifier. Preamplifier decoupling is thus a critically important scheme, particularly with regard to the superior ring 2102. It enables each coil element of the head coil to be isolated, via the small ring 2102, from each of the other coil elements during the receive cycles of the MR system. Although preferably incorporated into the short segments of small ring 2102, the preamplifier decoupling scheme could alternatively be incorporated into other conductive segments of the coil elements such as the short segments of large ring 2101 or even the rods.

Due to this first isolation scheme, very little of the signal current induced within each coil element will leak out into the other short segments of superior ring 2102. Although the circuit elements in input resonant circuits 2111-2118 can be tuned with a relatively high degree of precision, the tuning cannot be made perfect in all respects. If it could be made perfect, no signal current would leak from any of the Port I-VIII coil elements into neighboring segments of the small ring 2102. In practice, however, the circuit elements of head coil 2000 cannot be tuned perfectly. Consequently, the minute amount of current that collectively leaks out of the Port I-VIII coil elements into the small ring 2102 will give rise to a secondary resonance in that ring, as will be further explained below.

One aspect of this design that is important to the efficient operation of each coil element is the impedance presented at various points within the circuitry. As noted above, each preamplifier should provide a low impedance to its corresponding coil element. For this reason, it is preferred that the preamplifiers be placed close to the input resonant circuits 2111-2118, otherwise the impedance presented by preamplifiers located further away would be greater due to the longer cabling needed to interconnect the preamplifiers and the input resonant circuits. Use of remotely located preamplifiers, such as those made available by the manufacturers of MR systems, is therefore not recommended, as such use would make head coil 2000 operate less efficiently. It is therefore preferred that head coil 2000 be equipped with its own set of preamplifiers. Conversely, each input resonant circuit should present a significantly larger impedance (e.g., approximately 100 ohms) to its corresponding preamplifier. Furthermore, from the perspective of the FET of the preamplifier, it will preferably see an impedance on the order of 2000 ohms when looking at the resonant circuit of the FET and the input resonant circuit beyond. From the perspective of the resonant circuit of the preamplifier, it will preferably see an impedance on the order of 1 MΩ when looking at its corresponding FET in the preamplifier.

Without another isolation scheme to compensate for it, the signal current induced within each coil element would itself adversely affect the degree of isolation. This problem is perhaps best conveyed by way of example. Consider the Port VIII, Port I and Port II coil elements. A consequence of the signal current induced within the Port VIII loop is the magnetic flux created by that current as it flows down rod G, through the short segment of large ring 2101, up rod H, and through the other conductive parts of that loop. Similarly, the signal current induced within the Port I loop creates magnetic flux as it flows down rod A, through the short segment of ring 2101, up rod H, and through the other parts of the Port I loop. Likewise, the signal current induced within the Port II loop creates magnetic flux as it flows down rod A, through the short segment of ring 2101, up rod B, and elsewhere through the Port II coil element. The magnetic flux created by the signal current flowing in the Port VII loop, however, induces spurious current in the Port I coil element, and the magnetic flux created by the signal current flowing in the Port I loop creates spurious current in the Port VIII coil element. The magnetic flux caused by the Port I loop also induces spurious current in the Port II coil element, and the Port II loop reciprocates by inducing spurious current in the Port I loop. The bottom line is that the signal current induced within each coil element generates a magnetic flux that induces spurious current to flow in each of the adjacent coil elements. If it were not for the offset tuning scheme discussed below, these spurious currents would cause inductive coupling between adjacent coil elements and thus significantly reduce the degree of isolation between the coil elements of head coil 2000. If such mutual inductance between coil elements were allowed to occur, the overall coil structure would be less efficient (e.g., a lower signal-to-noise ratio), and thus would yield images of considerably lower quality. To avoid this problem, head coil 2000 achieves isolation not only through preamplifier decoupling but also with an offset tuning scheme.

For the volume coil to operate as desired, each of the coil elements should exhibit series resonance, i.e., the rods and the corresponding short segments of the rings interconnecting them should collectively have a net reactance of nearly zero. In the absence of the offset tuning scheme described below, each individual segment of a coil element (i.e., each rod and each ring segment) would essentially have equal capacitive and inductive reactances for a net reactance of zero within the entire coil loop. This would allow the coil element to resonate at the Larmor frequency in response to the MR signal it detects from the tissue within its field of view. Such a configuration, however, without further attention to the need for isolation, would still result in considerable inductive coupling of adjacent coil elements.

To avoid such inductive coupling, the offset tuning scheme requires configuring the rods of each coil element slightly off series resonance (i.e., making the reactance of each rod either slightly capacitive or inductive) and compensating for the resulting slight reactance of the rods by shifting each of the ring segments slightly off series resonance in the other direction (i.e., slightly inductive or capacitive). Alternatively stated, in any given coil element, the large ring segment can be made slightly net inductive and the small ring segment slightly net capacitive, with the two rods of the loop made similarly off series resonance. Given that the rods and ring segments of each coil element are each tuned to be only slightly off series resonance, an observer may assume that each coil element is precisely series resonant. Exact tuning to achieve series resonance at a single frequency in all conductor segments is not, however, what is needed to avoid—or at least to minimize to the greatest extent possible—coupling of adjacent coil elements. That said, each coil element of head coil 2000 is tuned to be as close as possible to series resonance. Ultimately, the rod and ring segments are tuned so that the signal current induced in each coil element has a particular phase associated with it relative to the signal currents induced within each of the other coil elements. According to this offset tuning scheme, each coil element should thus be tuned so that the signal current induced within it has a phase associated with it relative to its neighbor, with the sum of the phase angles of all the coil elements in the head coil equaling 360 degrees. The extent of the phase shift between adjacent coil elements will depend on the number of coil elements in the volume coil.

This offset tuning scheme is now further described by way of example. In the preferred embodiment shown in FIGS. 2A-2D and 4A, head coil 2000 has eight coil elements. The signal current induced within the Port I coil element can be represented by $I_1 \angle \theta_1$, as shown in FIG. 4B, where $I_1$ is the magnitude of the signal current and $\theta_1$ is its phase. Similarly, the signal current induced within the Port II coil element can be represented by $I_2 \angle \theta_2$, and the signal current in the Port III coil element can be represented by $I_3 \angle \theta_3$. Each of the signal currents of the other coil elements can be denoted in this fashion until the Port VIII loop wherein it is represented by $I_8 \angle \theta_8$. In this eight-element embodiment, the signal current of each coil element is preferably 45 degrees out of phase with respect to its neighbor. The resulting voltage produced by the signal current at any given port connector, and thus preamplifier, is therefore also 45 degrees out of phase with respect to that produced at its neighboring port connectors. Referring to FIG. 4B, the phases $\theta_1$, $\theta_2$, $\theta_3$, ... $\theta_8$ would then be 0 degrees, 45 degrees, 90 degrees, ... 315 degrees, respectively, for the eight coil elements of head coil 2000.

Consider now what happens in the Port I coil element in view of large ring 2101. As noted above, the signal current induced within the Port I coil element flows down rod A, through the short segment of large ring 2101, up rod H, and through the other parts of the Port I loop. Due at least partly to the non-zero impedance of rod H, however, a small amount of this signal current will flow not up rod H but will leak into the large ring segment of the Port VIII coil element. In FIG. 4B, this leakage current is shown as $I_{L1}$, though it should be understood that it is actually $I_{L1} \angle \theta_1$ as it too exhibits phase $\theta_1$. Likewise, a minute amount of the Port I signal current flowing down rod A will not flow into the large ring segment corresponding to the Port I coil element but leak into the large ring segment corresponding to the Port II coil loop. This is also shown as $I_{L1}$, though it flows in the opposite direction. The offset tuning scheme assures that these two Port I leakage currents have essentially the same phase and magnitude, with the latter being a very small fraction of signal current $I_1$. Moreover, the $I_{L1}$ leakage currents are opposite in sign because they travel in opposite directions around large ring 2101. Consequently, the sum of the Port I leakage currents tends to be negligible because they effectively cancel each other out when they reach the opposite segment of large ring 2101. Similarly, a very small amount of the signal current from the Port II coil element leaks into the large ring 2101. These two leakage currents, shown as $I_{L2}$ in FIG. 43, also have essentially the same phase, $\theta_2$, and magnitude, and thus cancel each other out when they reach the opposite side of ring 2101. The same cancellation effect occurs with the leakage currents of each of the other (Port III-VIII) coil elements. Notably, even the preamplifier decoupling scheme helps to keep these leakage currents in ring 2101, largely because of the relatively large impedances presented by each of the input resonant circuits 2111-2118.

The offset tuning scheme also confronts the problem of the spurious currents noted above, which is addressed herein by way of example involving the Port VIII and Port I coil elements. First, as noted above, the magnetic flux emanating from the Port I coil element induces spurious current in the Port VIII loop. Similarly, the magnetic flux emanating from the Port VIII coil element induces spurious current in the Port I loop. Second, it should be apparent that within each coil element the signal current oscillates, given that each coil element essentially functions as a resonant circuit. The spurious current induced within each coil element thus also oscillates and, further, has the same phase as the signal current from which it was ultimately derived. Due to the phase difference between adjacent coil elements, the spurious current induced within one coil element is also delayed with respect to the spurious current induced in its neighboring coil element. As a result of the offset tuning scheme, at any given time the spurious current induced in the shared rod by one coil element is roughly equivalent to, and flows in the opposite direction of, the spurious current induced therein by the neighboring coil element. Consequently, in each rod, the spurious current induced therein by one coil element is at least partially canceled by the spurious current induced therein by its neighboring coil element, which further enhances the isolation between adjacent coil elements.

The end result is that there is essentially no net flux, no net current, and no net signal shared between adjacent coil elements. The offset tuning scheme thus assures that little-to-zero inductive coupling will occur between neighboring coil elements. During manufacture of the volume coil, consistency in the distribution and positioning of the capacitors about each coil element will maximize the degree of isolation achievable between neighboring coil elements, and thus further reduce the cross-coupling between the adjacent coil elements of head coil 2000.

Although the circuit elements in large ring 2101 and other segments can be tuned with a relatively high degree of precision, the tuning cannot be made perfect in all respects. If it could be made perfect, the leakage currents of each coil element would either be nonexistent or exactly cancel each other out. In practice, however, the circuit elements of head coil 2000 cannot be tuned perfectly. The leakage currents of each coil element will thus not completely cancel each other out. Consequently, the uncanceled or remaining amounts of leakage currents $I_{LX}$ (where X is 1-8) give rise to a secondary resonance in large ring 2101, as will be further explained below.

The values of the circuit elements shown in FIGS. 2A-2D provide just one example of how the Port I-VIII coil elements can be tuned to implement the offset tuning scheme contemplated by this invention. FIGS. 3A-3F provide yet another example of head coil 2000, with minor variations in circuit values and/or componentry. In these illustrated examples, the circuit elements are appropriate for a head coil designed to operate with a 1.5 T MR system. The tuning schemes can be applied to volume coils of essentially any design including head coils, extremity coils, etc. It should be understood that the isolation schemes disclosed herein can be thus employed to create volume coils intended for essentially any parallel-imaging compatible MR system regardless of manufacturer or field strength.

The offset tuning scheme was also implemented in such a way as to preserve the benefits acquired with both the tapered design (i.e., improved homogeneity and higher signal-to-noise ratio) and the preferred deployment of the coil elements (i.e., improved ability to penetrate to the center of the imaging volume). For example, as shown in FIGS. 2A-2D, there, are some differences in capacitance within the large ring 1101. Due to their longer length, the segments of ring 2101 corresponding to the larger coil elements have different capacitive values than the segments of large ring 2101, corresponding to the smaller coil elements. The different capacitive values are used to accommodate the different lengths in the segments of the ring 2101 between adjacent rods, as best shown in FIGS. 4A and 4B. Due to the desire to make room for the nose, the segment of ring 2101 between rods H & A, for example, is longer than the segment opposite it, namely, the segment between rods D & E. Similarly, the segment of ring 2101 between rods H & A is longer than the adjacent segment between rods A & B. Each of the different capacitive values provides a capacitive reactance that accommodates the different inherent inductances of the respective segments of conductive ring 2101. This compensation scheme was implemented in the large and small rings because the rods were chosen to have the same reactive length. Furthermore, as can be seen in FIG. 4A in view of FIGS. 2A-2D, the longer segments of ring 2101 (i.e., between rods H & A, B & C, D & E and F & G) have an additional series capacitor, rather than just the fixed and variable capacitors deployed in parallel, for purposes of diminishing the electric field. This arrangement prevents the head coil from being loaded unnecessarily high at the inferior end near the shoulders, and thus avoids a reduction in the overall sensitivity of the head coil 2000. This minimizes the electric field patient coupling to the coil.

For each of Port I-VIII coil elements, the two isolation schemes thus strongly encourage the signal current to remain in the coil element in which it was induced, with very little of it leaking out to the segments of adjacent coil elements. First, with regard to the small ring 2102, and using the Port I coil element to illustrate, very little of the signal current induced within the Port I loop will flow from its small ring segment into a neighboring small ring segment. The high impedance produced by input resonant circuits 2112-2118 within each of the other small ring segments strongly discourages it. Because the small ring segment of any one coil element exhibits a high impedance to all of the other coil elements, the signal current induced within the Port I coil element is largely unable to flow anywhere other than within its own loop and thus into its corresponding preamplifier. Second, with regard to the large ring 2101, very little of the signal current induced within the Port I loop will leak into a neighboring large ring segment. This is strongly discouraged not only by the collective impedance of the large ring 2101 but also by the preamplifier decoupling scheme. To the signal current flowing in the large ring segment of the Port I loop, even each adjacent large ring segment by itself presents a higher impedance. This higher impedance strongly compels the signal current induced within the Port I loop to stay in the Port I loop, thus discouraging flow into the large ring segments of the neighboring Port VIII and I coil elements.

Given that each signal current is largely confined to the loop in which it was induced, the Port I-VIII coil elements thus constitute the primary resonant substructures of head coil 2000 in which these eight signal currents respectively flow. In each coil element, the signal current flowing within each loop causes the coil element to resonate at the Larmor frequency, which is approximately 63.87 MHz for a 1.5 T MRI system. In a volume coil designed to work with 3 T MRI systems, each primary resonant substructure would resonate at approximately 127.72 MHz.

Although the Port I-VII coil elements are the primary resonant substructures, the head coil 2000 also has secondary resonant substructures. These secondary resonant substructures arise due to design choices concerning, and some inefficiencies in, the two isolation schemes disclosed above. One secondary resonance occurs in the large ring 2101 due to the very small amount of signal current that leaks into it from each of the Port I-VIII coil elements. In the preferred embodiment of head coil 2000 shown in FIGS. 2A-2D, this secondary resonance occurs at approximately 70 MHz. This secondary resonant substructure will not, however, adversely affect the operation of the head coil. This is because it resonates at a frequency well above the Larmor frequency and therefore will not interfere with the MR signals detected by each of the coil elements. Another secondary resonance occurs in the small ring 2102. Due to the design of the input resonant circuits 2111-2118 and their corresponding preamplifiers, a very small amount of signal current from each of the coil elements leaks into the small ring 2102. This leakage current gives rise to a resonance in the small ring. Due to the value of the capacitors inserted within it and its inherent inductance which is a function of its length, the small ring 2102 resonates not at the Larmor frequency but at a significantly lower frequency, which is approximately 52 MHz for the preferred embodiment. The large and small rings 2101 and 2102 resonate at such different frequencies largely due to the difference in their diameters.

The large and small rings by design act as a secondary resonant substructures within head coil 2000. Without the role they play in the overall design, it would not be possible to achieve the exceptionally high degree of isolation between the coil elements/primary resonant substructures of the volume coil.

In its preferred embodiment, the head coil 2000 also includes eight tuning circuits 2161-2168, one in each of the rods A-H. Tuning circuit 2161 in rod A, for example, includes a fixed capacitor $C_{4A}$ and a variable capacitor $C_{5A}$, with the two capacitors deployed in parallel. Each of the other tuning circuits 2162-2168 are preferably identical. Additionally, as noted above, it is recommended that the circuit components of each tuning circuit should be positioned similarly in each of their respective rods to optimize the isolation between coil elements. Consistent with the offset tuning scheme disclosed above, the head coil can be finely tuned to optimize its operation by varying the capacitance of its the rods via the variable capacitors of the tuning circuits. In this embodiment, the total adjustable range of capacitance in tuning circuit 2161 is 121-136 pF. Therefore, if capacitor $C_{4A}$ is 120 pF then the range of variable capacitor $C_{5A}$ in parallel with $C_{4A}$ would be 1-16 pF, as shown in FIG. 2A.

In its preferred embodiment, the head coil 2000 also includes eight decoupling networks 2151-2158, one in each of the rods A-H. Each decoupling network contains both active and passive decoupling circuits, one acting as a backup for the other. Only decoupling network 2151 is discussed herein in detail, however, because it is representative of the others 2152-2158. As shown in FIG. 2A, the active decoupling circuit in network 2151 includes PIN diode $D_{1A}$, diode $D_{2A}$, variable inductor $L_{1A}$, and capacitor $C_{3A}$. During the transmit cycle (i.e., when the RF body coil is transmitting), the host MR system sends a bias signal (e.g., 250 mA) to PIN diode $D_{1A}$, thus placing both it and diode $D_{2A}$ in a state of forward conduction. This leaves capacitor $C_{3A}$ and variable inductor $L_{1A}$ in parallel, with the equal capacitive and inductive reactances giving rise to a parallel resonant circuit. The resulting high impedance effectively open-circuits that portion of rod A, thus decoupling the entirety of rod A from the host MR system. During the receive cycle, PIN diode $D_{1A}$ and diode $D_{2A}$ therewith are biased off. The anode of PIN diode $D_{1A}$ of the active decoupling circuit thus sees only the reflected low impedance of its corresponding preamplifier, which can be offered as part of the invention or be a preexisting part of the host MR system.

The passive decoupling circuit in decoupling network 2151 comprises a pair of parallel-connected diodes $D_{3A}$ and $D_{4A}$ in series with capacitor $C_{2A}$, both of which in parallel with variable inductor $L_{1A}$ and capacitor $C_{3A}$. During the transmit cycle, the diodes $D_{3A}$ and $D_{4A}$ respond passively (to the RF signal transmitted by the body coil) by effectively short circuiting themselves. This leaves capacitor $C_{3A}$ and variable inductor $L_{1A}$ in parallel with each other, and again compels them to form a parallel resonant circuit to assure that rod A is indeed open-circuited during the transmit cycle. During the receive cycle of the host MR system, the diode pair $D_{3A}$ and $D_{4A}$ exhibit a high impedance, thereby effectively placing variable inductor $L_{1A}$ in an open circuit. Consequently, in the passive decoupling circuit of network 2151, only the capacitor $C_{3A}$ is seen in rod A during the receive cycles.

In a related aspect, the invention also provides an array in which the volume coil is an integral part. In a preferred embodiment, the array is manifested as an NVA that includes head coil 2000, an anterior neck coil 2200, a posterior C-spine coil 2400, and an interface 2500 for coupling the array to a parallel-imaging compatible MR system. Although described as an NVA, it should be understood that the array of the invention may be implemented with a volume coil intended for another region of the body along with secondary and tertiary coils intended for supplemental coverage.

Figure 5A:
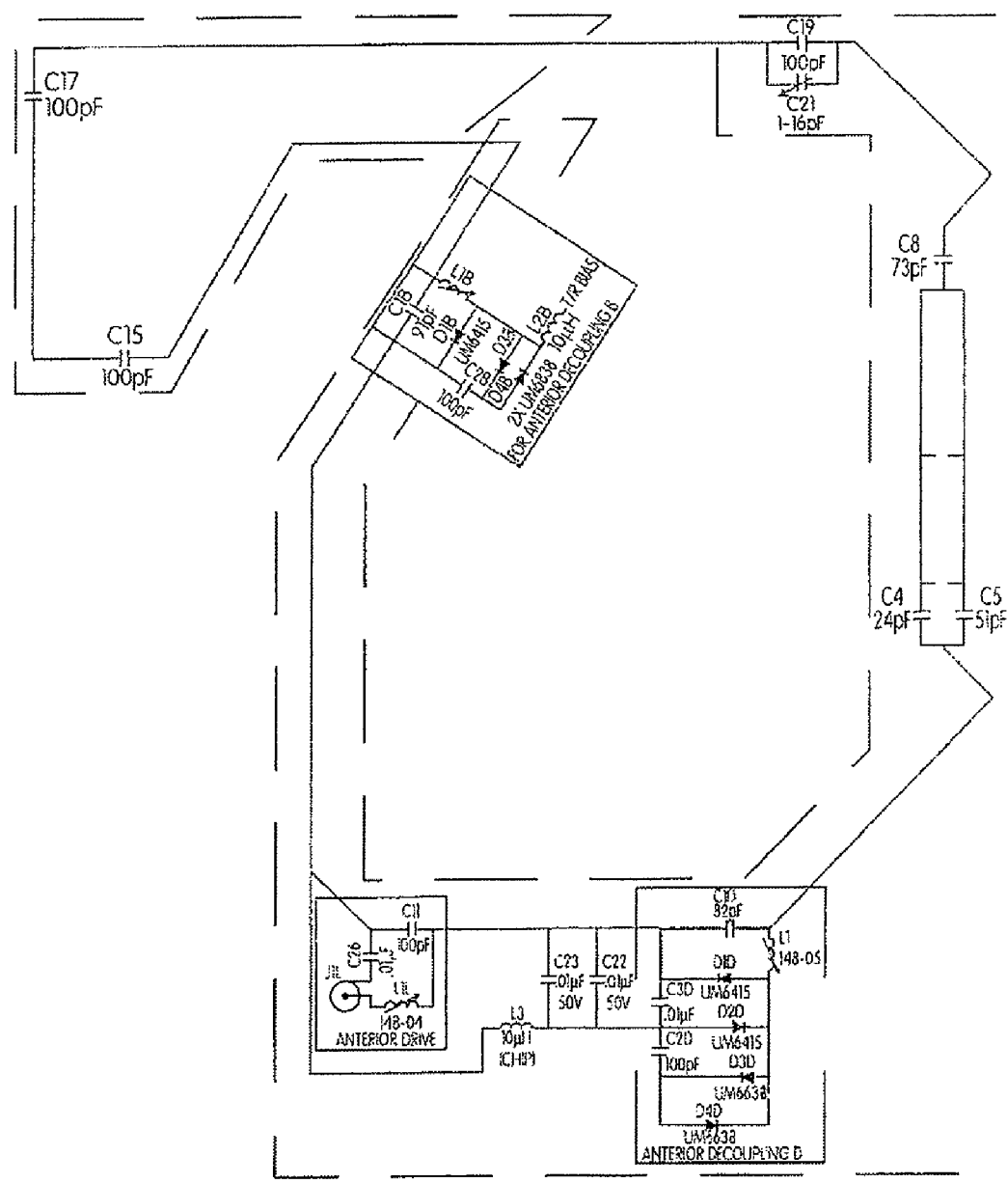
FIGS. 5A-5B and 5C illustrate a schematic diagram and a generalized model, respectively, of an anterior neck coil capable of being used as part of an NVA.
Figure 5B:
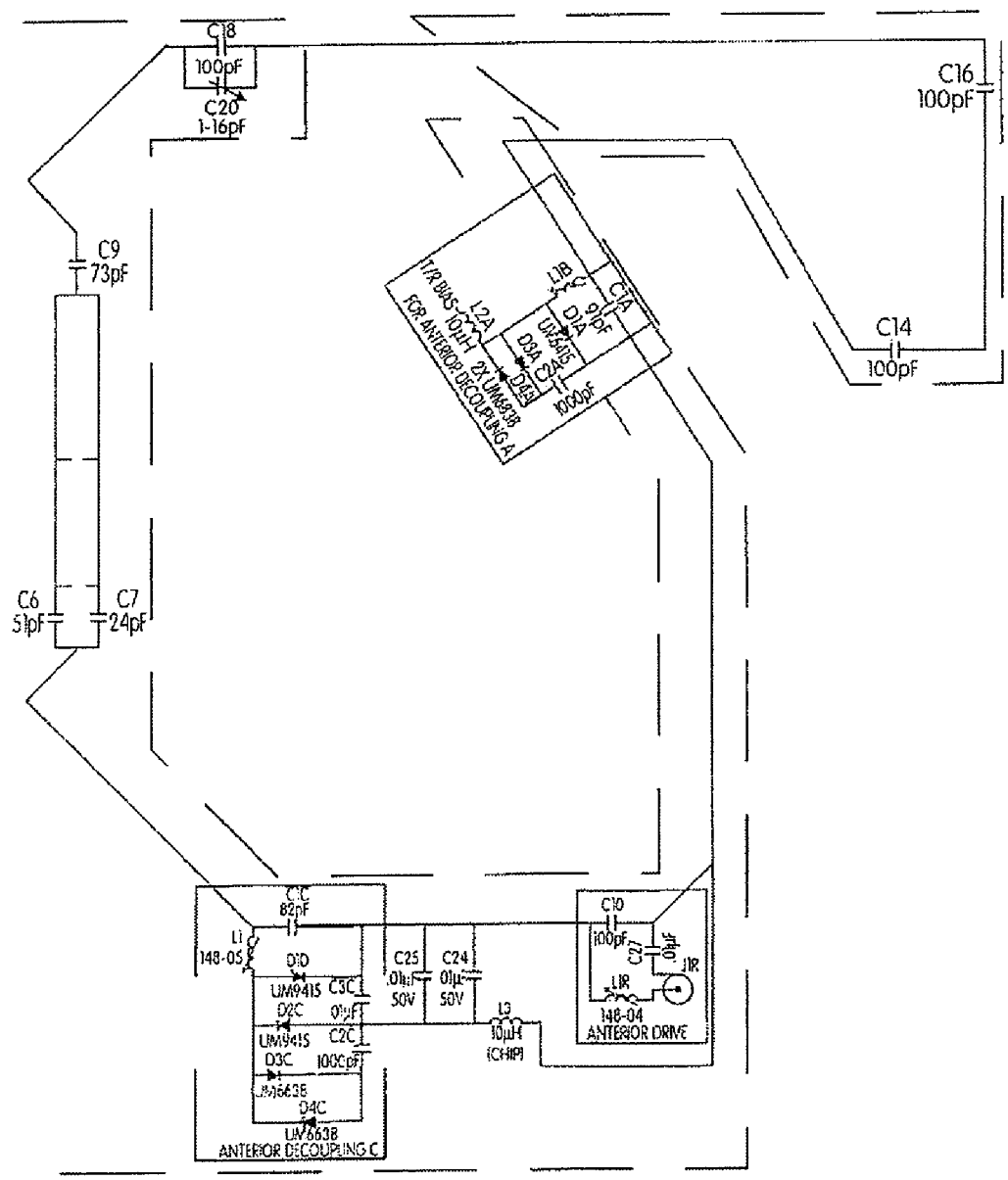
Figure 5C:
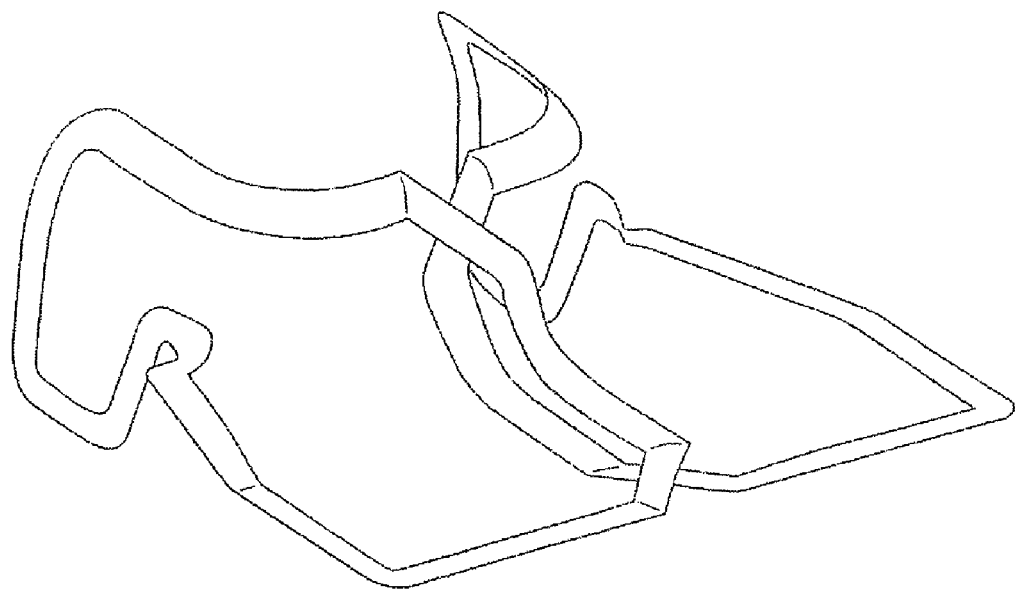
Figure 6C:
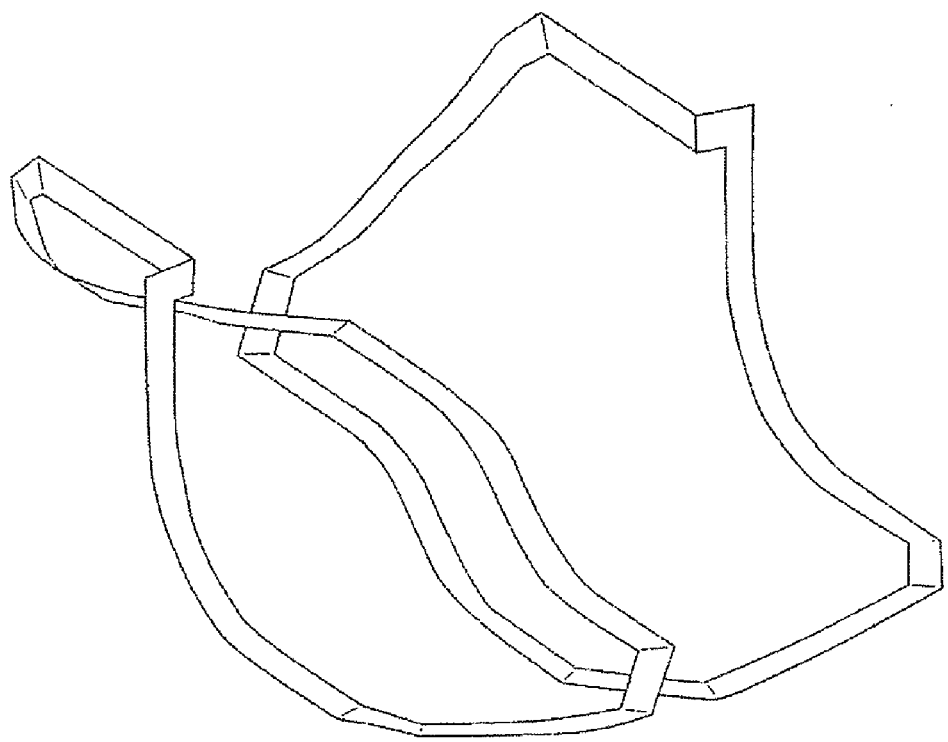
FIGS. 6A-6B and 6C illustrate a schematic diagram and a generalized model, respectively, of a posterior C-spine coil capable of being used as part of an NVA.
Figure 6A:
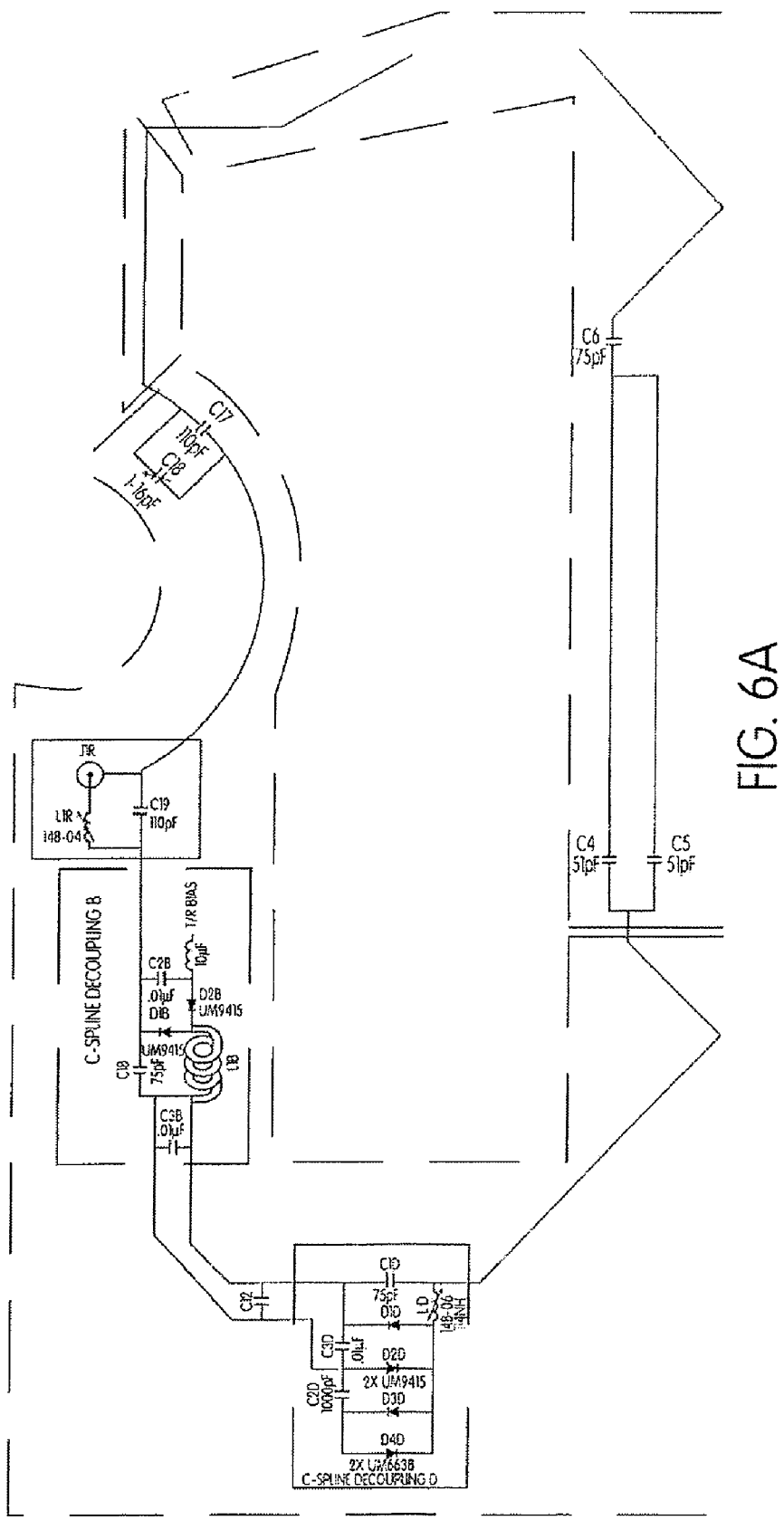
Figure 6B:
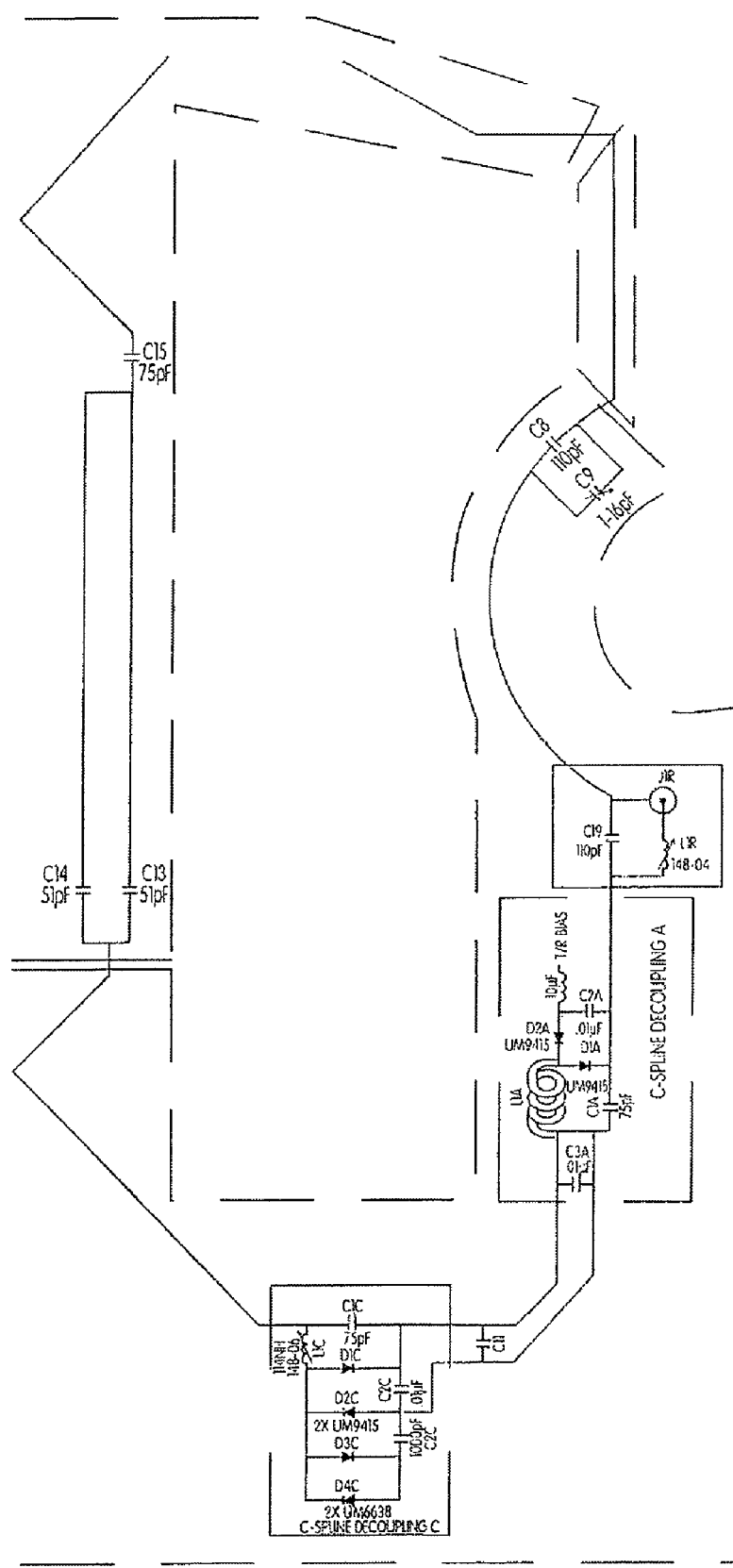
Figure 7A:
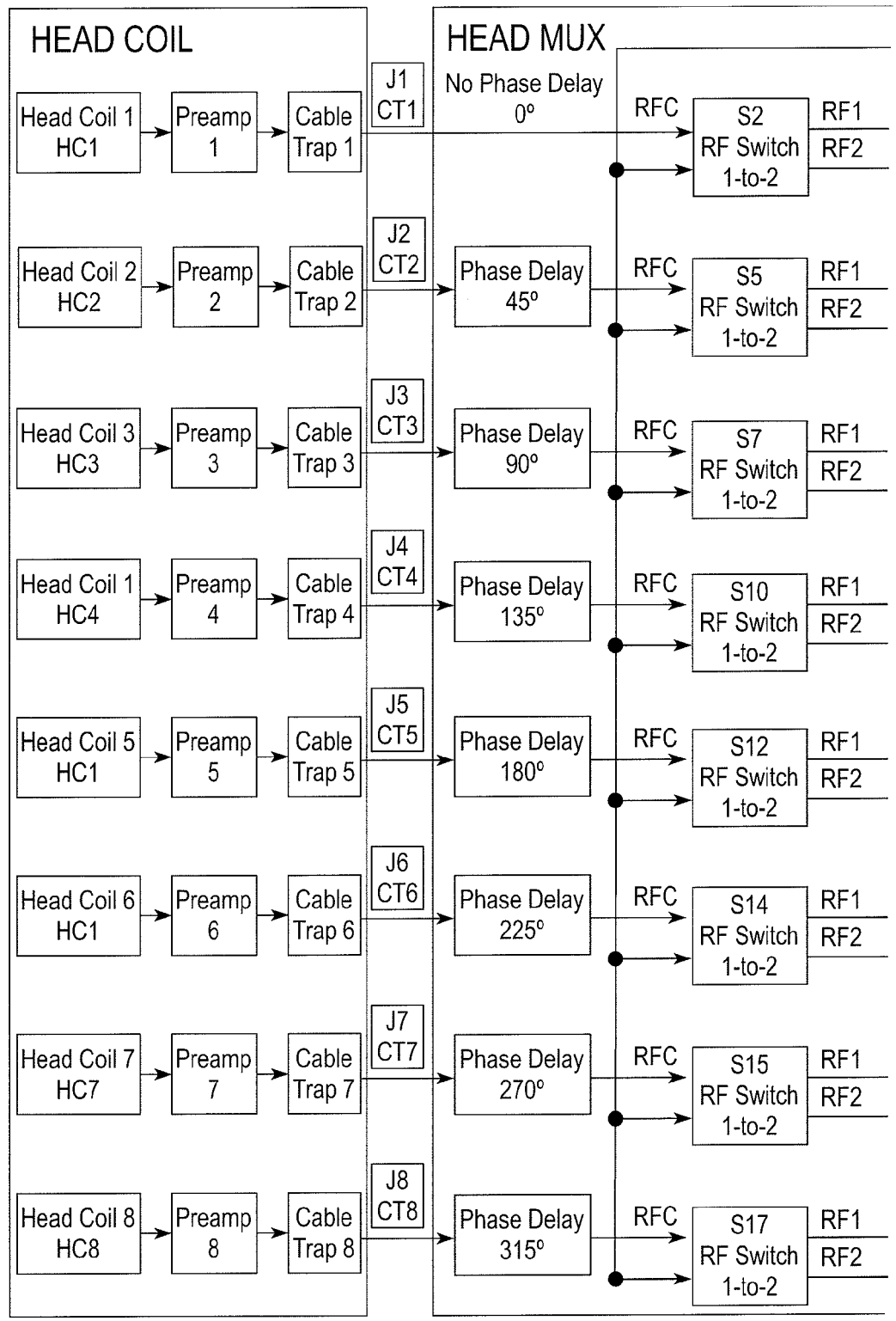
Figure 7D:
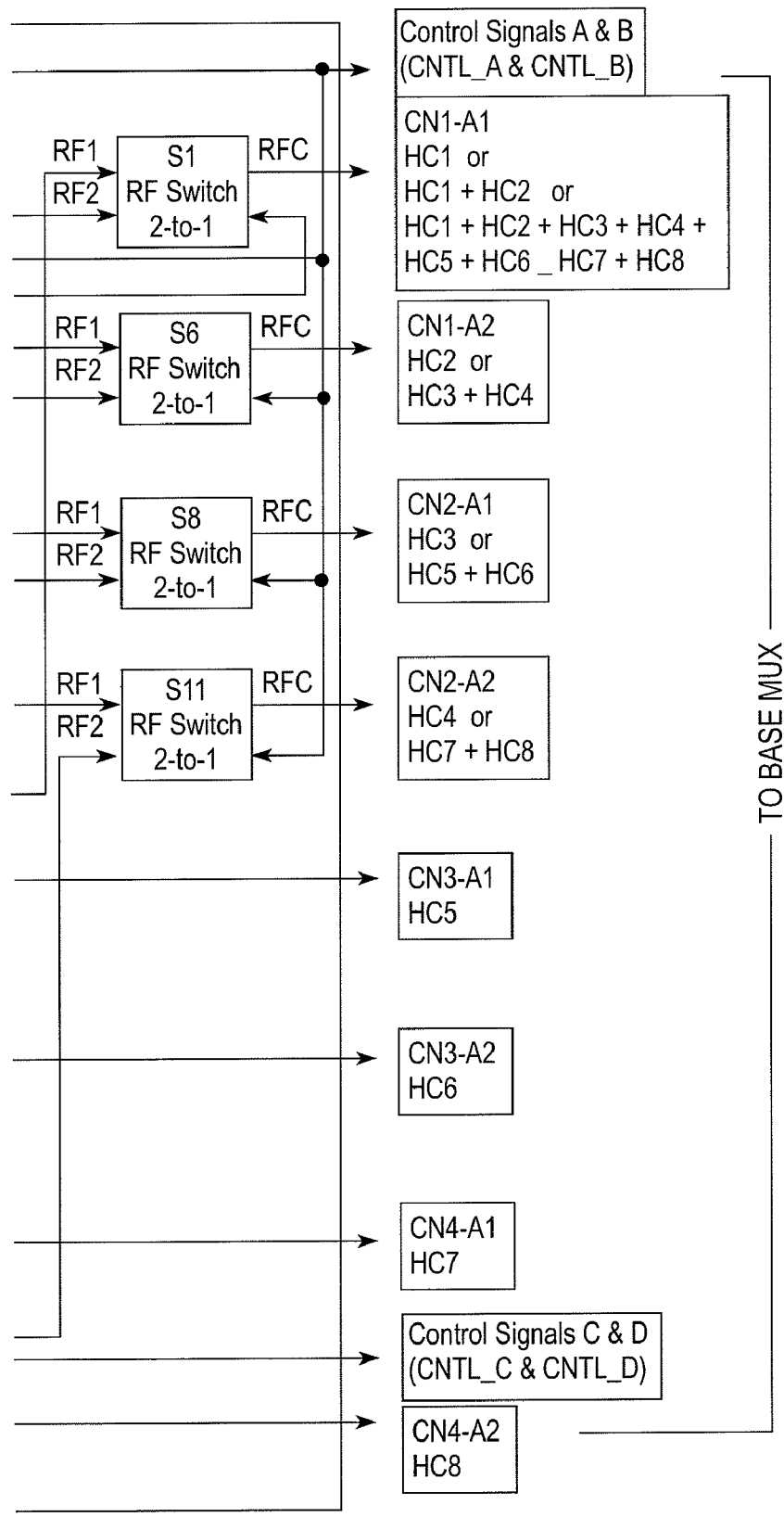

FIGS. 5A-5B and 6A-6B are schematic circuit diagrams of a preferred implementation of the anterior neck and posterior C-spine coils, respectively, of the array. FIGS. 5C and 6C show how these coils can be shaped to conform to the anterior and posterior portions of the neck and upper torso to provide coverage of the right and left lateral portions of the neck and spine. Although shown and described herein as having two (left and right) coil elements each, the anterior and posterior coils may have fewer or more coil elements. In both the anterior and posterior coils, the coil elements are preferably formed as mirror images of each other, with the capacitors distributed around each of the loops so as to minimize the detuning effects of varying patient loads on the coil. In each coil, the two loops should also be geometrically arranged so that the interaction between them is minimal. During the transmit cycle, the coil elements are decoupled from the RF energy via decoupling networks, which preferably include both active and passive decoupling circuits as shown in FIGS. 5A-5B and 6A-6B. In this preferred configuration, the NVA will therefore provide coverage from the vertex of the skull to the aortic arch, including the brain/cerebellum, the cerebral arterial circle (circle of Willis), the carotid arteries, and the brachial plexus. The quadrature phased array design of the NVA enables complete imaging of the head and the soft tissues of the neck, cervical and upper thoracic spinal regions.

FIGS. 7A-7D and 8A-8D are block diagrams of interface 2500, according to a preferred embodiment thereof, for coupling the coil elements of head coil 2000, anterior neck coil 2200 and posterior C-spine coil 2400 to the processing channels of the MR system. FIGS. 7A-7D illustrate the multiplexer 2600 for the head coil 2000 (or "head mux" part) of interface 2500. The head mux 2600 connects to the coil elements of head coil 2000 via low impedance preamplifiers, which again are preferably a part of head coil 2000, and cable traps. The head mux 2600 includes the phase delay circuits, the RF switches, the Wilkinson combiners, and the attenuators that are employed to enable head coil 2000 to operate as disclosed below. FIGS. 8A-8D illustrate the multiplexer 2700 for the anterior and posterior coils of the NVA, which is known as the "base mux." The base mux 2700 connects to the head mux 2600, through which it receives the signal currents from the Port I-VIII coil elements of head coil 2000 either individually or in some predetermined combination thereof. The base mux 2700 includes various control circuits through which interface 2500 receives and acts upon control signals received from the MR system, as well as RF switches for the anterior and posterior coils. Together, the head and base multiplexers 2600 and 2700 allow the head, anterior neck and posterior C-spine coils to operate as an NVA, and to do so in a plurality of modes.

Figure 10B:
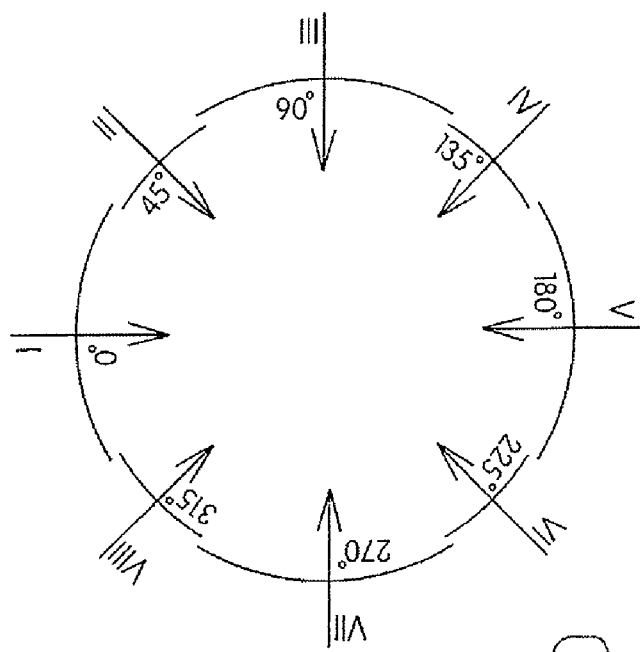
FIGS. 10A and 10B illustrate the operation of the NVA in a high resolution brain mode.
Figure 10A:
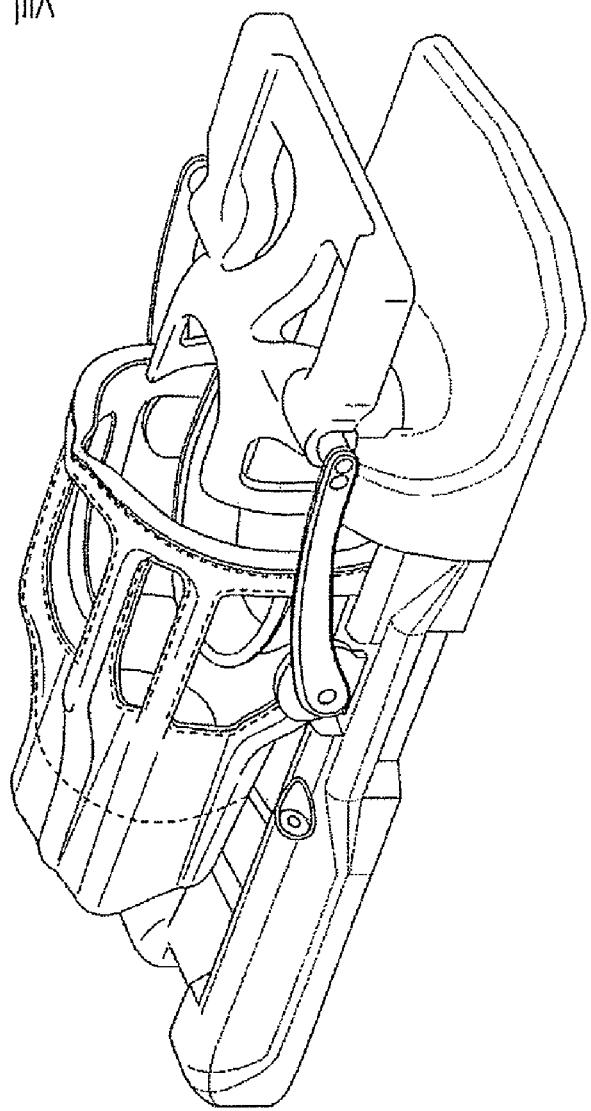

In its preferred embodiment, the NVA has twelve coil elements, eight of which from head coil 2000 and two each from the neck and C-spine coils 2200 and 2400. The interface 2500 in its preferred embodiment multiplexes these twelve outputs to the eight processing channels of the MR system, and thereby allows the NVA to operate in at least four modes. FIGS. 10A and 10B show how the NVA can operate in a high resolution brain (HRBRN8) mode. Specifically, as best shown in FIG. 10B, each of the eight coil elements of head coil 2000 would drive one of the channels of the 8-channel host MR system. The anterior neck and C-spine coils are not used.

Figure 11:
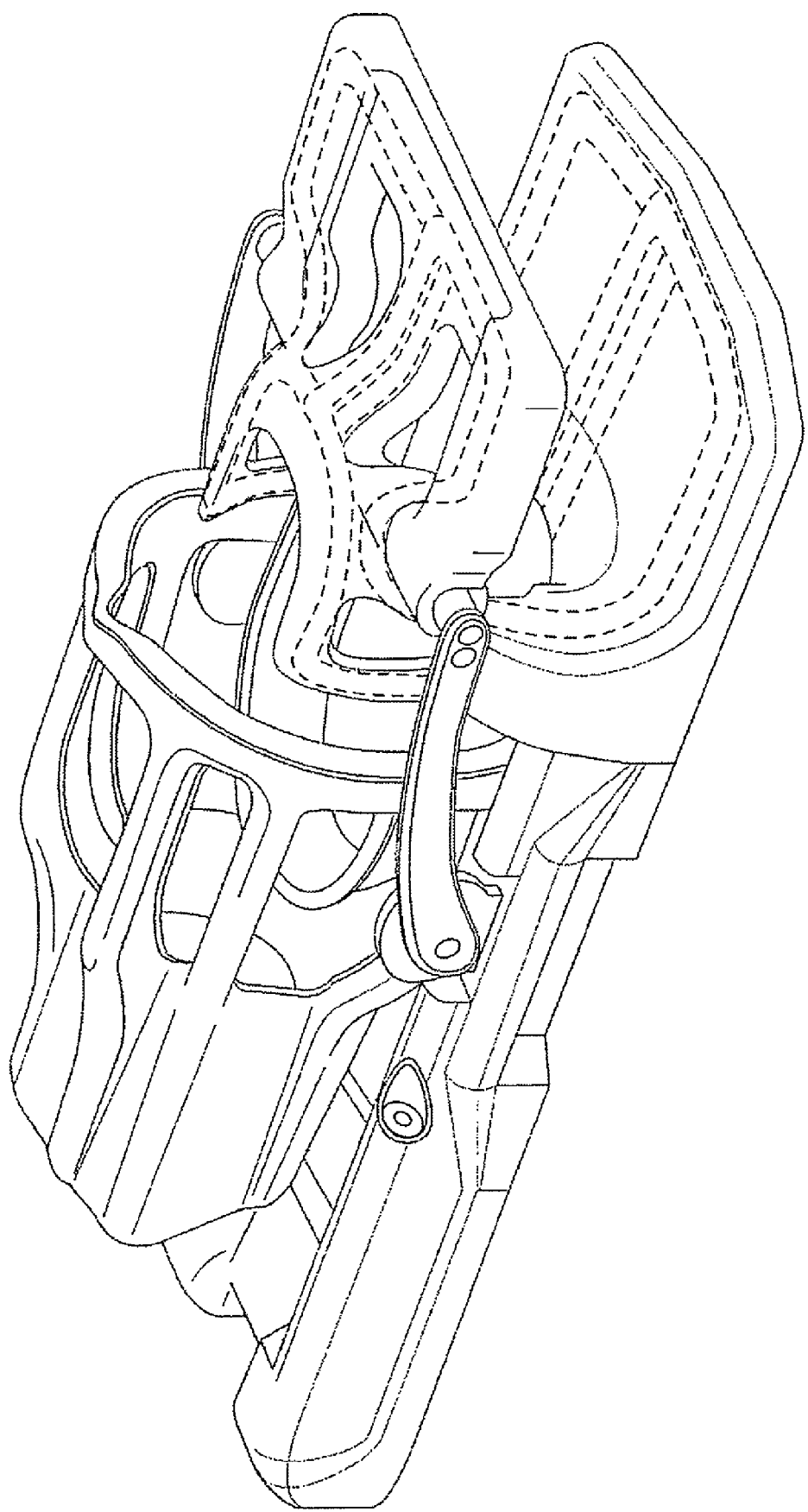
FIG. 11 illustrates the operation of the NVA in a volume neck mode.

FIG. 11 shows how the NVA can operate in a volume neck (VNECK8) mode. In this mode, all of the coil elements of head coin 2000 are biased off via interface 2500. The two coil elements of anterior neck coil 2200 each drive separate channels of the MR system, as do the coil elements of the posterior C-spine coil 2400. The other four channels are not used. As can be seen from FIGS. 9 and 15-17, the head coil section of the NVA housing may be slid to either the open position or the closed position for this mode of operation, whichever the patient deems more comfortable.

Figure 12B:
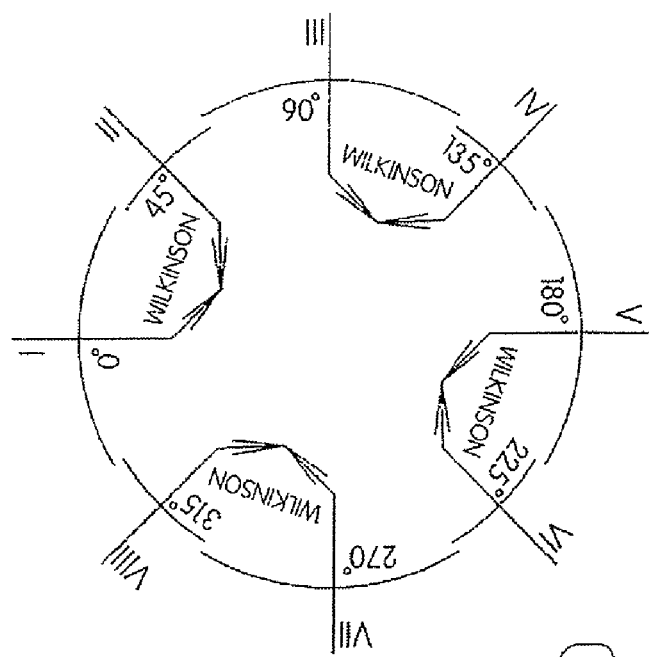
FIGS. 12A and 12B illustrate the operation of the NVA in a neurovascular phased array mode.
Figure 12A:
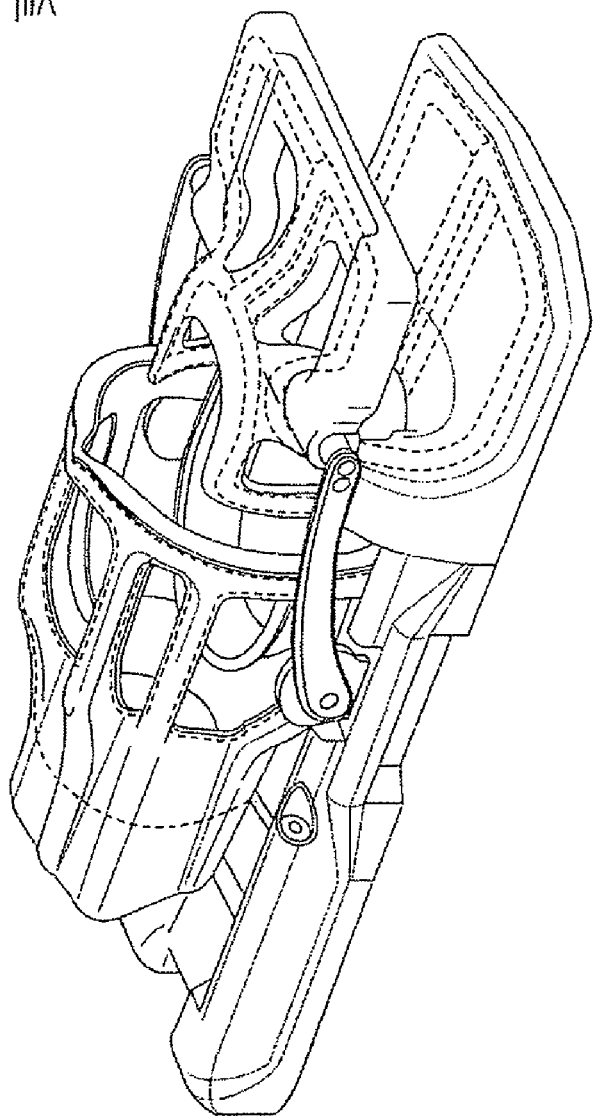

FIGS. 12A and 12B illustrate how the NVA can operate in a neurovascular phased array (NVPA8) mode. In this mode, the head coil 2000, the anterior neck coil 2200 and the C-spine coil 2400 are all used. Given that the host MR system may only have 8 channels, circuitry within interface 2500 of FIGS. 7A-7D and 8A-8D permits the outputs of the coil elements to be selectively combined. As best shown in FIG. 12B, the adjacent coil elements (i.e., Ports I & II, III & IV, V & VI and VII & VIII) of head coil 2000 are delayed at 45 degree increments and the outputs are combined via Wilkinson combiners, with each of the resulting four outputs being routed to one channel of the MR system. Each coil element of neck coil 2200 drives one channel of the MR system, as do the coil elements of the posterior C-spine coil 2400.

Figure 13B:
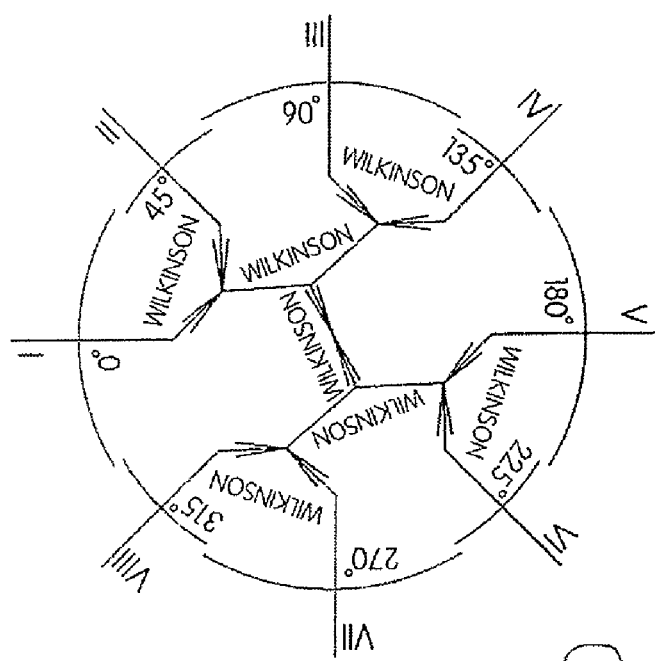
FIGS. 13A and 13B illustrate the operation of the NVA in a spectroscopy mode.
Figure 13A:
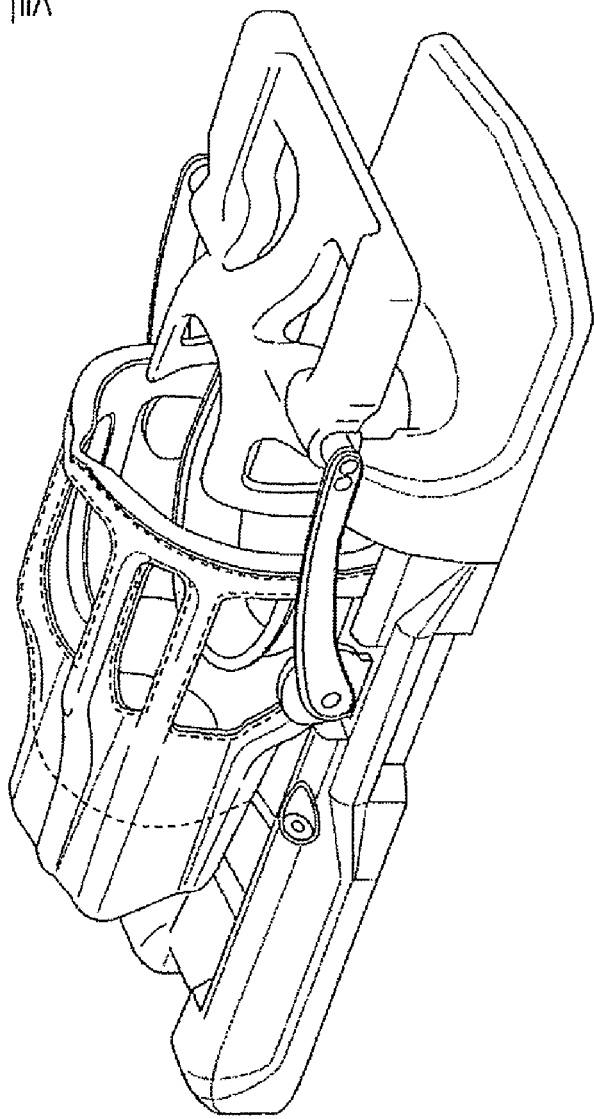

FIGS. 13A and 13B illustrate how the NVA can operate in a spectroscopy (SPECTRO8) mode. In this mode, the coil elements of the neck and C-spine coils 2200 and 2400 are biased off via interface 2500. In head coil 2000, however, the adjacent coil elements are progressively combined using an array of Wilkinson combiners, with a 45 degree phase differential between coil elements, as shown in FIG. 13B. The phase circuits, the RF switches and the Wilkinson combiners through which this progressive combination of coil elements occurs is best shown in FIGS. 7A-7D. As best shown in FIGS. 8A-8D, the single combined output is routed to one channel to enable the MR system to carry out the spectroscopic procedure. In this mode, the volume coil is thus enabled to operate as a single output device that mimics the uniformity of a conventional birdcage-type structure.

It should be apparent that the number of coil elements/primary resonant substructures in the volume coil can be varied to suit the particular use to which the volume coil will be applied. In those instances, the phase delays implemented by head mux 2600 will be adjusted to accommodate the angle between the centers of the sensitive regions of adjacent coil elements. It should also be apparent that the head coil of the invention could also be shaped in the form of cylinder, one having straight or non-tapered rods. In another alternative configuration, the head coil could still have rings 2101 and 2102 of different diameters but with straight, rather than tapered, rods interconnecting them. The tapered head coil 2000 detailed above is preferred, however, because it provides improved field homogeneity in the XZ and YZ imaging planes.

The invention also provides a method of making a volume coil for use with a parallel-imaging compatible MR system. One step of the method involves the assembly of the first and second rings with a plurality of rods electrically interconnecting them to form a birdcage-like structure. The rods and rings should be configured to produce a plurality of electrically-adjacent primary resonant substructures about the birdcage-like structure, with each substructure including two rods neighboring each other and the short segment of each of the first and second rings interconnecting them. A critical step involves isolating the primary resonant substructures from each other via the preamplifier decoupling and offset tuning schemes disclosed herein. In doing so, each primary resonant substructure will be enabled (i) to receive the MR signal from tissue within its field of view and (ii) to be operatively couplable to one processing channel of the MR system for conveyance of the MR signal received thereby (iii) while being simultaneously decoupled from the other primary resonant substructures.

In a broader aspect, the invention provides another method of making a volume coil for use with a parallel-imaging compatible MR system. One step of the method involves the assembly of the first and second rings with a plurality of rods electrically interconnecting them to form a birdcage-like structure. The rods and rings should be configured to produce a plurality of electrically-adjacent primary resonant substructures about the birdcage-like structure, with each substructure including two rods neighboring each other and the short segment of each of the first and second rings interconnecting them. In this method, an essential step involves providing each primary resonant substructure with a source impedance considerably higher than, and for creating a resonant circuit with, a load impedance to which the primary resonant substructure shall be connected. In doing so, each primary resonant substructure will be enabled to be operatively couplable to one processing channel of the MR system for conveyance of the MR signal received thereby while simultaneously being at least partially decoupled from the other primary resonant substructures.

The source impedance-load impedance interaction is preferably implemented via the preamplifier decoupling scheme disclosed herein, though it may be manifested using other circuitry to accomplish the same purpose. In the preferred implementation, each primary resonant substructure as the source impedance includes an input resonant circuit of the type heretofore described. The load impedance can then be implemented as a low impedance preamplifier. The interaction between the input resonant circuit and its preamplifier enables the primary resonant substructure to which they correspond to be operatively couplable to one processing channel of the MR system and at least partially decoupled from the other primary resonant substructures. The other primary resonant substructures of the volume coil are likewise configured.

Variations of these methods, which will become apparent to skilled artisans upon reading this document, are also contemplated by the present invention.

Figure 9:
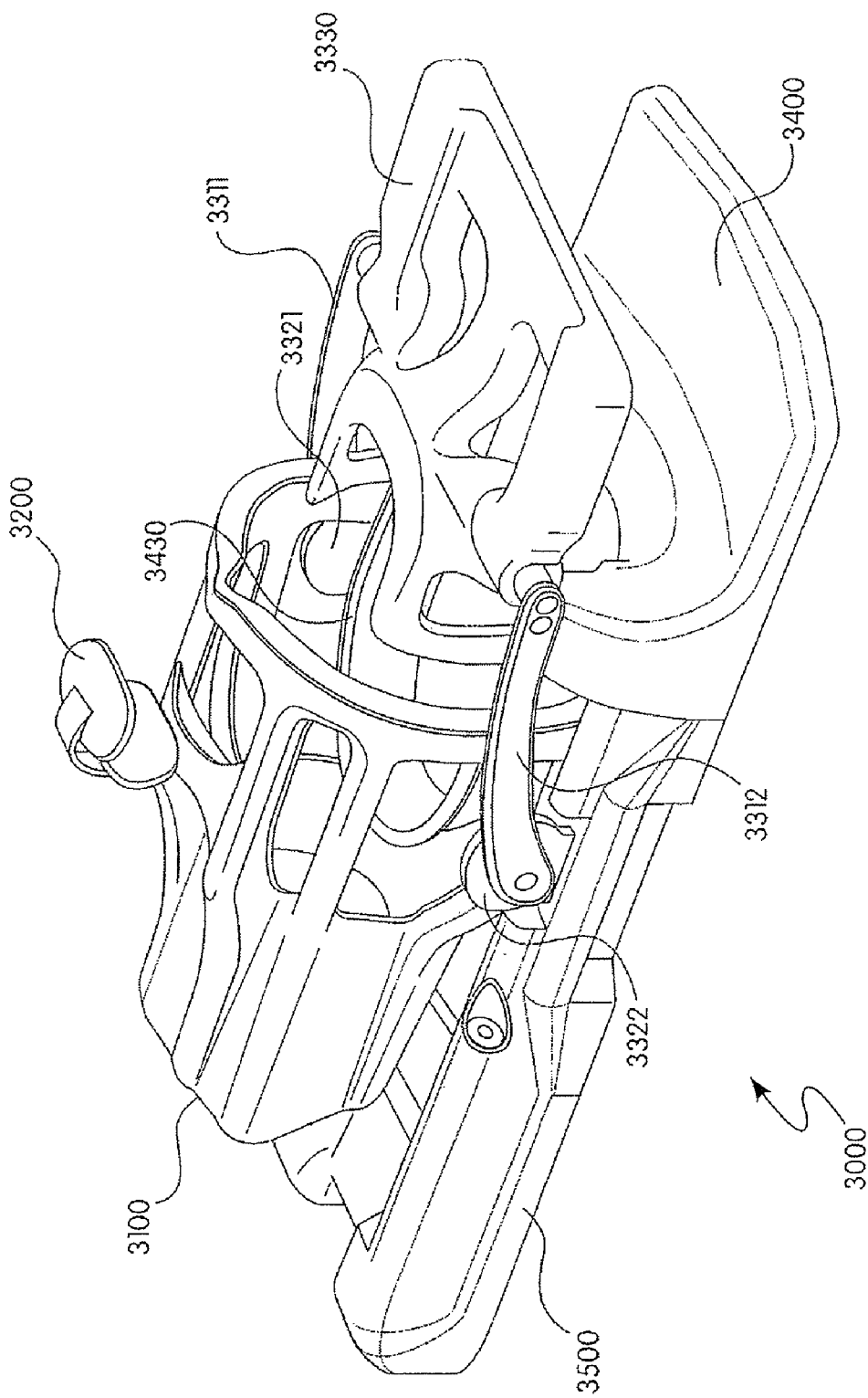
FIG. 9 is an isometric view of a preferred embodiment of a housing for the NVA, inclusive of the base section, the head coil section, the anterior neck coil section, and the posterior C-spine coil section.
Figure 14:
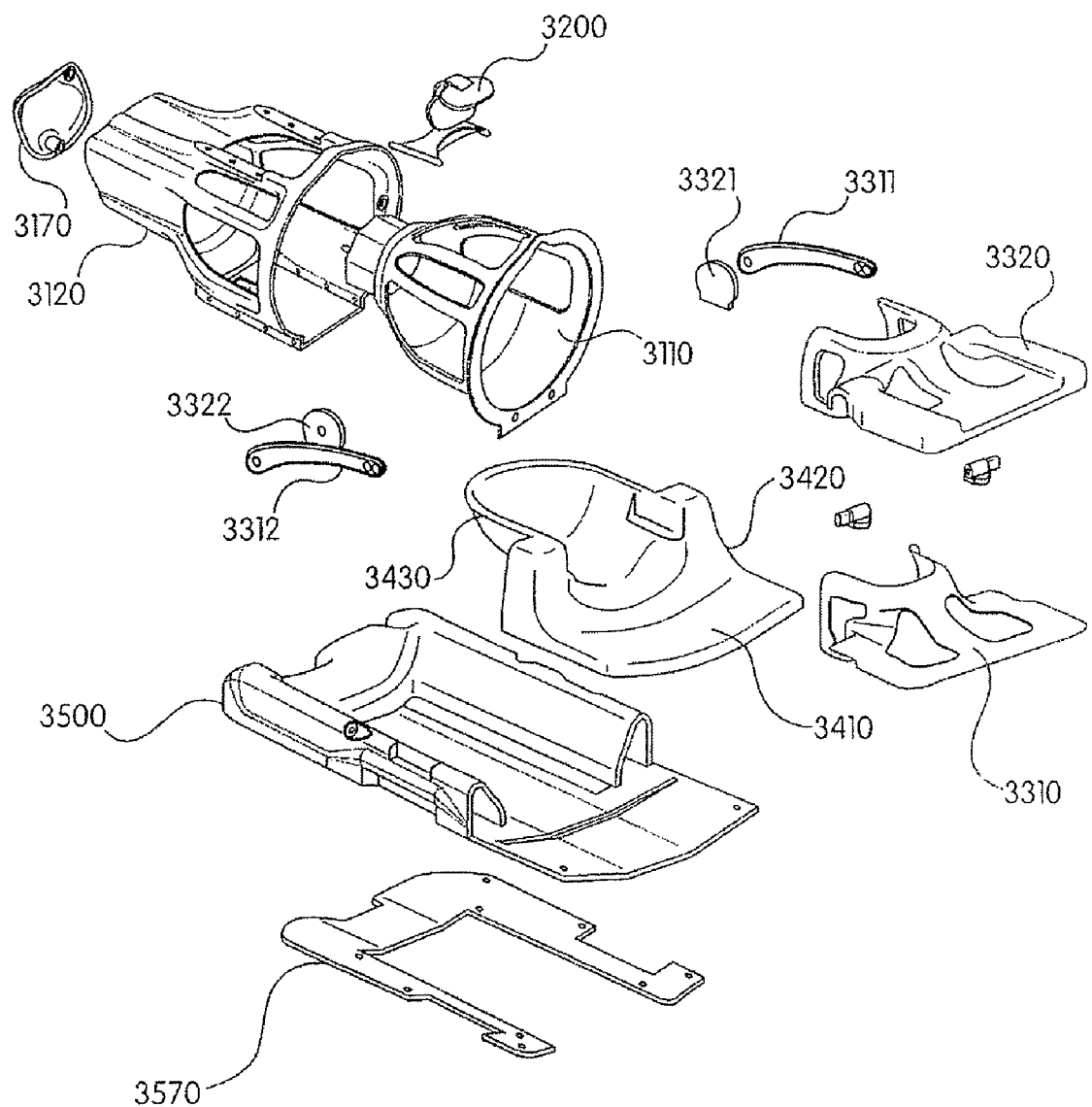
FIG. 14 is an exploded view of the NVA housing of FIG. 9.
Figure 15:
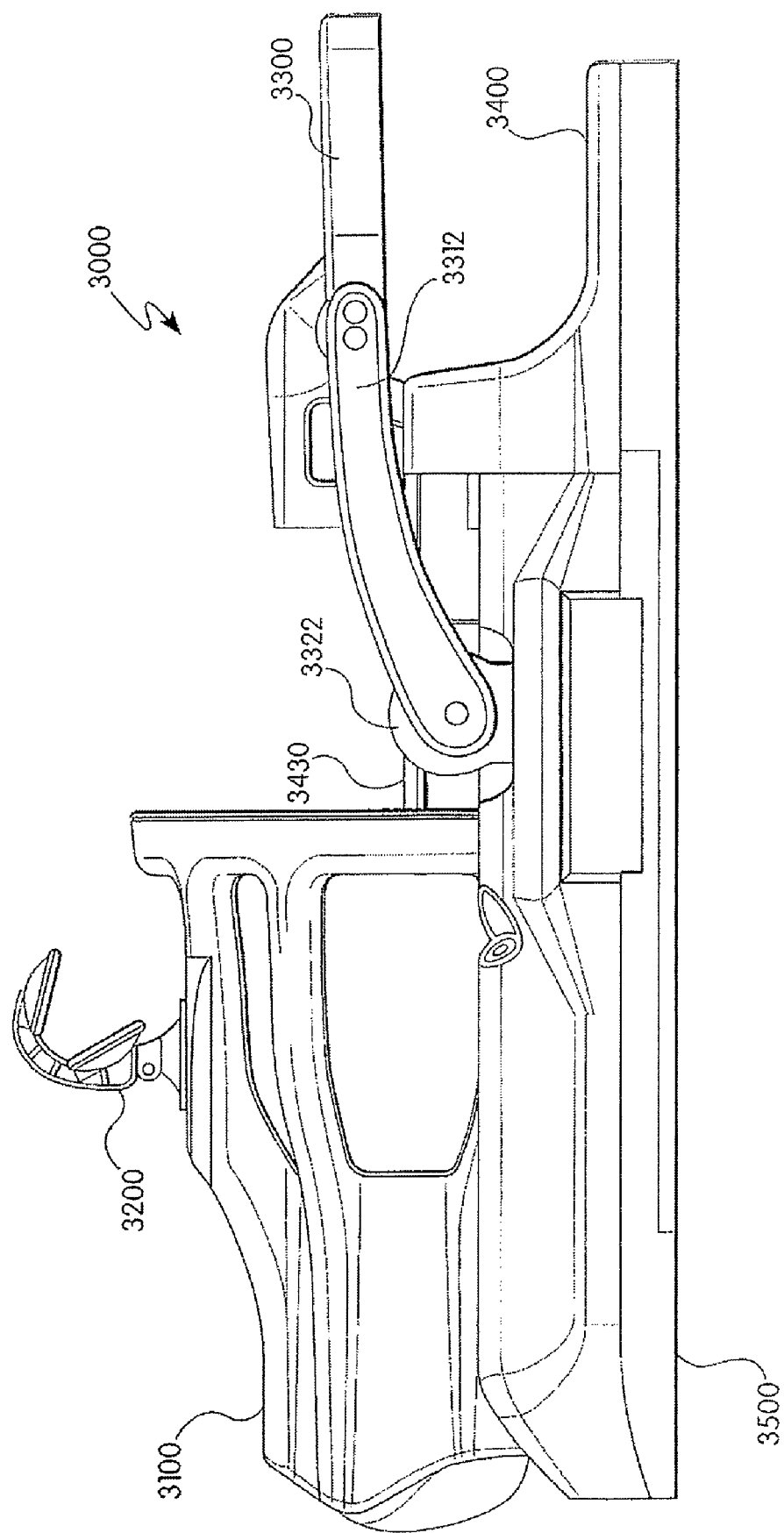
FIG. 15 is a left side view of the NVA housing of FIG. 9, which shows (i) a slidable head section thereof moved to the superiormost end (open position) and (ii) a pivotable anterior neck section thereof lowered to the fully engaged position.
Figure 16:
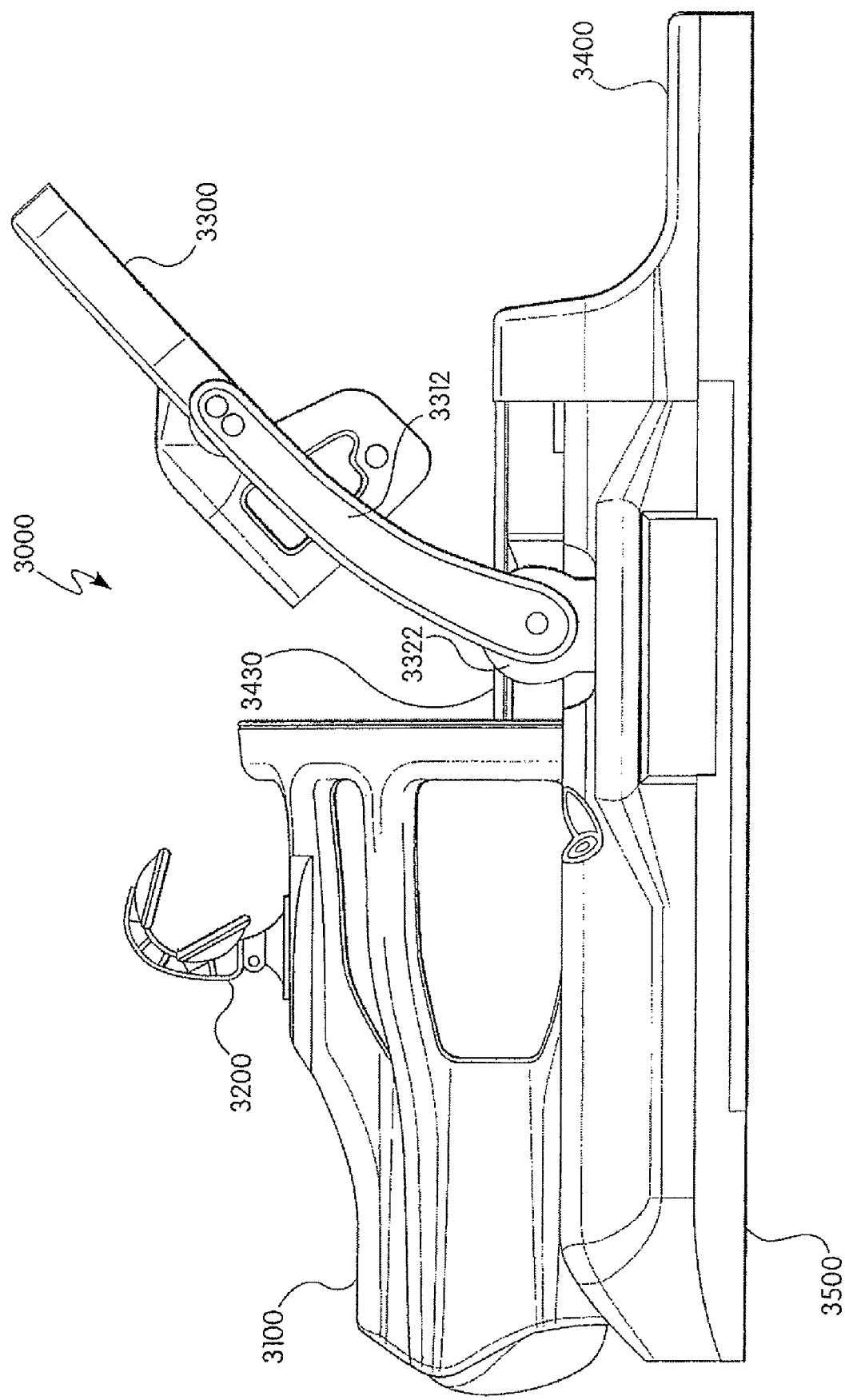
FIG. 16 is a left side view of the NVA housing of FIG. 9, which shows (i) the slidable head section thereof in the open position and (ii) the pivotable anterior section thereof in a partially upright position.
Figure 17:
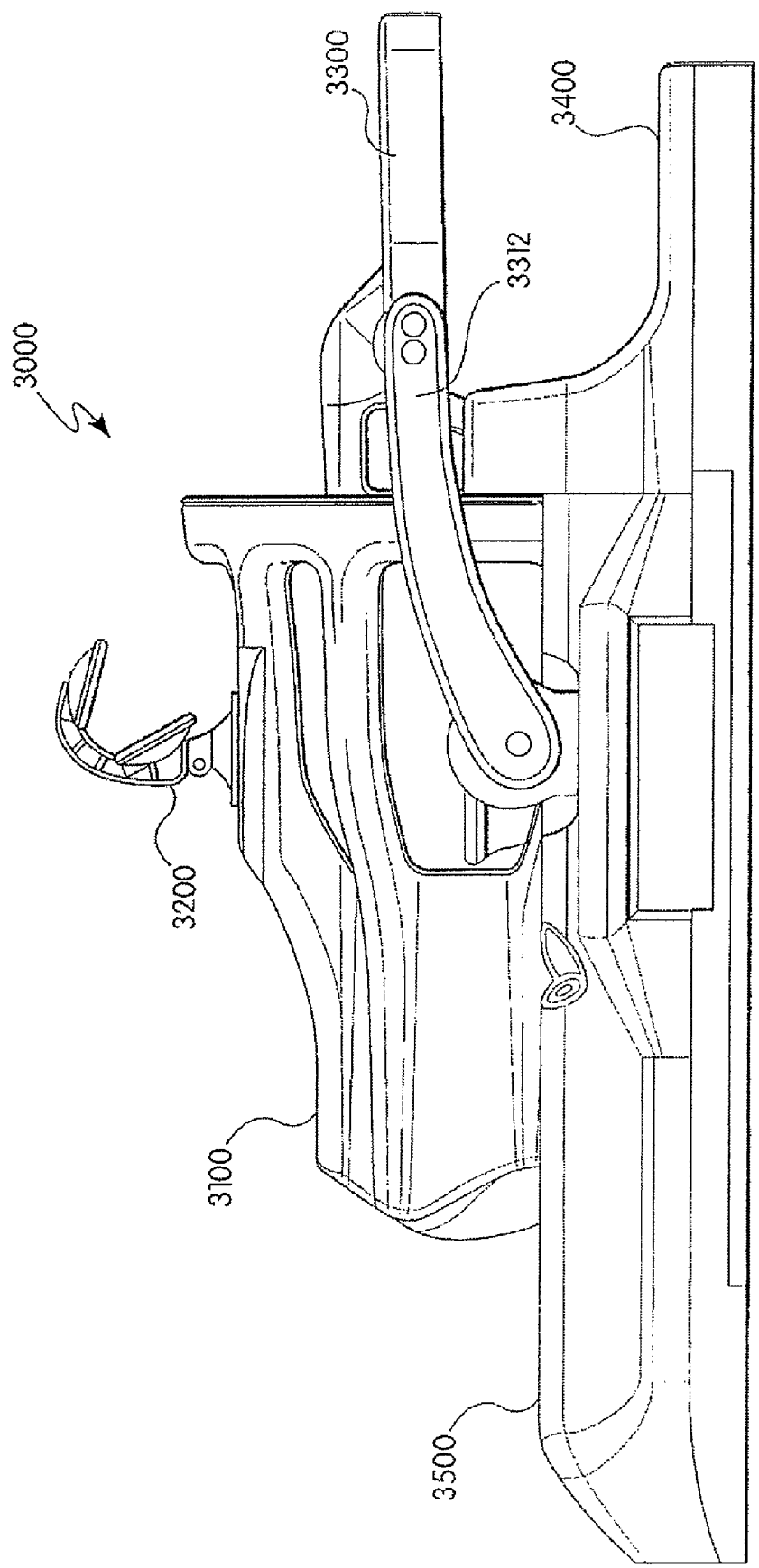
FIG. 17 is a left side view of the NVA housing of FIG. 9, which illustrates (i) the head section at the inferiormost end of its travel (i.e., closed position) and (ii) the pivotable anterior neck lowered to a fully engaged position.

FIGS. 9 and 14-19 illustrate one type of housing into which the head, neck and C-spine coils of the NVA can be incorporated. The housing, generally designated 3000, includes a head coil section 3100, an anterior neck coil section 3300, a posterior C-spine coil section 3400, and a base section 3500. More particularly, as shown in the disassembled view of FIG. 14, the housing 3000 basically includes subhousings for each of its coil sections. The head section 3100, for example, has an inner and outer subhousings 3110 and 3120 between which is secured the conductor segments and related circuitry of head coil 2000 according to the generalized model of FIG. 4C. FIGS. 9 and 14 also show the mirror assembly 3200) that connects to head section 3100. Similarly, the neck section 3300 has an inner and outer subhousings 3310 and 3320 between which is secured the conductors/circuitry of anterior neck coil 2200 according to the generalized model of FIG. 5C. The posterior C-spine section 3400 has an inner and outer subhousings 3410 and 3420 between which is secured the conductors/circuitry of the C-spine coil 2400 according to the model of FIG. 6C.

FIGS. 9 and 14 also illustrate other parts of anterior neck section 3300, for example, the paddle arms 3311 and 3312 and pivot damper assemblies 3321 and 3322. Besides allowing neck section 3300 to be pivoted between the fully engaged position shown in FIG. 15 and a partially upright position shown in FIG. 16, the pivot assemblies 3321 and 3322 each feature a dampening means by which the paddle arms 3311 and 3312, and the rest of neck section 3300 therewith, may be positioned at any point along their range of movement from and in between the fully upright position (not shown) and the fully engaged position. The pivot assemblies 3321 and 3322 both mount to base section 3500 but on opposite sides of the head rest 3430 that extends from C-spine section 2400, as best shown in FIG. 9.

Figure 18:
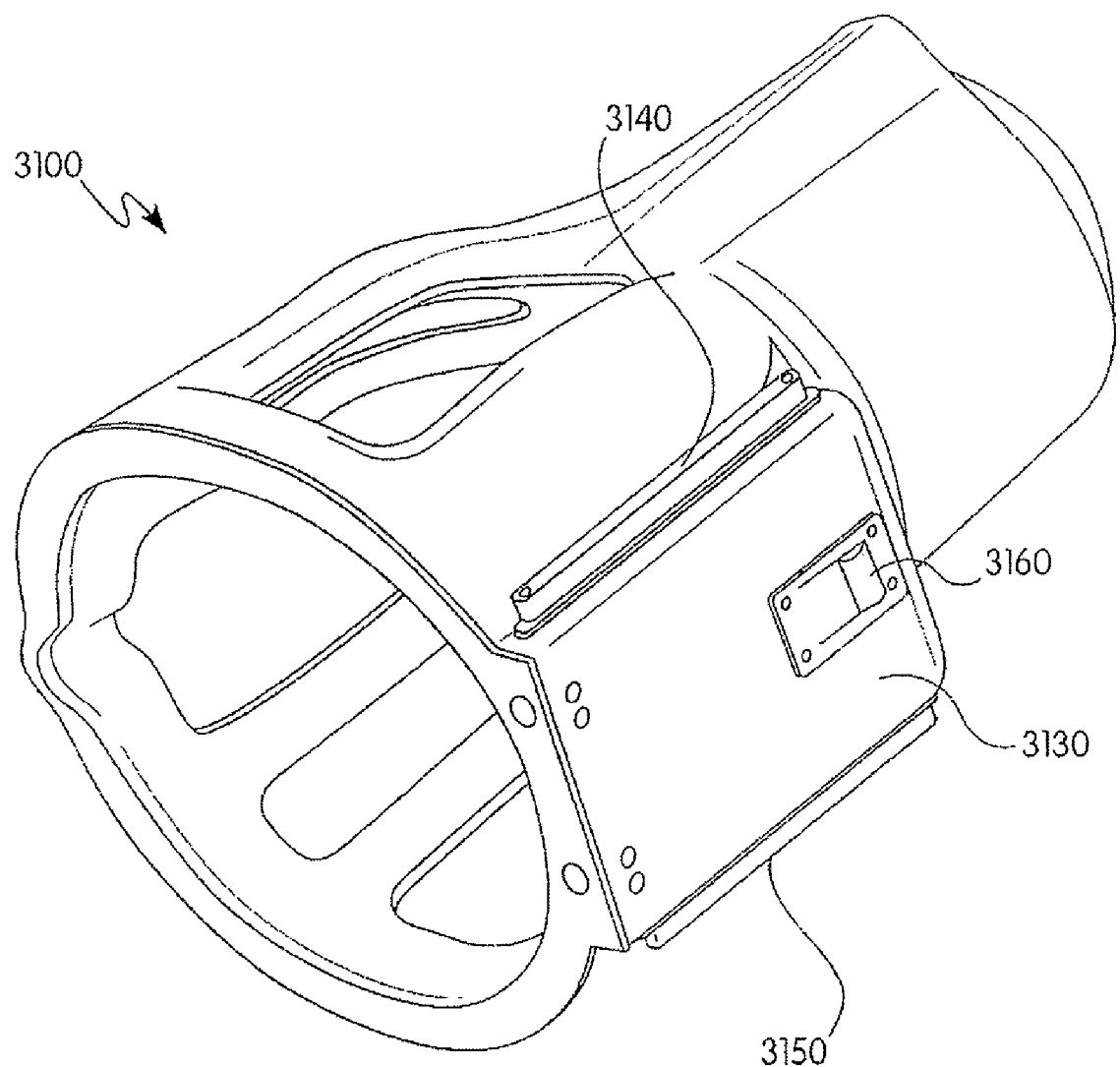
FIG. 18 is a bottom isometric view of the head section showing the mechanical detent and the elongated slides of the slide and guide rail assembly.
Figure 19:
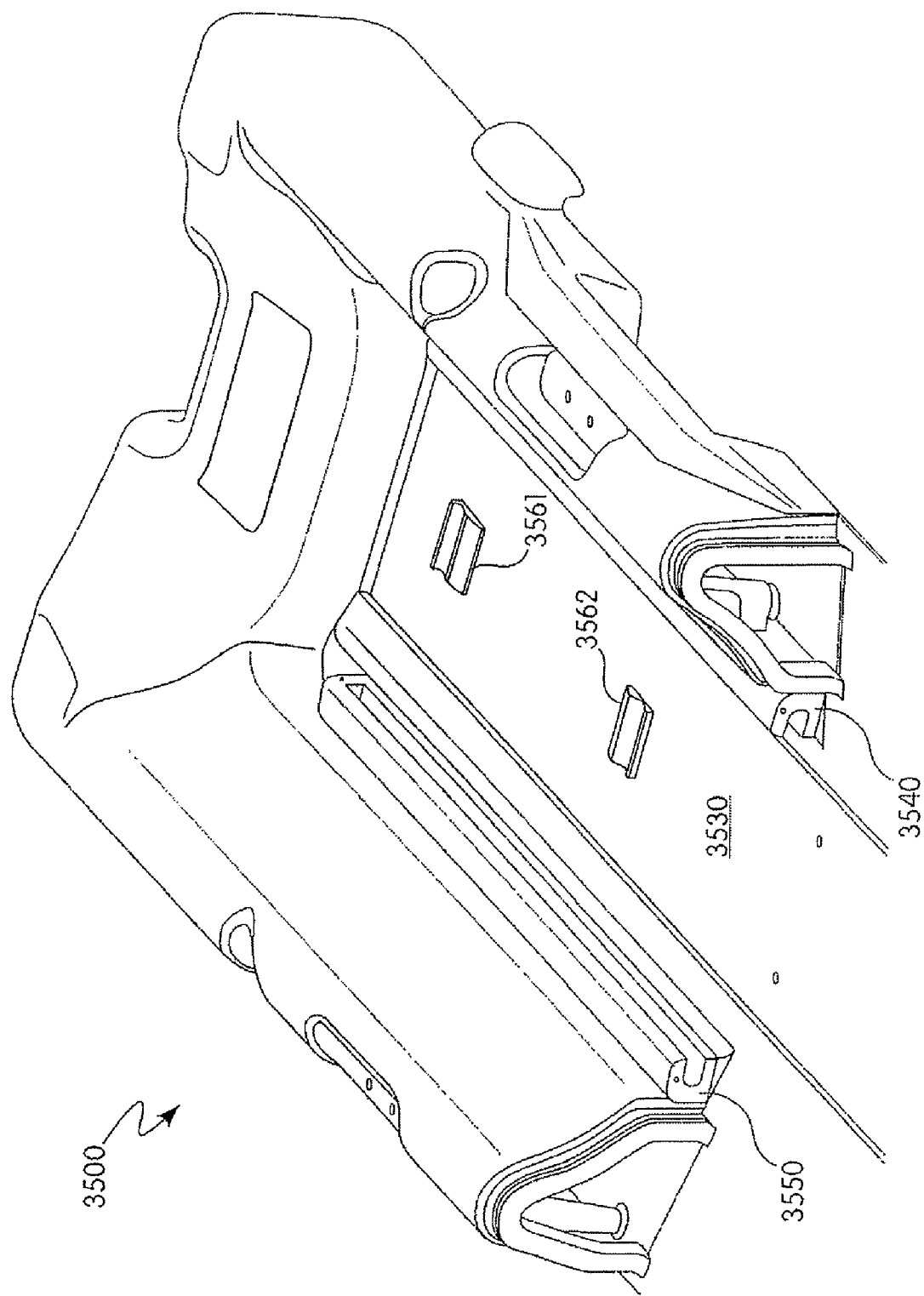
FIG. 19 is a top isometric view of the base section showing the mechanical stops and the C-shaped guide rails of the slide and guide rail assembly.

The head and C-spine sections also attach to the base section 3500. As illustrated in FIGS. 9 and 14-19, the C-spine section 3400 is fixed atop the inferior portion of base section 3500. The head section 3100, however, is slideably attached atop the superior portion by means of a slide and guide rail assembly. Specifically, on the bottom of head section 3100, there is a flat portion 3130 as best shown in FIG. 18. On each side of flat portion 3130 there is secured one of two elongated slides 3140 and 3150, both of which aligned in the inferior-superior direction. In addition, on the bottom surface of flat portion 3130 is a detent 3160. Recessed within base section 3500, as shown in FIG. 19, is a flat section 3530 whose dimensions accommodate the flat portion 3130 of head section 3100. Flanking the flat section 3530 are two C-shaped guide rails 3540 and 3550. On the top surface of flat section 3530 are two stops 3561 and 3562, which are spaced a preset distance apart in the inferior-superior direction.

With the housing 3000 fully assembled as shown in FIG. 9, the elongated slides 3140 and 3150 of head section 3100 are designed to fit snugly within the C-shaped guide rails 3540 and 3550 of base section 3500. The head section 3100 is then capable of being slid between the open (or superiormost) position shown in FIGS. 15-16 and the closed (or inferiormost) position shown in FIG. 17. When head section 3100 is placed in the open position, the mechanical detent 3160 on its underside will catch within the mechanical stop 3561 at the superior end of base section 3500. Similarly, when head section 3100 is moved to the closed position, the mechanical detent 3160 on its underside will secure within mechanical stop 3562. During the high resolution brain, neurovascular phased array and spectroscopy modes of operation, the head coil section 3100 must be situated in the closed position. In the volume neck mode, however, in which head coil 2000 is deactivated, the head coil section 3100 may be moved to either the open position or the closed position, whichever the patient deems more comfortable.

The NVA housing 3000 has thus been designed to facilitate use by the technologist/operator and to improve the comfort of the patient. Housing 3000 is lightweight and has an ergonomic design. During those operational modes in which head coil 2000 is not used, the head coil section 3100 can be slid away from the patient while the anterior neck and/or posterior C-spine coils 2200 and 2400 are used. Although mechanically present during such procedures, the head coil 2100 is electrically disabled and invisible to the MR system. This unique open architecture, along with the spacing of the rods, tends to minimize claustrophobic reactions. This is quite advantageous for the volume neck mode in which only soft tissues of the neck, cervical and upper thoracic spinal regions are imaged.

Other features illustrated in FIG. 14 include an access cover 3170 for the superior end of head section 3100 for covering the apex of head coil 2000 to allow access to the electronics of head mux 2600. Also shown is a cover 3570 for the bottom of base section 3500, which is used to protect other electronics (e.g., the base mux 2700) that may housed within the base section 3500.

The presently preferred and alternative embodiments for carrying out the invention have been set forth in detail according to the Patent Act. Persons of ordinary skill in the art to which this invention pertains may nevertheless recognize alternative ways of practicing the invention without departing from the spirit of the following claims. Consequently, all changes and variations which fall within the literal meaning, and range of equivalency, of the claims are to be embraced within their scope. Persons of such skill will also recognize that the scope of the invention is indicated by the claims rather than by any particular example or embodiment discussed or illustrated in the foregoing description.

Accordingly, to promote the progress of science and useful arts, we secure by Letters Patent exclusive rights to all subject matter embraced by the following claims for the time prescribed by the Patent Act.

What is claimed is:

1. A neurovascular array configured for use with a magnetic resonance (MR) system capable of parallel-imaging via a plurality of processing channels, the neurovascular array comprising:
   (a) a head coil having:
      (I) a first electrically conductive ring,
      (II) a second electrically conductive ring, and
      (III) a plurality of rods electrically interconnecting said first and said second rings in order to form a birdcage-like structure therewith,
   wherein said rods and said first and said second rings are configured to produce a plurality of electrically-adjacent primary resonant substructures about the birdcage-like structure, with each of said primary resonant substructures:
      (A) constituting a coil element including two of said rods neighboring each other and a corresponding short segment of each of said first and said second rings interconnecting them while electrically sharing one of said rods with each of its neighboring primary resonant substructures, so that each of said primary resonant substructures is enabled to receive magnetic resonance signals from tissue within a separate field of view thereof, and
      (B) providing a source impedance considerably higher than a load impedance to which said primary resonant substructure connects creating a resonant circuit therewith so as to enable said primary resonant substructure (i) to be operatively couplable to one processing channel of the MR system for conveyance of the magnetic resonance signals received thereby (ii) while simultaneously being at least partially decoupled from the other of said primary resonant substructures of said head coil;
   (b) an anterior coil having in proximity to said head coil at least one other coil element configured for receiving magnetic resonance signals from tissue within a separate field of view thereof;
   (c) a posterior coil having in proximity to said head coil at least one other coil element configured for receiving magnetic resonance signals from tissue within a separate field of view thereof; and
   (d) an interface configured for enabling said coil elements of said head coil, said anterior coil and said posterior coil to be selectively interconnected to the processing channels of the MR system so that the neurovascular array is selectively operable in a plurality of modes.

2. The neurovascular array of claim 1 wherein said plurality of modes includes a neurovascular phased array mode in which said interface enables:
   (a) each pair of said coil elements of said head coil to be interconnected with a separate one of the processing channels of the MR system; and
   (b) each of said other coil elements of said anterior and said posterior coils to be interconnected with a separate one of the processing channels of the MR system.

3. The neurovascular array of claim 2 wherein said head coil has eight of said coil elements and said anterior and said posterior coils each have two of said other coil elements, configured for use with the MR system equipped with at least eight of the processing channels.

4. The neurovascular array of claim 1 wherein said plurality of modes includes a high resolution brain mode in which said interface enables each of said coil elements of said head coil to be interconnected with a separate one of the processing channels of the MR system.

5. The neurovascular array of claim 1 wherein said plurality of modes includes a volume neck mode in which said interface enables each of said other coil elements of said anterior and said posterior coils to be interconnected with a separate one of the processing channels of the MR system.

6. The neurovascular array of claim 1 wherein said plurality of modes includes a spectroscopy mode in which said interface enables all of said coil elements of said head coil to be interconnected with a single one of the processing channels of the MR system.

7. The neurovascular array of claim 1 wherein said interface is capable of enabling said neurovascular array to be selectively operated in said plurality of modes when said coil elements of said head coil, said anterior coil and said posterior coil are greater in number than the processing channels of the MR system.

8. The neurovascular array of claim 1 wherein each of said primary resonant substructures as said source impedance includes an input resonant circuit configured for enabling said primary resonant substructure via a low impedance preamplifier as said load impedance to be
   (i) operatively couplable to one processing channel of the MR system and
   (ii) at least partially decoupled from the other of said primary resonant substructures.

9. The neurovascular array of claim 8 wherein said low impedance preamplifiers are provided as part of the neurovascular array.

10. The neurovascular array of claim 8 wherein each of said low impedance preamplifiers is provided with one of the processing channels of the MR system.

11. The neurovascular array of claim 8 wherein each of said primary resonant substructures has said input resonant circuit corresponding thereto located in one of said short segment of said second ring thereof and said short segment of said first ring thereof.

12. The neurovascular array of claim 1 wherein each of said primary resonant substructures further includes at least one of:
   (a) a tuning circuit in at least one of said rods thereof;
   (b) a tuning circuit in said short segment thereof of said first ring; and
   (c) a tuning circuit in said short segment thereof of said second ring;
   configured for enabling said head coil to be tuned according to an offset tuning scheme through which each of said primary resonant substructures is (i) further decoupled from the other of said primary resonant substructures and (ii) still enabled to resonate at an operating frequency of said head coil and thus receive the magnetic resonance signals.

13. The neurovascular array of claim 8 wherein each of said primary resonant substructures further includes at least one of:
   (a) a tuning circuit in at least one of said rods thereof;
   (b) a tuning circuit in said short segment thereof of said first ring; and
   (c) a tuning circuit in said short segment thereof of said second ring;
   configured for enabling said head coil to be tuned according to an offset tuning scheme through which each of said primary resonant substructures is (i) further decoupled from the other of said primary resonant substructures and (ii) still enabled to resonate at an operating frequency of said head coil and thus receive the magnetic resonance signals.

14. The neurovascular array of claim 1 wherein said second ring of said head coil has a diameter that is smaller than that of said first ring of said head coil.

15. The neurovascular array of claim 1 wherein said plurality of electrically-adjacent primary resonant substructures of said head coil is eight in number, with each being generally deployed 45 degrees apart from its neighbor.

16. The neurovascular array of claim 15 wherein:
   (a) a first group of four of said primary resonant substructures have said rods thereof spaced approximately 60 degrees apart in each of said primary resonant substructures; and
   (b) a second group of four of said primary resonant substructures have said rods thereof spaced approximately 30 degrees apart in each of said primary resonant substructures;
   with said primary resonant substructures of said first and said second groups being deployed in alternating fashion.

17. The neurovascular array of claim 1 wherein said primary resonant substructures of said head coil are deployed generally symmetrically about the birdcage-like structure.

18. The neurovascular array of claim 1 wherein selected ones of said rods of said head coil are spaced at irregular distances from adjacent ones of said rods.

19. The neurovascular array of claim 1 wherein each of said rods includes a decoupling network therein for decoupling said head coil from a radio frequency transmit field of the MR system during a transmit cycle thereof.

20. The neurovascular array of claim 19 wherein each of said decoupling networks includes an active decoupling circuit and a passive decoupling circuit.

21. A volume coil configured for use with a parallel-imaging compatible magnetic resonance (MR) system, the volume coil comprising:
   (a) a first electrically conductive ring;
   (b) a second electrically conductive ring;
   (c) a plurality of rods electrically interconnecting said first and said second rings in order to form a birdcage-like structure therewith;
   wherein said rods and said first and said second rings are configured to produce a plurality of electrically-adjacent primary resonant substructures about the birdcage-like structure, with each of said primary resonant substructures including two of said rods neighboring each other and a corresponding short segment of each of said first and said second tings interconnecting them while electrically sharing one of said rods with each of its neighboring primary resonant substructures, so that each of said primary resonant substructures is enabled to receive magnetic resonance signals from tissue within a separate field of view thereof; and
   (d) each of said primary resonant substructures having a source impedance considerably higher than a load impedance to which said primary resonant substructure connects creating a resonant circuit therewith so as to enable said primary resonant substructure (i) to be operatively couplable to one processing channel of the MR system in order to convey the magnetic resonance signals received thereby (ii) while simultaneously being at least partially decoupled from the other of said primary resonant substructures of the volume coil.

22. The volume coil of claim 21 wherein each of said primary resonant substructures as said source impedance includes an input resonant circuit configured for enabling said primary resonant substructure via a low impedance preamplifier as said load impedance to be (i) operatively couplable to one processing channel of the MR system and (ii) at least partially decoupled from the other of said primary resonant substructures.

23. The volume coil of claim 22 wherein said low impedance preamplifiers are provided as part of the volume coil.

24. The volume coil of claim 22 wherein each of said low impedance preamplifiers is provided with one of the processing channels of the MR system.

25. The volume coil of claim 22 wherein each of said primary resonant substructures has said input resonant circuit corresponding thereto located in one of said short segment of said second ring thereof and said short segment of said first ring thereof.

26. The volume coil of claim 21 wherein each of said primary resonant substructures further includes at least one of:

(a) a tuning circuit in at least one of said rods thereof;
(b) a tuning circuit in said short segment thereof of said first ring; and
(c) a tuning circuit in said short segment thereof of said second ring;
configured for enabling the volume coil to be tuned according to an offset tuning scheme through which each of said primary resonant substructures is (i) further decoupled from the other of said primary resonant substructures and (ii) still enabled to resonate at an operating frequency of the volume coil and thus receive the magnetic resonance signals.

27. The volume coil of claim 22 wherein each of said primary resonant substructures further includes at least one of:
(a) a tuning circuit in at least one of said rods thereof;
(b) a tuning circuit in said short segment thereof of said first ring; and
(c) a tuning circuit in said short segment thereof of said second ring;
configured for enabling the volume coil to be tuned according to an offset tuning scheme through which each of said primary resonant substructures is (i) further decoupled from the other of said primary resonant substructures and (ii) still enabled to resonate at an operating frequency of the volume coil and thus receive the magnetic resonance signals.

28. The volume coil of claim 21 further including a combiner circuit for combining the magnetic resonance signals received by one of said primary resonant substructures with those received by at least one other of said primary resonant substructures and operatively coupling the magnetic resonance signals to one processing channel of the MR system.

29. The volume coil of claim 21 wherein said second ring has a diameter that is smaller than that of said first ring.

30. The volume coil of claim 29 wherein each of said rods has a linear portion and a tapered portion with said linear portion being connected to said first ring and said tapered portion being connected to said second ring.

31. The volume coil of claim 21 wherein said second ring has a diameter that is equal to that of said first ring.

32. The volume coil of claim 21 wherein said first and said second rings are one of circular and elliptical.

33. The volume coil of claim 21 wherein said plurality of electrically-adjacent primary resonant substructures is eight in number, with each being generally deployed 45 degrees apart from its neighbor.

34. The volume coil of claim 33 wherein:
(a) a first group of four of said primary resonant substructures have said rods thereof spaced approximately 60 degrees apart in each of said primary resonant substructures; and
(b) a second group of four of said primary resonant substructures have said rods thereof spaced approximately 30 degrees apart in each of said primary resonant substructures;
with said primary resonant substructures of said first and said second groups being deployed in alternating fashion.

35. The volume coil of claim 21 wherein said primary resonant substructures are deployed generally symmetrically about the birdcage-like structure.

36. The volume coil of claim 21 wherein selected ones of said rods are spaced at irregular distances from adjacent ones of said rods.

37. The volume coil of claim 21 wherein each of said rods includes a decoupling network therein for decoupling the volume coil from a radio frequency transmit field of the MR system during a transmit cycle thereof.

38. The volume coil of claim 37 wherein each of said decoupling networks includes an active decoupling circuit and a passive decoupling circuit.

39. A neurovascular array configured for use with a magnetic resonance (MR) system having a plurality of processing channels, the neurovascular array comprising:
(a) a head coil including:
  (I) a first electrically conductive ring;
  (II) a second electrically conductive ring; and
  (III) a plurality of rods electrically interconnecting said first and said second rings to form a birdcage-like structure therewith; wherein said rods and said first and said second rings are configured in order to produce a plurality of electrically-adjacent primary resonant substructures about the birdcage-like structure, with each of said primary resonant substructures constituting a coil element including two of said rods neighboring each other and a corresponding short segment of each of said first and said second rings interconnecting them while electrically sharing one of said rods with each of its neighboring primary resonant substructures, so that said primary resonant substructures are isolated from each other via a preamplifier decoupling scheme and an offset tuning scheme thereby enabling each of said primary resonant substructures
    (i) to receive magnetic resonance signals from tissue within a separate field of view thereof and
    (ii) to be operatively couplable to one processing channel of the MR system in order to convey the magnetic resonance signals received thereby
    (iii) while being simultaneously decoupled from the other of said primary resonant substructures;
(b) an anterior coil having in proximity to said head coil at least one other coil element configured for receiving magnetic resonance signals from tissue within a separate field of view thereof;
(c) a posterior coil having in proximity to said head coil at least one other coil element configured for receiving magnetic resonance signals from tissue within a separate field of view thereof; and
(d) an interface configured for enabling said coil elements of said head coil, said anterior coil and said posterior coil to be selectively interconnected to the processing channels of the MR system so that the neurovascular array is selectively operable in a plurality of modes.

40. The neurovascular array of claim 39 wherein said plurality of modes includes a neurovascular phased array mode in which said interface enables:
(a) each pair of said coil elements of said head coil to be interconnected with a separate one of the processing channels of the MR system; and
(b) each of said other coil elements of said anterior and said posterior coils to be interconnected with a separate one of the processing channels of the MR system.

41. The neurovascular array of claim 40 wherein said head coil has eight of said coil elements and said anterior and said posterior coils each have two of said other coil elements, configured for use with the MR system equipped with at least eight of the processing channels.

42. The neurovascular array of claim 39 wherein said plurality of modes includes a high resolution brain mode in which said interface enables each of said coil elements of said head coil to be interconnected with a separate one of the processing channels of the MR system.

43. The neurovascular array of claim 39 wherein said plurality of modes includes a volume neck mode in which said interface enables each of said other coil elements of said anterior and said posterior coils to be interconnected with a separate one of the processing channels of the MR system.

44. The neurovascular array of claim 39 wherein said plurality of modes includes a spectroscopy mode in which said interface enables all of said coil elements of said head coil to be interconnected with a single one of the processing channels of the MR system.

45. The neurovascular array of claim 39 wherein said interface is capable of enabling said neurovascular array to be selectively operated in said plurality of modes when said coil elements of said head coil, said anterior coil and said posterior coil are greater in number than the processing channels of the MR system.

46. The neurovascular array of claim 39 wherein said preamplifier decoupling scheme involves each of said primary resonant substructures having an input resonant circuit in said short segment of second ring thereof configured for enabling said primary resonant substructure via a low impedance preamplifier to be (i) operatively couplable to one processing channel of the MR system and (ii) decoupled thereat from the other of said primary resonant substructures.

47. The neurovascular array of claim 46 wherein said low impedance preamplifiers are provided as part of the neurovascular array.

48. The neurovascular array of claim 46 wherein each of said low impedance preamplifiers is provided with one of the processing channels of the MR system.

49. The neurovascular array of claim 46 wherein said offset tuning scheme involves in each of said primary resonant substructures at least one of:
  (a) a tuning circuit in at least one of said rods thereof;
  (b) a tuning circuit in said short segment thereof of said first ring; and
  (c) a tuning circuit in said short segment thereof of said second ring;
  configured for enabling each of said primary resonant substructures to be tuned so that signal current induced therein is effectively precluded from interfering with neighboring ones of said primary resonant substructures primarily via said first ring and said rods thereby enabling each of said primary resonant substructures (i) to be decoupled thereat from the other of said primary resonant substructures (ii) while maintaining the ability to resonate at an operating frequency of said head coil and thus receive the magnetic resonance signals.

50. The neurovascular array of claim 39 wherein said plurality of electrically-adjacent primary resonant substructures of said head coil is eight in number, with each being generally deployed 45 degrees apart from its neighbor.

51. The neurovascular array of claim 50 wherein:
  (a) a first group of four of said primary resonant substructures have said rods thereof spaced approximately 60 degrees apart in each of said primary resonant substructures; and
  (b) a second group of four of said primary resonant substructures have said rods thereof spaced approximately 30 degrees apart in each of said primary resonant substructures;
  with said primary resonant substructures of said first and said second groups being deployed in alternating fashion.

52. The neurovascular array of claim 39 wherein each of said rods includes a decoupling network therein for decoupling said head coil from a radio frequency transmit field of the MR system during a transmit cycle thereof.

53. A volume coil configured for use with a parallel-imaging compatible magnetic resonance (MR) system, the volume coil comprising:
  (a) a first electrically conductive ring;
  (b) a second electrically conductive ring;
  (c) a plurality of rods electrically interconnecting said first and said second rings in order to form a birdcage-like structure therewith;
  wherein said rods and said first and said second rings are configured to produce a plurality of electrically-adjacent primary resonant substructures about the birdcage-like structure, with each of said primary resonant substructures including two of said rods neighboring each other and a corresponding short segment of each of said first and said second rings interconnecting them while electrically sharing one of said rods with each of its neighboring primary resonant substructures, so that said primary resonant substructures are isolated from each other via a preamplifier decoupling scheme and an offset tuning scheme thereby enabling each of said primary resonant substructures
    (i) to receive magnetic resonance signals from tissue within a separate field of view thereof and
    (ii) to be operatively couplable to one processing channel of the MR system in order to convey the magnetic resonance signals received thereby
    (iii) while being simultaneously decoupled from the other of said primary resonant substructures.

54. The volume coil of claim 53 wherein said preamplifier decoupling scheme involves each of said primary resonant substructures having an input resonant circuit in said short segment of second ring thereof configured for enabling said primary resonant substructure via a low impedance preamplifier to be (i) operatively couplable to one processing channel of the MR system and (ii) decoupled thereat from the other of said primary resonant substructures.

55. The volume coil of claim 54 wherein said low impedance preamplifiers are provided as part of the volume coil.

56. The volume coil of claim 54 wherein each of said low impedance preamplifiers is provided with one of the processing channels of the MR system.

57. The volume coil of claim 54 wherein said offset tuning scheme involves in each of said primary resonant substructures at least one of:
  (a) a tuning circuit in at least one of said rods thereof;
  (b) a tuning circuit in said short segment thereof of said first ring; and
  (c) a tuning circuit in said short segment thereof of said second ring;
  configured for enabling each of said primary resonant substructures to be tuned so that signal current induced therein is effectively precluded from interfering with neighboring ones of said primary resonant substructures primarily via said first ring and said rods thereby enabling each of said primary resonant substructures (i) to be decoupled thereat from the other of said primary resonant substructures (ii) while maintaining the ability to resonate at an operating frequency of the volume coil and thus receive the magnetic resonance signals.

58. The volume coil of claim 53 wherein said plurality of electrically-adjacent primary resonant substructures is eight in number, with each being generally deployed 45 degrees apart from its neighbor.

59. The volume coil of claim 58 wherein:
(a) a first group of four of said primary resonant substructures have said rods thereof spaced approximately 60 degrees apart in each of said primary resonant substructures; and
(b) a second group of four of said primary resonant substructures have said rods thereof spaced approximately 30 degrees apart in each of said primary resonant substructures;
with said primary resonant substructures of said first and said second groups being deployed in alternating fashion.

60. The volume coil of claim 53 wherein each of said rods includes a decoupling network therein for decoupling the volume coil from a radio frequency transmit field of the MR system during a transmit cycle thereof.

61. An array configured for use with a magnetic resonance (MR) system having a plurality of parallel processing channels, the array comprising:
(a) a volume coil including:
  (I) a first ring at one end of said volume coil, said first ring being electrically conductive;
  (II) a second ring at an other end of said volume coil, said second ring being electrically conductive; and
  (III) a plurality of rods electrically interconnecting said first and said second rings in order to form a birdcage-like structure therewith;
  wherein said rods and said first and said second rings are configured to produce a plurality of electrically-adjacent primary resonant substructures about the birdcage-like structure, with each of said primary resonant substructures constituting a coil element including two of said rods neighboring each other and a corresponding short segment of each of said first and said second rings interconnecting them while electrically sharing one of said rods with each of its neighboring primary resonant substructures, so that said primary resonant substructures are isolated from each other via a preamplifier decoupling scheme and an offset tuning scheme thereby enabling each of said primary resonant substructures
    (i) to receive magnetic resonance signals from tissue within a separate field of view thereof and
    (ii) to be operatively couplable to one processing channel of the MR system in order to convey the magnetic resonance signals received thereby
    (iii) while being simultaneously decoupled from the other of said primary resonant substructures;
(b) a secondary coil having at least one other coil element configured for receiving magnetic resonance signals from tissue within a separate field of view thereof;
(c) a tertiary coil having at least one other coil element configured for receiving magnetic resonance signals from tissue within a separate field of view thereof; and
(d) an interface configured for enabling said coil elements of said volume coil, said secondary coil and said tertiary coil to be selectively interconnected to the processing channels of the MR system so that the array is selectively operable in a plurality of modes.

62. The array of claim 61 wherein:
(a) said volume coil usable in imaging of a head of a patient;
(b) said secondary coil usable in imaging carotid structures on one side of a neck of the patient; and
(c) said tertiary coil usable in imaging carotid structures on an other side of the neck of the patient.

63. The array of claim 61 wherein:
(a) said secondary coil usable in imaging a heart of a patient from an anterior perspective; and
(b) said tertiary coil usable in imaging the heart of the patient from a posterior perspective.

64. The array of claim 61 wherein said preamplifier decoupling scheme involves each of said primary resonant substructures having an input resonant circuit in said short segment of second ring thereof configured for enabling said primary resonant substructure via a low impedance preamplifier to be (i) operatively couplable to one processing channel of the MR system and (ii) decoupled thereat from the other of said primary resonant substructures.

65. The array of claim 64 wherein said low impedance preamplifiers are provided as part of the array.

66. The array of claim 61 wherein said offset tuning scheme involves in each of said primary resonant substructures at least one of:
(a) a tuning circuit in at least one of said rods thereof;
(b) a tuning circuit in said short segment thereof of said first ring; and
(c) a tuning circuit in said short segment thereof of said second ring;
configured for enabling each of said primary resonant substructures to be tuned so that signal current induced therein is effectively precluded from interfering with neighboring ones of said primary resonant substructures primarily via said first ring and said rods thereby enabling each of said primary resonant substructures (i) to be decoupled thereat from the other of said primary resonant substructures (ii) while maintaining the ability to resonate at an operating frequency of said volume coil and thus receive the magnetic resonance signals.

67. The array of claim 61 wherein each of said rods includes a decoupling network therein for decoupling said volume coil from a radio frequency transmit field of the MR system during a transmit cycle thereof.

68. A method of making a volume coil configured for use with a parallel-imaging compatible magnetic resonance (MR) system, the method comprising the steps of:
(a) assembling a first electrically conductive ring and a second electrically conductive ring with a plurality of rods electrically interconnecting said rings in order to form a birdcage-like structure therewith;
(b) configuring said rods and said first and said second rings to produce a plurality of electrically-adjacent primary resonant substructures about the birdcage-like structure, with each of said primary resonant substructures including two of said rods neighboring each other and a corresponding short segment of each of said first and said second rings interconnecting them while electrically sharing one of said rods with each of its neighboring primary resonant substructures; and
(c) isolating said primary resonant substructures from each other via a preamplifier decoupling scheme and an offset tuning scheme so that each of said primary resonant substructures is enabled
  (i) to receive magnetic resonance signals from tissue within a separate field of view thereof and
  (ii) to be operatively couplable to one processing channel of the MR system for conveyance of the magnetic resonance signals received thereby
  (iii) while being simultaneously decoupled from the other of said primary resonant substructures.

69. The method of claim 68 wherein said preamplifier decoupling scheme involves the step of providing each of said primary resonant substructures with an input resonant circuit in said short segment of second ring thereof for enabling said primary resonant substructure via a low impedance preamplifier to be (i) operatively couplable to one processing channel of the MR system and (ii) decoupled thereat from the other of said primary resonant substructures.

70. The method of claim 69 wherein said offset tuning scheme involves in each of said primary resonant substructures at least one of the steps of:
 (a) tuning at least one of said rods thereof;
 (b) tuning said short segment thereof of said first ring; and
 (c) tuning said short segment thereof of said second ring;
 enabling each of said primary resonant substructures to be tuned so that signal current induced therein is effectively precluded from interfering with neighboring ones of said primary resonant substructures primarily via said first ring and said rods thereby enabling each of said primary resonant substructures
  (i) to be decoupled thereat from the other of said primary resonant substructures
  (ii) while maintaining the ability to resonate at an operating frequency of the volume coil and thus receive the magnetic resonance signals.

71. A method of making a volume coil configured for use with a parallel-imaging compatible magnetic resonance (MR) system, the method comprising the steps of:
 (a) assembling a first electrically conductive ring and a second electrically conductive ring with a plurality of rods electrically interconnecting said rings in order to form a birdcage-like structure therewith;
 (b) configuring said rods and said first and said second rings to produce a plurality of electrically-adjacent primary resonant substructures about the birdcage-like structure, with each of said primary resonant substructures including two of said rods neighboring each other and a corresponding short segment of each of said first and said second rings interconnecting them while electrically sharing one of said rods with each of its neighboring primary resonant substructures; and
 (c) providing each of said primary resonant substructures with a source impedance considerably higher than a load impedance to which said primary resonant substructure connects for creating a resonant circuit therewith so as to enable said primary resonant substructure (i) to be operatively couplable to one processing channel of the MR system in order to convey magnetic resonance signals received thereby (ii) while simultaneously being at least partially decoupled from the other of said primary resonant substructures of the volume coil.

* * * * *

UNITED STATES PATENT AND TRADEMARK OFFICE
CERTIFICATE OF CORRECTION

PATENT NO.       : 7,911,209 B2                                           Page 1 of 1
APPLICATION NO.  : 10/597249
DATED            : March 22, 2011
INVENTOR(S)      : Alradady et al.

It is certified that error appears in the above-identified patent and that said Letters Patent is hereby corrected as shown below:

On Title Page 2, in Field (56), under "OTHER PUBLICATIONS", in Column 2, Line 8, delete "11.sup.th" and insert -- $11^{th}$ --, therefor.

IN THE DRAWINGS

In Fig. 7B-C, Sheet 20 of 35, delete "8-to1" and insert -- 8-to-1 --, therefor.

Figure 8C:
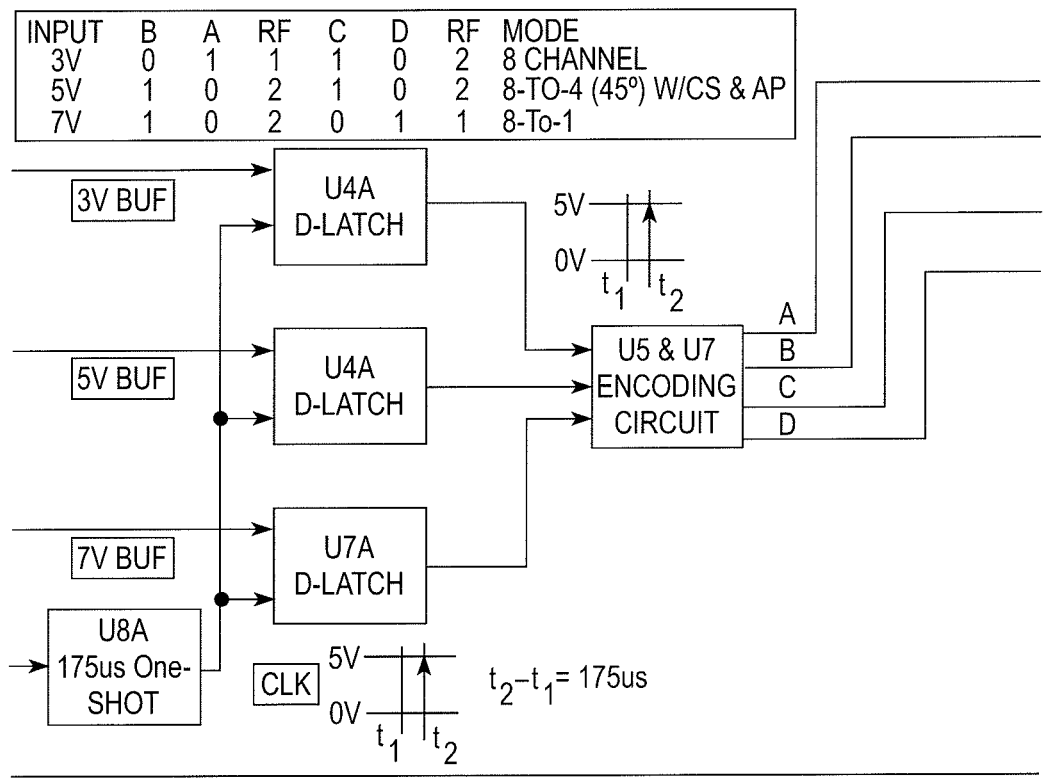
Figure 8C:
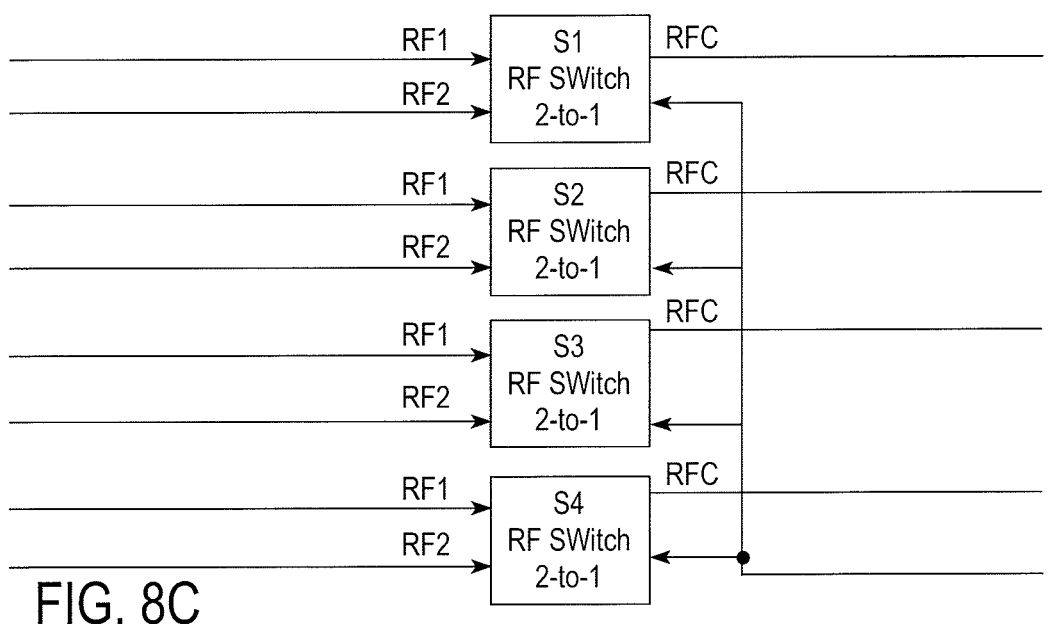

In Fig. 8C, Sheet 23 of 35, in Box "S1", Line 2, delete "SWitch" and insert -- Switch --, therefor.

In Fig. 8C, Sheet 23 of 35, in Box "S2", Line 2, delete "SWitch" and insert -- Switch --, therefor.

In Fig. 8C, Sheet 23 of 35, in Box "S3", Line 2, delete "SWitch" and insert -- Switch --, therefor.

In Fig. 8C, Sheet 23 of 35, in Box "S4", Line 2, delete "SWitch" and insert -- Switch --, therefor.

Figure 8D:
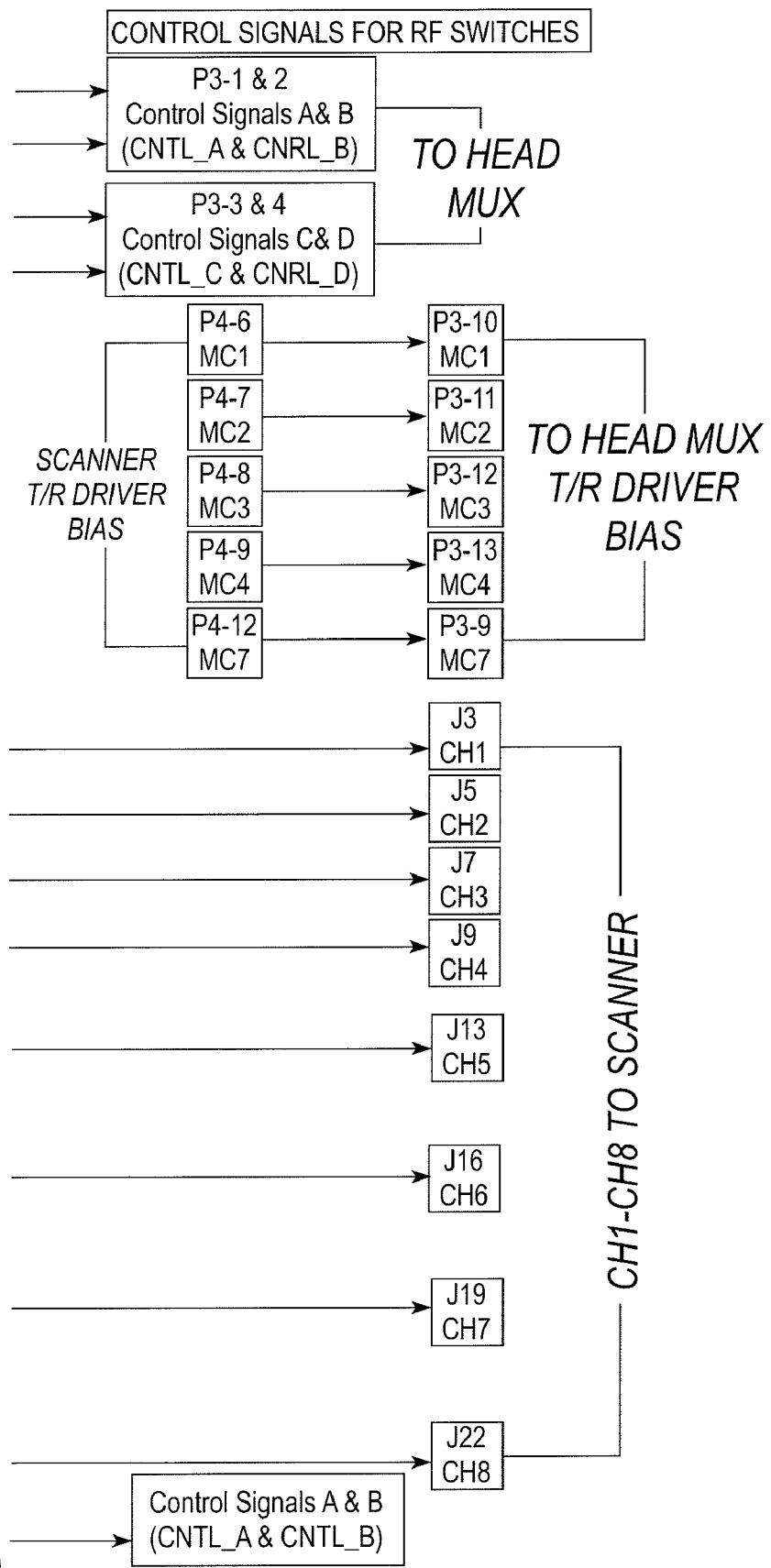

In Fig. 8D, Sheet 24 of 35, delete "A& B" and insert -- A & B --, therefor.

In Fig. 8D, Sheet 24 of 35, delete "C& D" and insert -- C & D --, therefor.

Signed and Sealed this
Tenth Day of January, 2012

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,911,209 B2 |
| APPLICATION NO. | : 10/597249 |
| DATED | : March 22, 2011 |
| INVENTOR(S) | : Alradady et al. |

It is certified that error appears in the above-identified patent and that said Letters Patent is hereby corrected as shown below:

On Title Page 2, in Field (56), under "OTHER PUBLICATIONS", in Column 2, Line 8, delete "11.sup.th" and insert -- $11^{th}$ --, therefor.

IN THE DRAWINGS

In Fig. 7B-C, Sheet 20 of 35, delete "8-to1" and insert -- 8-to-1 --, therefor.

In Fig. 8C, Sheet 23 of 35, in Box "S1", Line 2, delete "SWitch" and insert -- Switch --, therefor.

In Fig. 8C, Sheet 23 of 35, in Box "S2", Line 2, delete "SWitch" and insert -- Switch --, therefor.

In Fig. 8C, Sheet 23 of 35, in Box "S3", Line 2, delete "SWitch" and insert -- Switch --, therefor.

In Fig. 8C, Sheet 23 of 35, in Box "S4", Line 2, delete "SWitch" and insert -- Switch --, therefor.

In Fig. 8D, Sheet 24 of 35, delete "A& B" and insert -- A & B --, therefor.

In Fig. 8D, Sheet 24 of 35, delete "C& D" and insert -- C & D --, therefor.

IN THE SPECIFICATION

In Column 3, Line 58, delete "of a" and insert -- of --, therefor.

In Column 5, Line 9, delete "RP" and insert -- RF --, therefor.

In Column 6, Line 43, delete "Boskamup" and insert -- Boskamp --, therefor.

This certificate supersedes the Certificate of Correction issued January 10, 2012.

Signed and Sealed this
Twenty-eighth Day of August, 2012

David J. Kappos
*Director of the United States Patent and Trademark Office*

CERTIFICATE OF CORRECTION (continued)
U.S. Pat. No. 7,911,209 B2

IN THE SPECIFICATIONS

In Column 6, Line 44, delete "Chimelewski" and insert -- Chmielewski --, therefor.

In Column 11, Line 63, delete "VII" and insert -- VIII --, therefor.

In Column 12, Line 50, delete "2-9)" and insert -- 2-8) --, therefor.

In Column 12, Line 67, delete "$J3_{M1}$" and insert -- $J1_{M1}$ --, therefor.

In Column 14, Line 30, delete "VII" and insert -- VIII --, therefor.

In Column 16, Line 5, delete "FIG. 43," and insert -- FIG. 4B, --, therefor.

In Column 17, Line 14, delete "there," and insert -- there --, therefor.

In Column 17, Line 18, delete "2101," and insert -- 2101 --, therefor.

In Column 18, Line 11, delete "Port I-VII" and insert -- Port I-VIII --, therefor.

In Column 20, Line 40, delete "coin" and insert -- coil --, therefor.

In Column 22, Line 25, delete "3200)" and insert -- 3200 --, therefor.

IN THE CLAIMS

In Column 26, Line 31, in Claim 21, delete "tings" and insert -- rings --, therefor.

In Column 27, Line 29, in Claim 28, delete "circuit" and insert -- circuit configured --, therefor.